(12) United States Patent
Abe et al.

(10) Patent No.: US 9,941,015 B2
(45) Date of Patent: *Apr. 10, 2018

(54) SEMICONDUCTOR MEMORY DEVICE

(71) Applicant: TOSHIBA MEMORY CORPORATION, Minato-ku (JP)

(72) Inventors: Kenichi Abe, Kawasaki (JP);
Masanobu Shirakawa, Chigasaki (JP);
Mizuho Yoshida, Yokohama (JP);
Takuya Futatsuyama, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/459,170

(22) Filed: Mar. 15, 2017

(65) Prior Publication Data

US 2017/0186493 A1    Jun. 29, 2017

Related U.S. Application Data

(63) Continuation of application No. 15/185,671, filed on Jun. 17, 2016, now Pat. No. 9,633,745, which is a
(Continued)

(51) Int. Cl.
*G11C 16/04* (2006.01)
*G11C 16/34* (2006.01)
(Continued)

(52) U.S. Cl.
CPC ...... *G11C 16/3459* (2013.01); *G11C 11/5628* (2013.01); *G11C 16/0483* (2013.01); *G11C 16/08* (2013.01)

(58) Field of Classification Search
CPC ......... G11C 16/08; G11C 16/10; G11C 16/16;
G11C 16/32; G11C 16/3459; G11C
16/0483; G11C 11/5628
See application file for complete search history.

(56) References Cited

U.S. PATENT DOCUMENTS 5,361,227 A    1/1994  Tanaka et al.
5,867,429 A    2/1999  Chen et al.
(Continued)

FOREIGN PATENT DOCUMENTS

JP    2007-287207    11/2007
JP    2007-533055    11/2007
(Continued)

OTHER PUBLICATIONS

International Search Report dated Mar. 18, 2014 in PCT/JP2013/083870, filed on Dec. 18, 2013 ( with English translation).
(Continued)

*Primary Examiner* — Pho M Luu
(74) *Attorney, Agent, or Firm* — Oblon, McClelland, Maier & Neustadt, L.L.P.

(57) ABSTRACT

A semiconductor memory device includes first to third pages, first to the third word lines, and a row decoder. In data writing, data is written into the first page before data is written into the second page. The row decoder is configured to apply first to third verify voltages to gates of first to third memory cells in a program verify operation.

18 Claims, 64 Drawing Sheets

Related U.S. Application Data continuation of application No. PCT/JP2013/083870, filed on Dec. 18, 2013.

(51) Int. Cl.
*G11C 11/56* (2006.01)
*G11C 16/08* (2006.01)

(56) References Cited

U.S. PATENT DOCUMENTS

| | | |
|---|---|---|
| 7,170,780 B2 | 1/2007 | Kawai |
| 8,218,365 B2 | 7/2012 | Kim et al. |
| 8,493,813 B2 | 7/2013 | Lee |
| 9,418,753 B2 * | 8/2016 | Nam .................. G11C 11/5628 |
| 9,437,286 B2 * | 9/2016 | Kang .................... G11C 16/10 |
| 9,595,346 B2 * | 3/2017 | Lee ......................... H01L 29/04 |
| 9,633,745 B2 * | 4/2017 | Abe .................... G11C 11/5628 |
| 2005/0219896 A1 | 10/2005 | Chen et al. |
| 2007/0242524 A1 | 10/2007 | Hemink |
| 2007/0242527 A1 | 10/2007 | Shibata |
| 2009/0267128 A1 | 10/2009 | Maejima |
| 2009/0268522 A1 | 10/2009 | Maejima |
| 2010/0207195 A1 | 8/2010 | Fukuzumi et al. |
| 2011/0284946 A1 | 11/2011 | Kiyotoshi |
| 2012/0081964 A1 | 4/2012 | Li |
| 2013/0094294 A1 | 4/2013 | Kwak et al. |
| 2014/0062074 A1 | 3/2014 | Higgins |
| 2014/0233294 A1 | 8/2014 | Ting et al. |
| 2014/0281189 A1 | 9/2014 | Noguchi et al. |
| 2015/0243362 A1 | 8/2015 | Nigam et al. |
| 2016/0300621 A1 | 10/2016 | Abe et al. |

FOREIGN PATENT DOCUMENTS

| | | |
|---|---|---|
| JP | 2009-064498 A | 3/2009 |
| JP | 2009-533794 | 9/2009 |
| JP | 2014-179150 A | 9/2014 |
| TW | 201336022 A1 | 9/2013 |
| WO | WO 2012/044635 A2 | 4/2012 |

OTHER PUBLICATIONS

Written Opinion dated Mar. 18, 2014 in PCT/JP2013/083870, filed on Dec. 18, 2013.
Office Action dated Aug. 13, 2015 in Taiwanese Application 103103010 (with English Translation).
Office Action dated Sep. 13, 2016 in Japanese Patent Application No. 2015-553271 with English translation.

\* cited by examiner

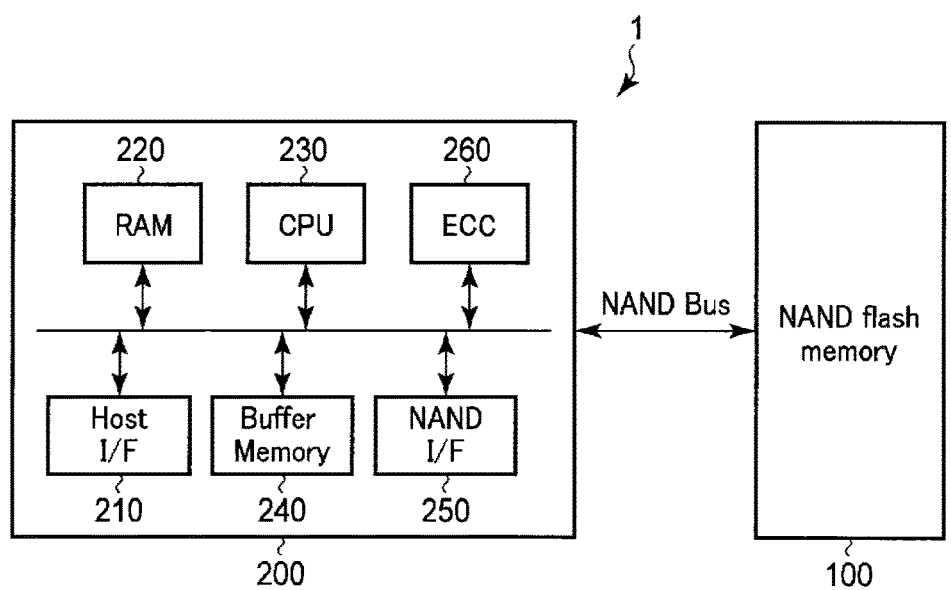
F I G. 1

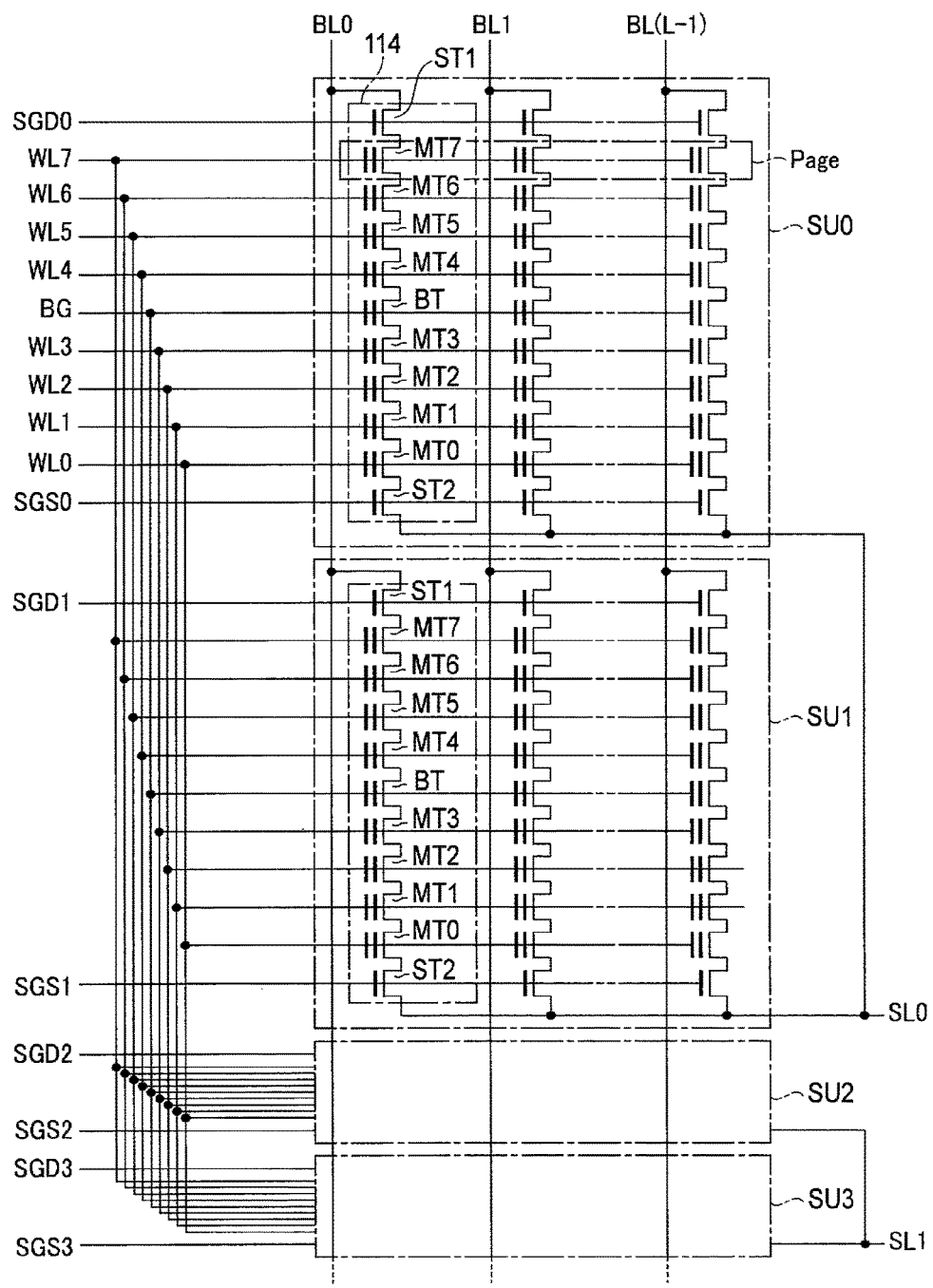
F I G. 3

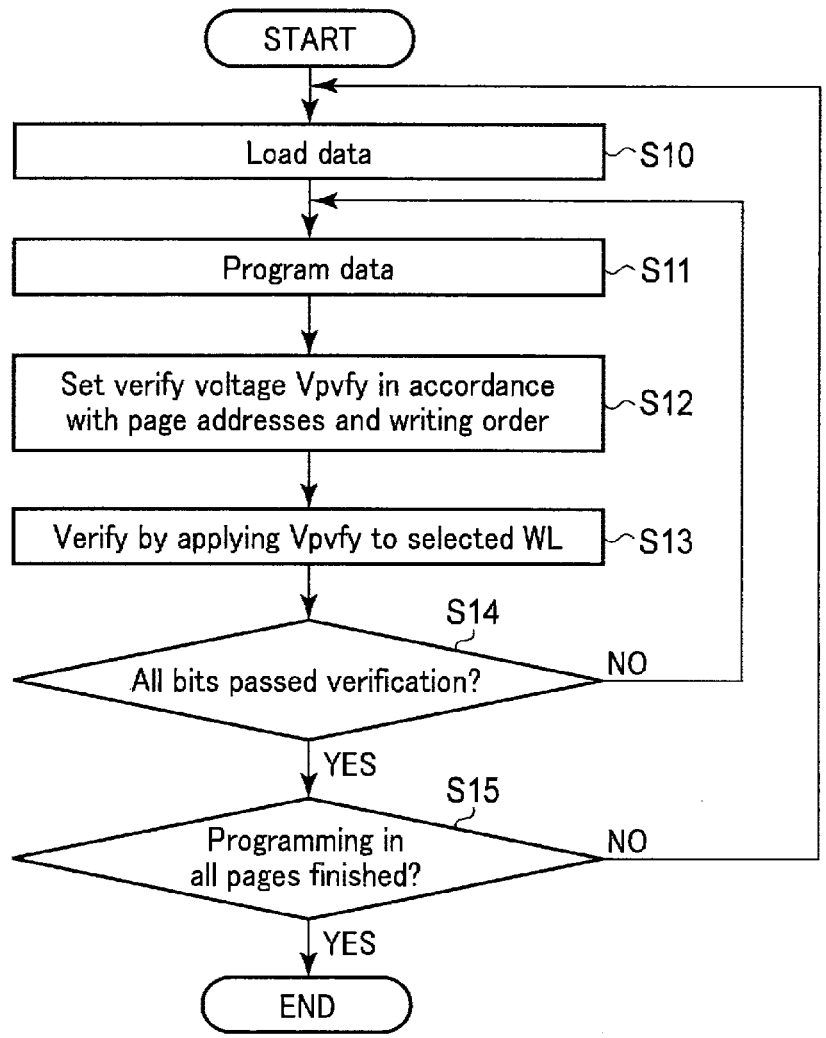
F I G. 6

| | | SU0 | SU1 | SU2 | SU3 |
|---|---|---|---|---|---|
| WL0 | Writing order / PD type | 1 | 2 | 3 | 4 |
| | USEL VPGM | 0 | $\alpha*1*\Delta V1$ | $\alpha*2*\Delta V1$ | $\alpha*3*\Delta V1$ |
| | SEL/USEL VPASS | 0 | 0 | 0 | 0 |
| WL1 | Writing order / PD type | 5 | 6 | 7 | 8 |
| | USEL VPGM | 0 | $\alpha*1*\Delta V1$ | $\alpha*2*\Delta V1$ | $\alpha*3*\Delta V1$ |
| | SEL/USEL VPASS | $\beta*4*\Delta V2$ | $\beta*5*\Delta V2$ | $\beta*6*\Delta V2$ | $\beta*7*\Delta V2$ |
| WL2 | Writing order / PD type | 9 | 10 | 11 | 12 |
| | USEL VPGM | 0 | $\alpha*1*\Delta V1$ | $\alpha*2*\Delta V1$ | $\alpha*3*\Delta V1$ |
| | SEL/USEL VPASS | $\beta*8*\Delta V2$ | $\beta*9*\Delta V2$ | $\beta*10*\Delta V2$ | $\beta*11*\Delta V2$ |
| WL3 | Writing order / PD type | 13 | 14 | 15 | 16 |
| | USEL VPGM | 0 | $\alpha*1*\Delta V1$ | $\alpha*2*\Delta V1$ | $\alpha*3*\Delta V1$ |
| | SEL/USEL VPASS | $\beta*12*\Delta V2$ | $\beta*13*\Delta V2$ | $\beta*14*\Delta V2$ | $\beta*15*\Delta V2$ |
| WL4 | Writing order / PD type | 17 | 18 | 19 | 20 |
| | USEL VPGM | 0 | $\alpha*1*\Delta V1$ | $\alpha*2*\Delta V1$ | $\alpha*3*\Delta V1$ |
| | SEL/USEL VPASS | $\beta*16*\Delta V2$ | $\beta*17*\Delta V2$ | $\beta*18*\Delta V2$ | $\beta*19*\Delta V2$ |
| WL5 | Writing order / PD type | 21 | 22 | 23 | 24 |
| | USEL VPGM | 0 | $\alpha*1*\Delta V1$ | $\alpha*2*\Delta V1$ | $\alpha*3*\Delta V1$ |
| | SEL/USEL VPASS | $\beta*20*\Delta V2$ | $\beta*21*\Delta V2$ | $\beta*22*\Delta V2$ | $\beta*23*\Delta V2$ |
| WL6 | Writing order / PD type | 25 | 26 | 27 | 28 |
| | USEL VPGM | 0 | $\alpha*1*\Delta V1$ | $\alpha*2*\Delta V1$ | $\alpha*3*\Delta V1$ |
| | SEL/USEL VPASS | $\beta*24*\Delta V2$ | $\beta*25*\Delta V2$ | $\beta*26*\Delta V2$ | $\beta*27*\Delta V2$ |
| WL7 | Writing order / PD type | 29 | 30 | 31 | 32 |
| | USEL VPGM | 0 | $\alpha*1*\Delta V1$ | $\alpha*2*\Delta V1$ | $\alpha*3*\Delta V1$ |
| | SEL/USEL VPASS | $\beta*28*\Delta V2$ | $\beta*29*\Delta V2$ | $\beta*30*\Delta V2$ | $\beta*31*\Delta V2$ |

FIG. 9

|  |  | SU0 | SU1 | SU2 | SU3 |
|---|---|---|---|---|---|
| WL0 | PD type / Writing order | 1 | 9 | 17 | 25 |
|  | USEL VPGM | 0 | $\alpha*1*\Delta V1$ | $\alpha*2*\Delta V1$ | $\alpha*3*\Delta V1$ |
|  | SEL/USEL VPASS | 0 | $\beta*8*\Delta V2$ | $\beta*16*\Delta V2$ | $\beta*24*\Delta V2$ |
| WL1 | PD type / Writing order | 2 | 10 | 18 | 26 |
|  | USEL VPGM | 0 | $\alpha*1*\Delta V1$ | $\alpha*2*\Delta V1$ | $\alpha*3*\Delta V1$ |
|  | SEL/USEL VPASS | $\beta*1*\Delta V2$ | $\beta*9*\Delta V2$ | $\beta*17*\Delta V2$ | $\beta*25*\Delta V2$ |
| WL2 | PD type / Writing order | 3 | 11 | 19 | 27 |
|  | USEL VPGM | 0 | $\alpha*1*\Delta V1$ | $\alpha*2*\Delta V1$ | $\alpha*3*\Delta V1$ |
|  | SEL/USEL VPASS | $\beta*2*\Delta V2$ | $\beta*10*\Delta V2$ | $\beta*18*\Delta V2$ | $\beta*26*\Delta V2$ |
| WL3 | PD type / Writing order | 4 | 12 | 20 | 28 |
|  | USEL VPGM | 0 | $\alpha*1*\Delta V1$ | $\alpha*2*\Delta V1$ | $\alpha*3*\Delta V1$ |
|  | SEL/USEL VPASS | $\beta*3*\Delta V2$ | $\beta*11*\Delta V2$ | $\beta*19*\Delta V2$ | $\beta*27*\Delta V2$ |
| WL4 | PD type / Writing order | 5 | 13 | 21 | 29 |
|  | USEL VPGM | 0 | $\alpha*1*\Delta V1$ | $\alpha*2*\Delta V1$ | $\alpha*3*\Delta V1$ |
|  | SEL/USEL VPASS | $\beta*4*\Delta V2$ | $\beta*12*\Delta V2$ | $\beta*20*\Delta V2$ | $\beta*28*\Delta V2$ |
| WL5 | PD type / Writing order | 6 | 14 | 22 | 30 |
|  | USEL VPGM | 0 | $\alpha*1*\Delta V1$ | $\alpha*2*\Delta V1$ | $\alpha*3*\Delta V1$ |
|  | SEL/USEL VPASS | $\beta*5*\Delta V2$ | $\beta*13*\Delta V2$ | $\beta*21*\Delta V2$ | $\beta*29*\Delta V2$ |
| WL6 | PD type / Writing order | 7 | 15 | 23 | 31 |
|  | USEL VPGM | 0 | $\alpha*1*\Delta V1$ | $\alpha*2*\Delta V1$ | $\alpha*3*\Delta V1$ |
|  | SEL/USEL VPASS | $\beta*6*\Delta V2$ | $\beta*14*\Delta V2$ | $\beta*22*\Delta V2$ | $\beta*30*\Delta V2$ |
| WL7 | PD type / Writing order | 8 | 16 | 24 | 32 |
|  | USEL VPGM | 0 | $\alpha*1*\Delta V1$ | $\alpha*2*\Delta V1$ | $\alpha*3*\Delta V1$ |
|  | SEL/USEL VPASS | $\beta*7*\Delta V2$ | $\beta*15*\Delta V2$ | $\beta*23*\Delta V2$ | $\beta*31*\Delta V2$ |

FIG. 14

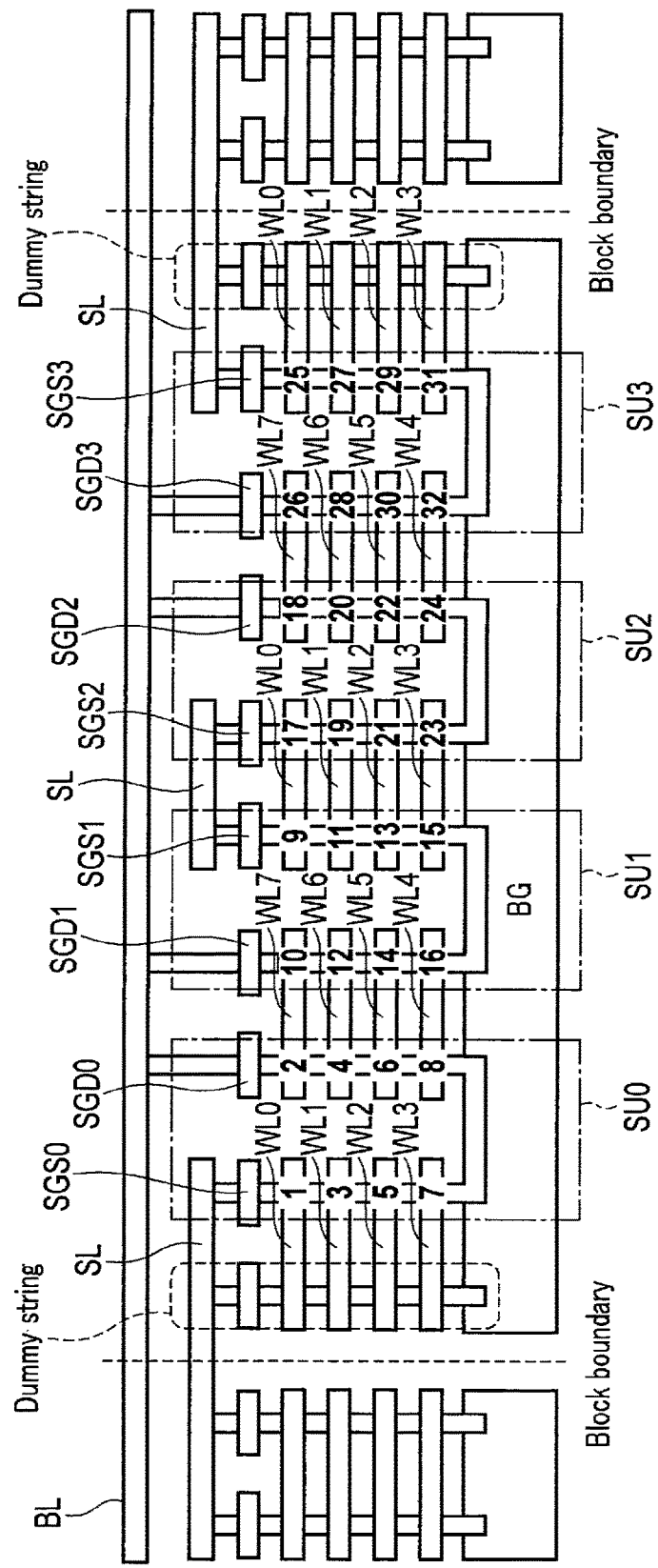
F I G. 16

| | | SU0 | SU1 | SU2 | SU3 |
|---|---|---|---|---|---|
| WL0 | PD type \ Writing order | 1 | 9 | 17 | 25 |
| | USEL VPGM | 0 | $\alpha*1*\Delta V1$ | $\alpha*2*\Delta V1$ | $\alpha*3*\Delta V1$ |
| | SEL/USEL VPASS | 0 | $\beta*8*\Delta V2$ | $\beta*16*\Delta V2$ | $\beta*24*\Delta V2$ |
| WL7 | PD type \ Writing order | 2 | 10 | 18 | 26 |
| | USEL VPGM | 0 | $\alpha*1*\Delta V1$ | $\alpha*2*\Delta V1$ | $\alpha*3*\Delta V1$ |
| | SEL/USEL VPASS | $\beta*1*\Delta V2$ | $\beta*9*\Delta V2$ | $\beta*17*\Delta V2$ | $\beta*25*\Delta V2$ |
| WL1 | PD type \ Writing order | 3 | 11 | 19 | 27 |
| | USEL VPGM | 0 | $\alpha*1*\Delta V1$ | $\alpha*2*\Delta V1$ | $\alpha*3*\Delta V1$ |
| | SEL/USEL VPASS | $\beta*2*\Delta V2$ | $\beta*10*\Delta V2$ | $\beta*18*\Delta V2$ | $\beta*26*\Delta V2$ |
| WL6 | PD type \ Writing order | 4 | 12 | 20 | 28 |
| | USEL VPGM | 0 | $\alpha*1*\Delta V1$ | $\alpha*2*\Delta V1$ | $\alpha*3*\Delta V1$ |
| | SEL/USEL VPASS | $\beta*3*\Delta V2$ | $\beta*11*\Delta V2$ | $\beta*19*\Delta V2$ | $\beta*27*\Delta V2$ |
| WL2 | PD type \ Writing order | 5 | 13 | 21 | 29 |
| | USEL VPGM | 0 | $\alpha*1*\Delta V1$ | $\alpha*2*\Delta V1$ | $\alpha*3*\Delta V1$ |
| | SEL/USEL VPASS | $\beta*4*\Delta V2$ | $\beta*12*\Delta V2$ | $\beta*20*\Delta V2$ | $\beta*28*\Delta V2$ |
| WL5 | PD type \ Writing order | 6 | 14 | 22 | 30 |
| | USEL VPGM | 0 | $\alpha*1*\Delta V1$ | $\alpha*2*\Delta V1$ | $\alpha*3*\Delta V1$ |
| | SEL/USEL VPASS | $\beta*5*\Delta V2$ | $\beta*13*\Delta V2$ | $\beta*21*\Delta V2$ | $\beta*29*\Delta V2$ |
| WL3 | PD type \ Writing order | 7 | 15 | 23 | 31 |
| | USEL VPGM | 0 | $\alpha*1*\Delta V1$ | $\alpha*2*\Delta V1$ | $\alpha*3*\Delta V1$ |
| | SEL/USEL VPASS | $\beta*6*\Delta V2$ | $\beta*14*\Delta V2$ | $\beta*22*\Delta V2$ | $\beta*30*\Delta V2$ |
| WL4 | PD type \ Writing order | 8 | 16 | 24 | 32 |
| | USEL VPGM | 0 | $\alpha*1*\Delta V1$ | $\alpha*2*\Delta V1$ | $\alpha*3*\Delta V1$ |
| | SEL/USEL VPASS | $\beta*7*\Delta V2$ | $\beta*15*\Delta V2$ | $\beta*23*\Delta V2$ | $\beta*31*\Delta V2$ |

F I G. 17

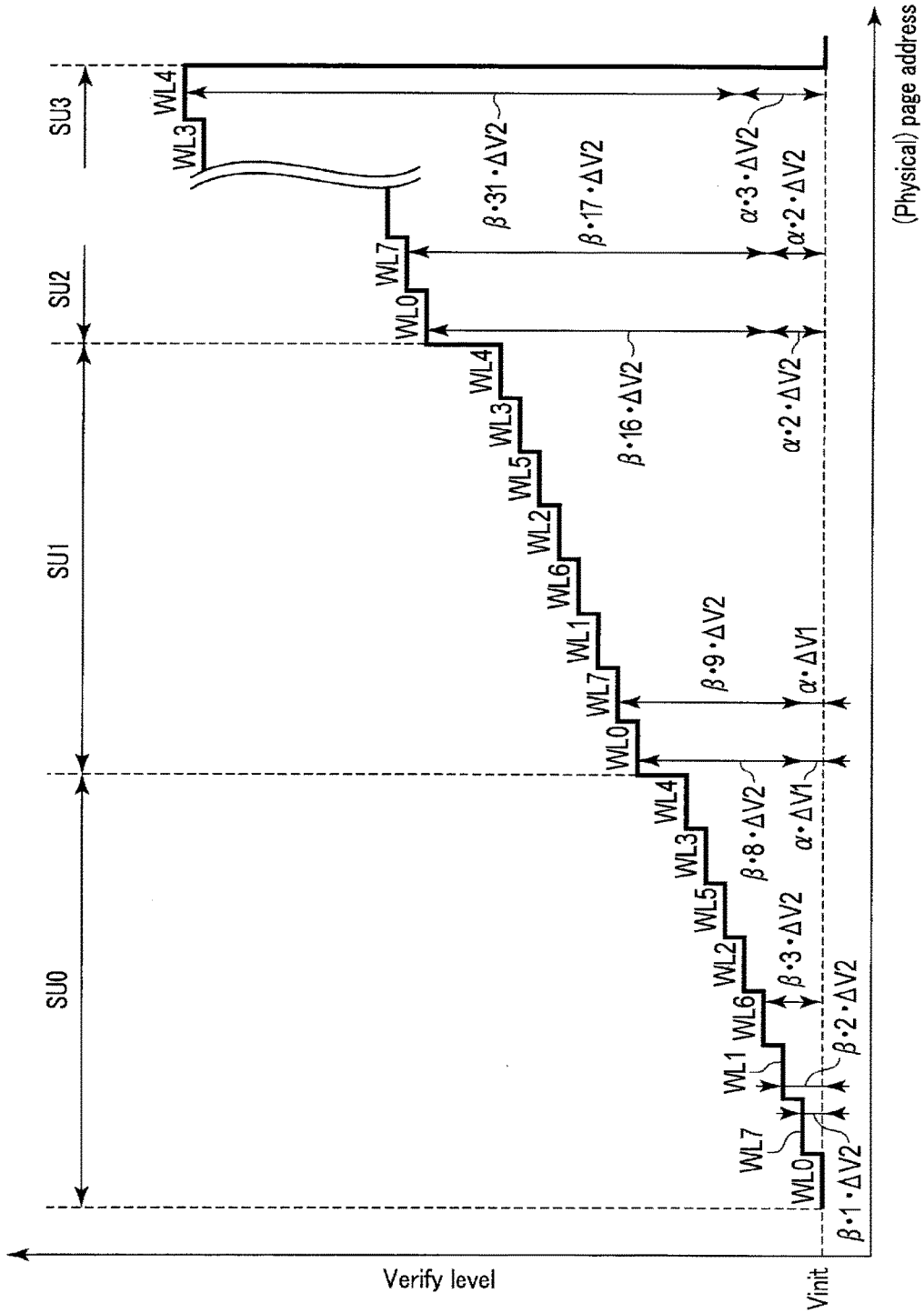
F I G. 18

|  |  | SU0 | SU1 | SU2 | SU3 |
|---|---|---|---|---|---|
| WL0 | PD type / Writing order | 1 | 2 | 3 | 4 |
|  | USEL VPGM | 0 | $\alpha*1*\Delta V1$ | $\alpha*2*\Delta V1$ | $\alpha*3*\Delta V1$ |
|  | SEL/USEL VPASS | 0 | 0 | 0 | 0 |
| WL7 | PD type / Writing order | 5 | 6 | 7 | 8 |
|  | USEL VPGM | 0 | $\alpha*1*\Delta V1$ | $\alpha*2*\Delta V1$ | $\alpha*3*\Delta V1$ |
|  | SEL/USEL VPASS | $\beta*4*\Delta V2$ | $\beta*5*\Delta V2$ | $\beta*6*\Delta V2$ | $\beta*7*\Delta V2$ |
| WL1 | PD type / Writing order | 9 | 10 | 11 | 12 |
|  | USEL VPGM | 0 | $\alpha*1*\Delta V1$ | $\alpha*2*\Delta V1$ | $\alpha*3*\Delta V1$ |
|  | SEL/USEL VPASS | $\beta*8*\Delta V2$ | $\beta*9*\Delta V2$ | $\beta*10*\Delta V2$ | $\beta*11*\Delta V2$ |
| WL6 | PD type / Writing order | 13 | 14 | 15 | 16 |
|  | USEL VPGM | 0 | $\alpha*1*\Delta V1$ | $\alpha*2*\Delta V1$ | $\alpha*3*\Delta V1$ |
|  | SEL/USEL VPASS | $\beta*12*\Delta V2$ | $\beta*13*\Delta V2$ | $\beta*14*\Delta V2$ | $\beta*15*\Delta V2$ |
| WL2 | PD type / Writing order | 17 | 18 | 19 | 20 |
|  | USEL VPGM | 0 | $\alpha*1*\Delta V1$ | $\alpha*2*\Delta V1$ | $\alpha*3*\Delta V1$ |
|  | SEL/USEL VPASS | $\beta*16*\Delta V2$ | $\beta*17*\Delta V2$ | $\beta*18*\Delta V2$ | $\beta*19*\Delta V2$ |
| WL5 | PD type / Writing order | 21 | 22 | 23 | 24 |
|  | USEL VPGM | 0 | $\alpha*1*\Delta V1$ | $\alpha*2*\Delta V1$ | $\alpha*3*\Delta V1$ |
|  | SEL/USEL VPASS | $\beta*20*\Delta V2$ | $\beta*21*\Delta V2$ | $\beta*22*\Delta V2$ | $\beta*23*\Delta V2$ |
| WL3 | PD type / Writing order | 25 | 26 | 27 | 28 |
|  | USEL VPGM | 0 | $\alpha*1*\Delta V1$ | $\alpha*2*\Delta V1$ | $\alpha*3*\Delta V1$ |
|  | SEL/USEL VPASS | $\beta*24*\Delta V2$ | $\beta*25*\Delta V2$ | $\beta*26*\Delta V2$ | $\beta*27*\Delta V2$ |
| WL4 | PD type / Writing order | 29 | 30 | 31 | 32 |
|  | USEL VPGM | 0 | $\alpha*1*\Delta V1$ | $\alpha*2*\Delta V1$ | $\alpha*3*\Delta V1$ |
|  | SEL/USEL VPASS | $\beta*28*\Delta V2$ | $\beta*29*\Delta V2$ | $\beta*30*\Delta V2$ | $\beta*31*\Delta V2$ |

F I G. 20

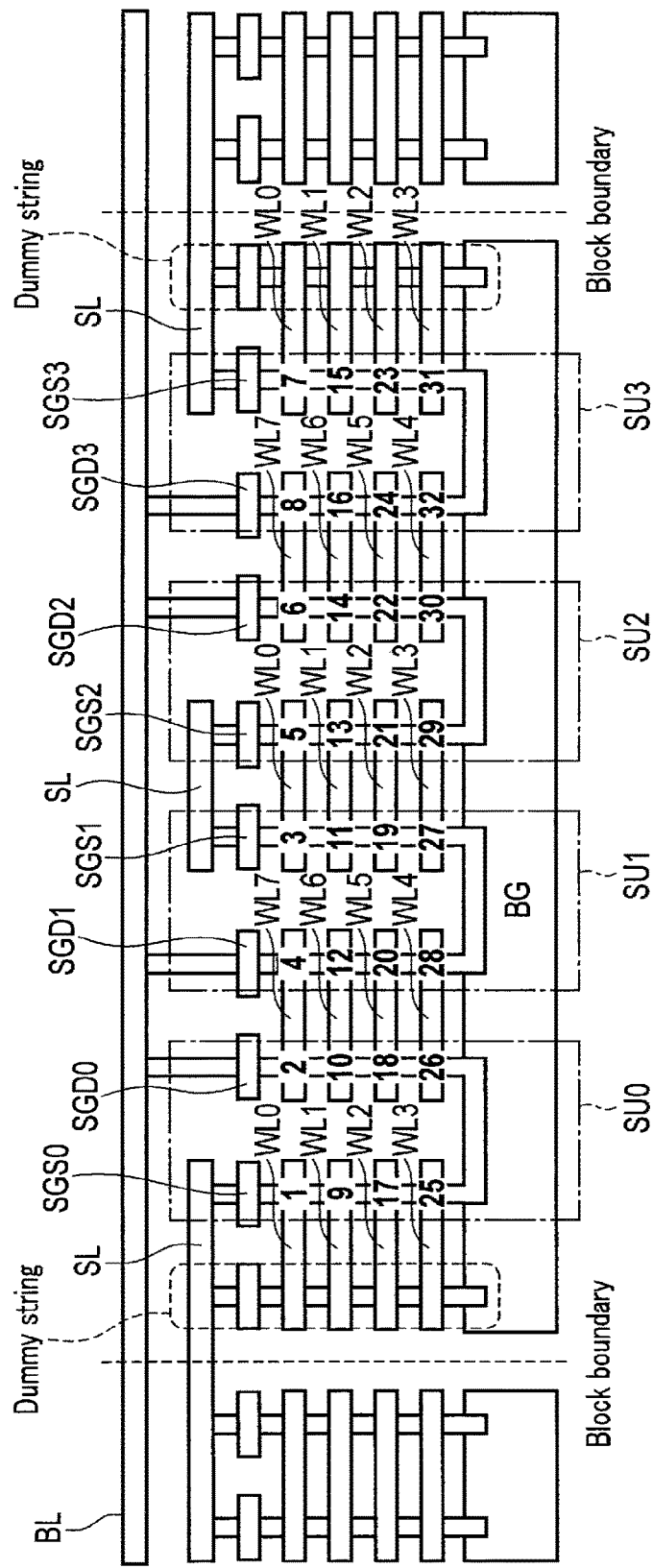
F I G. 22

| | | SU0 | SU1 | SU2 | SU3 |
|---|---|---|---|---|---|
| WL0 | PD type / Writing order | 1 | 3 | 5 | 7 |
| | USEL VPGM | 0 | $\alpha*1*\Delta V1$ | $\alpha*2*\Delta V1$ | $\alpha*3*\Delta V1$ |
| | SEL/USEL VPASS | 0 | $\beta*2*\Delta V2$ | $\beta*4*\Delta V2$ | $\beta*6*\Delta V2$ |
| WL7 | PD type / Writing order | 2 | 4 | 6 | 8 |
| | USEL VPGM | 0 | $\alpha*1*\Delta V1$ | $\alpha*2*\Delta V1$ | $\alpha*3*\Delta V1$ |
| | SEL/USEL VPASS | $\beta*1*\Delta V2$ | $\beta*3*\Delta V2$ | $\beta*5*\Delta V2$ | $\beta*7*\Delta V2$ |
| WL1 | PD type / Writing order | 9 | 11 | 13 | 15 |
| | USEL VPGM | 0 | $\alpha*1*\Delta V1$ | $\alpha*2*\Delta V1$ | $\alpha*3*\Delta V1$ |
| | SEL/USEL VPASS | $\beta*8*\Delta V2$ | $\beta*10*\Delta V2$ | $\beta*12*\Delta V2$ | $\beta*14*\Delta V2$ |
| WL6 | PD type / Writing order | 10 | 12 | 14 | 16 |
| | USEL VPGM | 0 | $\alpha*1*\Delta V1$ | $\alpha*2*\Delta V1$ | $\alpha*3*\Delta V1$ |
| | SEL/USEL VPASS | $\beta*9*\Delta V2$ | $\beta*11*\Delta V2$ | $\beta*13*\Delta V2$ | $\beta*15*\Delta V2$ |
| WL2 | PD type / Writing order | 17 | 19 | 21 | 23 |
| | USEL VPGM | 0 | $\alpha*1*\Delta V1$ | $\alpha*2*\Delta V1$ | $\alpha*3*\Delta V1$ |
| | SEL/USEL VPASS | $\beta*16*\Delta V2$ | $\beta*18*\Delta V2$ | $\beta*20*\Delta V2$ | $\beta*22*\Delta V2$ |
| WL5 | PD type / Writing order | 18 | 20 | 22 | 24 |
| | USEL VPGM | 0 | $\alpha*1*\Delta V1$ | $\alpha*2*\Delta V1$ | $\alpha*3*\Delta V1$ |
| | SEL/USEL VPASS | $\beta*17*\Delta V2$ | $\beta*19*\Delta V2$ | $\beta*21*\Delta V2$ | $\beta*23*\Delta V2$ |
| WL3 | PD type / Writing order | 25 | 27 | 29 | 31 |
| | USEL VPGM | 0 | $\alpha*1*\Delta V1$ | $\alpha*2*\Delta V1$ | $\alpha*3*\Delta V1$ |
| | SEL/USEL VPASS | $\beta*24*\Delta V2$ | $\beta*26*\Delta V2$ | $\beta*28*\Delta V2$ | $\beta*30*\Delta V2$ |
| WL4 | PD type / Writing order | 26 | 28 | 30 | 32 |
| | USEL VPGM | 0 | $\alpha*1*\Delta V1$ | $\alpha*2*\Delta V1$ | $\alpha*3*\Delta V1$ |
| | SEL/USEL VPASS | $\beta*25*\Delta V2$ | $\beta*27*\Delta V2$ | $\beta*29*\Delta V2$ | $\beta*31*\Delta V2$ |

F I G. 23

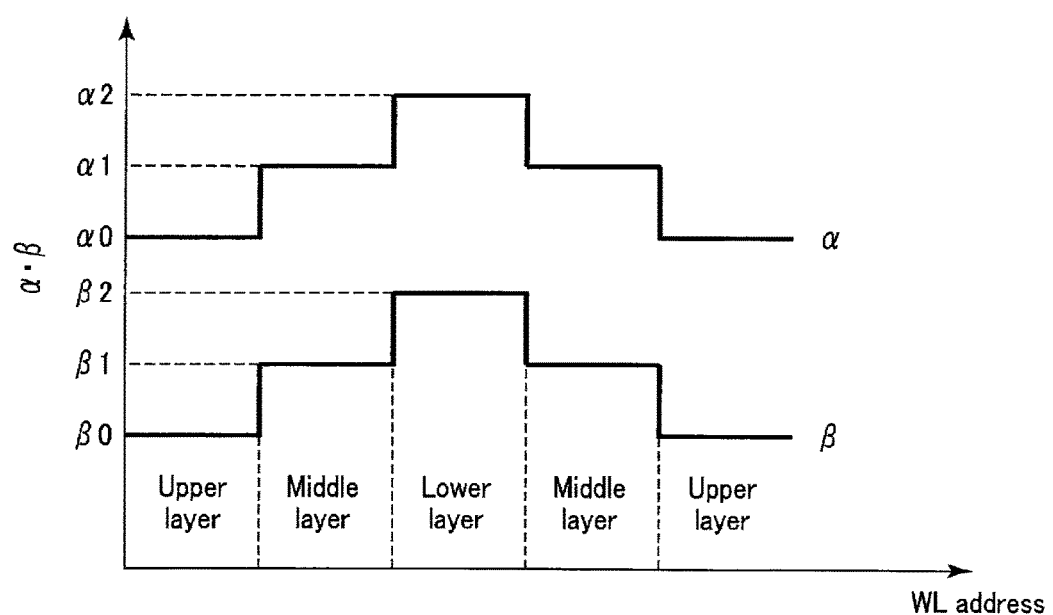
F I G. 25

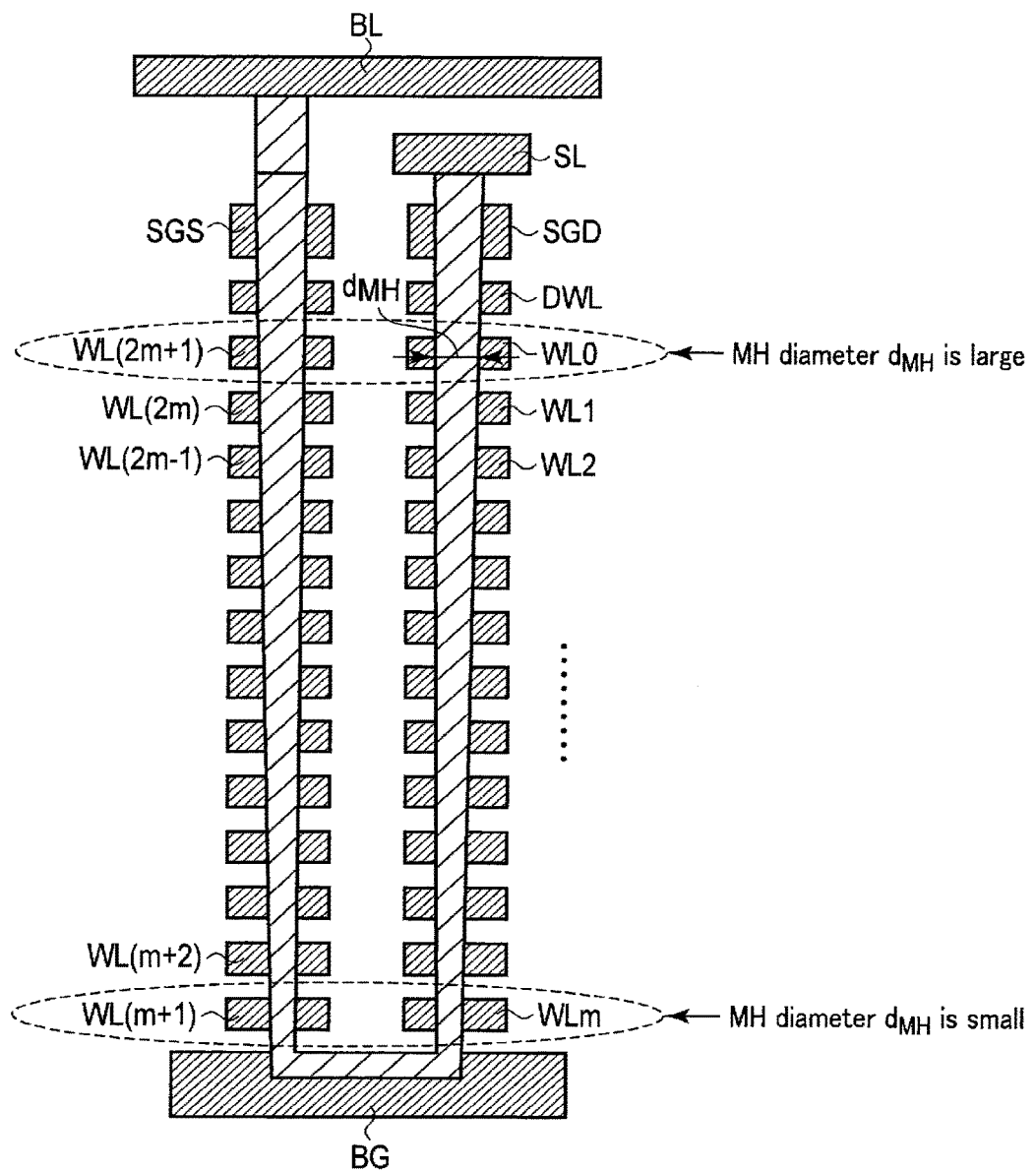
F I G. 26

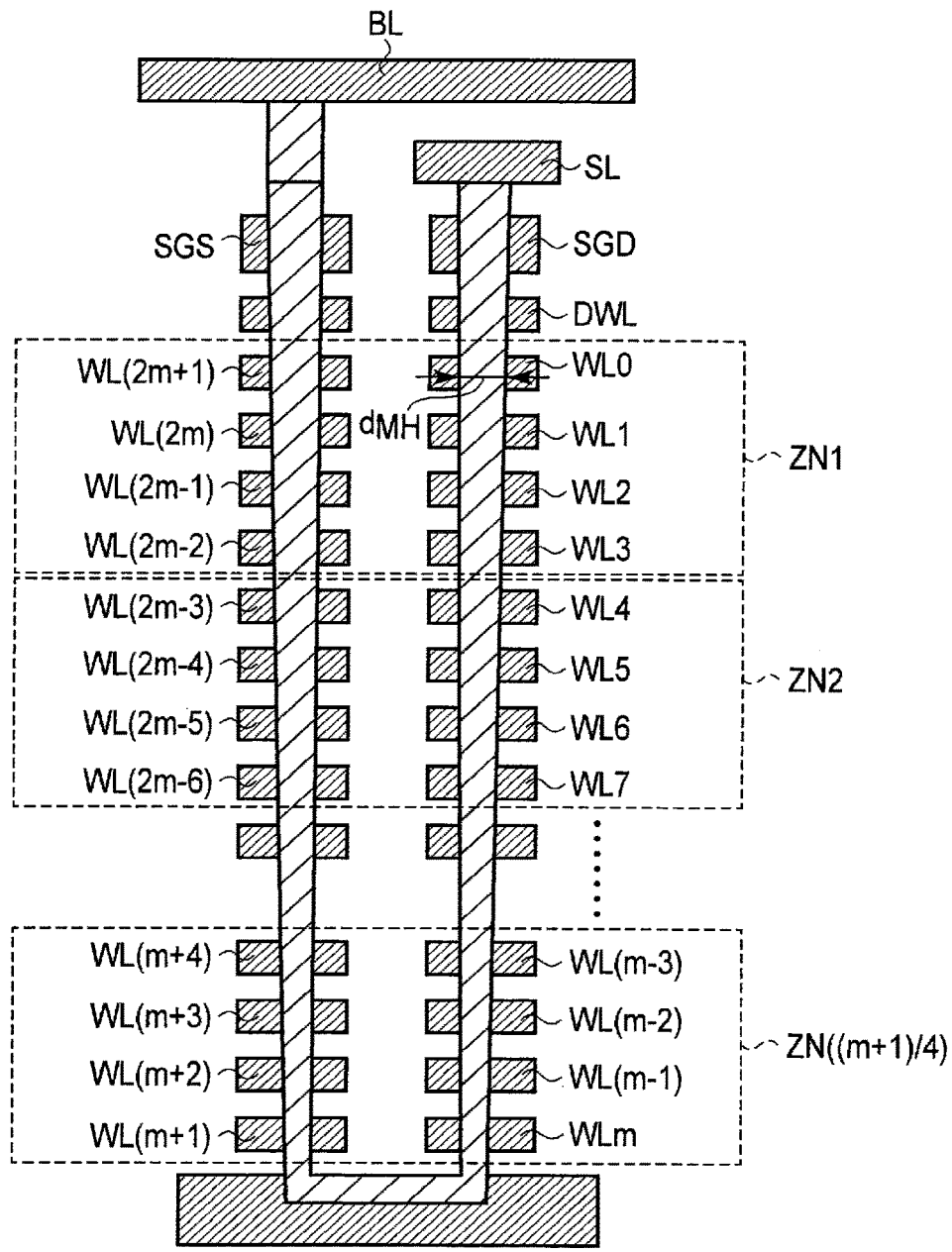
F I G. 28

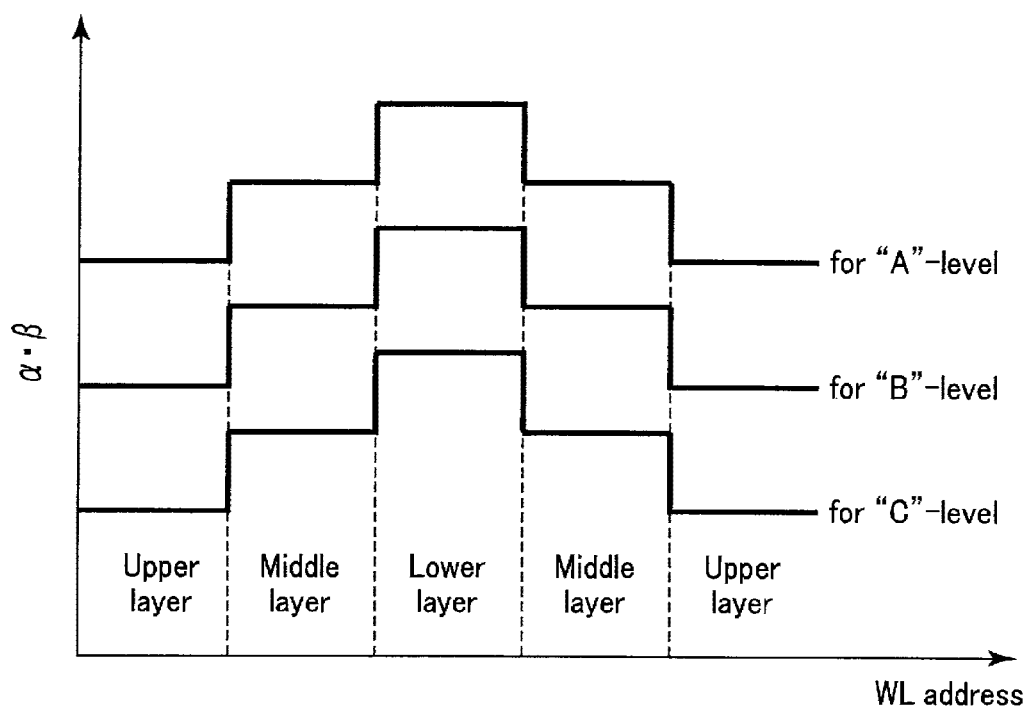
F I G. 31

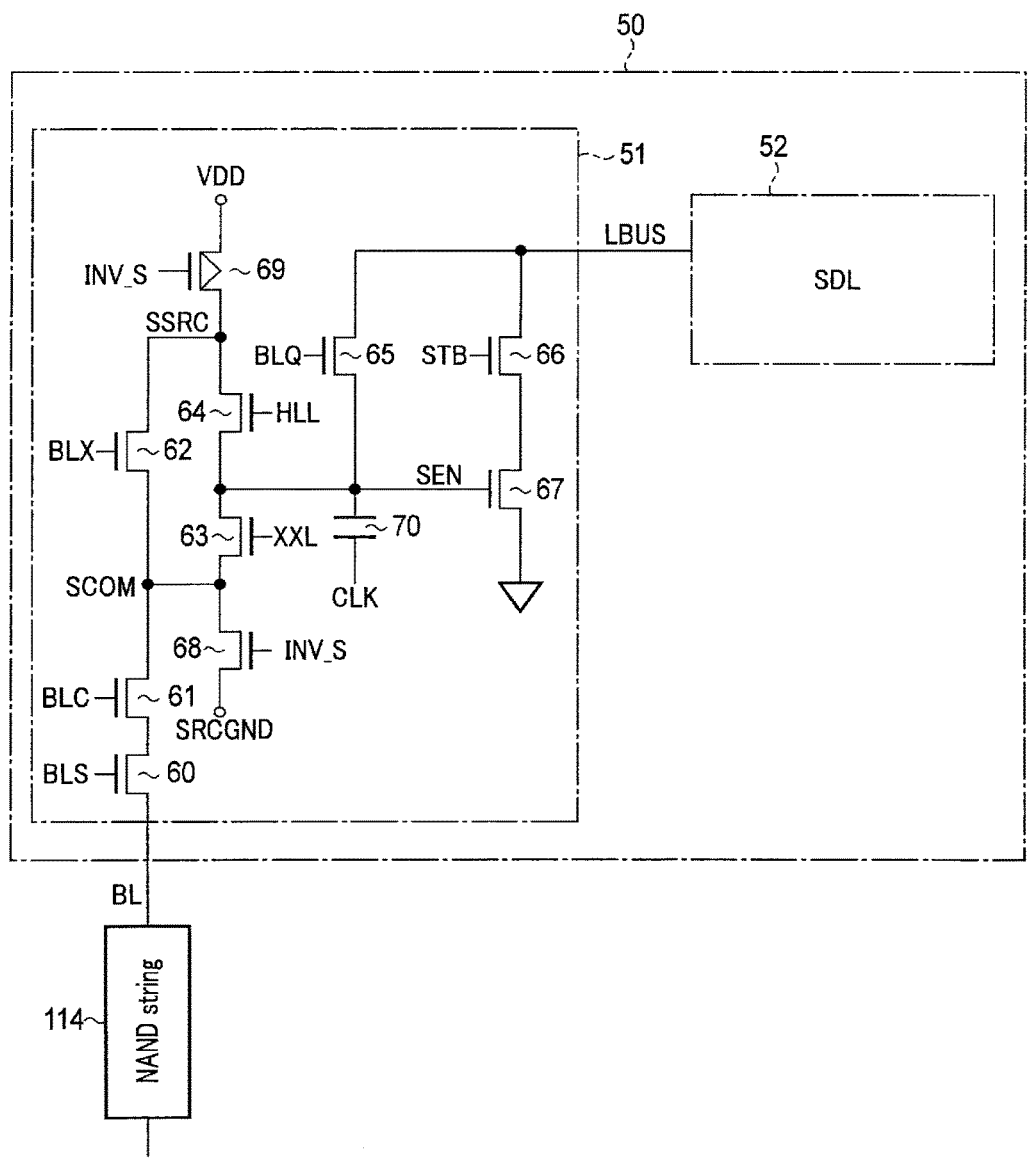
F I G. 32

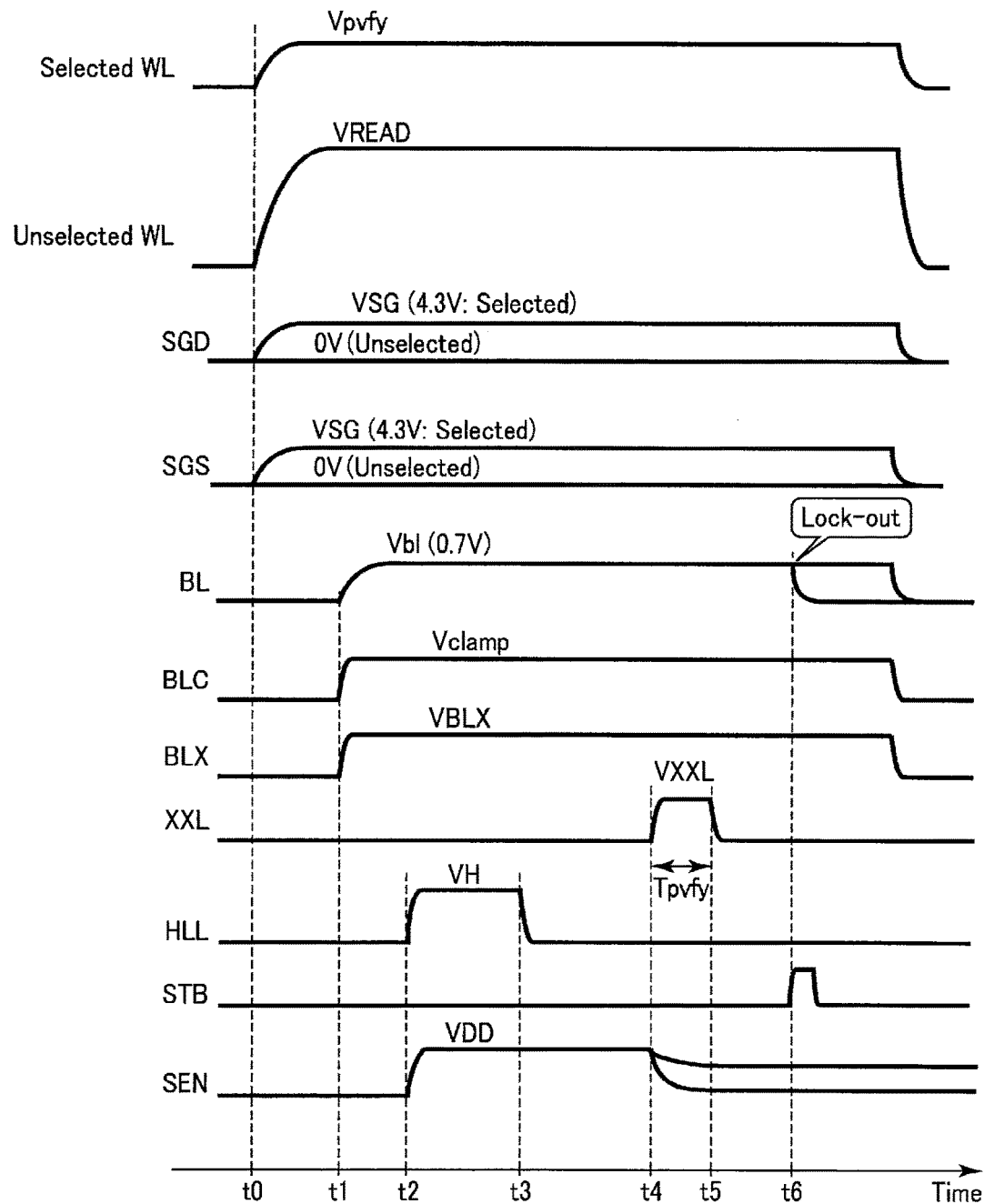
F I G. 34

|  |  | SU0 | SU1 | SU2 | SU3 |
|---|---|---|---|---|---|
| WL0 | Writing order / PD type | 1 | 2 | 3 | 4 |
|  | USEL VPGM | 0 | $\alpha*1*\Delta t1$ | $\alpha*2*\Delta t1$ | $\alpha*3*\Delta t1$ |
|  | SEL/USEL VPASS | 0 | 0 | 0 | 0 |
| WL1 | Writing order / PD type | 5 | 6 | 7 | 8 |
|  | USEL VPGM | 0 | $\alpha*1*\Delta t1$ | $\alpha*2*\Delta t1$ | $\alpha*3*\Delta t1$ |
|  | SEL/USEL VPASS | $\beta*4*\Delta t2$ | $\beta*5*\Delta t2$ | $\beta*6*\Delta t2$ | $\beta*7*\Delta t2$ |
| WL2 | Writing order / PD type | 9 | 10 | 11 | 12 |
|  | USEL VPGM | 0 | $\alpha*1*\Delta t1$ | $\alpha*2*\Delta t1$ | $\alpha*3*\Delta t1$ |
|  | SEL/USEL VPASS | $\beta*8*\Delta t2$ | $\beta*9*\Delta t2$ | $\beta*10*\Delta t2$ | $\beta*11*\Delta t2$ |
| WL3 | Writing order / PD type | 13 | 14 | 15 | 16 |
|  | USEL VPGM | 0 | $\alpha*1*\Delta t1$ | $\alpha*2*\Delta t1$ | $\alpha*3*\Delta t1$ |
|  | SEL/USEL VPASS | $\beta*12*\Delta t2$ | $\beta*13*\Delta t2$ | $\beta*14*\Delta t2$ | $\beta*15*\Delta t2$ |
| WL4 | Writing order / PD type | 17 | 18 | 19 | 20 |
|  | USEL VPGM | 0 | $\alpha*1*\Delta t1$ | $\alpha*2*\Delta t1$ | $\alpha*3*\Delta t1$ |
|  | SEL/USEL VPASS | $\beta*16*\Delta t2$ | $\beta*17*\Delta t2$ | $\beta*18*\Delta t2$ | $\beta*19*\Delta t2$ |
| WL5 | Writing order / PD type | 21 | 22 | 23 | 24 |
|  | USEL VPGM | 0 | $\alpha*1*\Delta t1$ | $\alpha*2*\Delta t1$ | $\alpha*3*\Delta t1$ |
|  | SEL/USEL VPASS | $\beta*20*\Delta t2$ | $\beta*21*\Delta t2$ | $\beta*22*\Delta t2$ | $\beta*23*\Delta t2$ |
| WL6 | Writing order / PD type | 25 | 26 | 27 | 28 |
|  | USEL VPGM | 0 | $\alpha*1*\Delta t1$ | $\alpha*2*\Delta t1$ | $\alpha*3*\Delta t1$ |
|  | SEL/USEL VPASS | $\beta*24*\Delta t2$ | $\beta*25*\Delta t2$ | $\beta*26*\Delta t2$ | $\beta*27*\Delta t2$ |
| WL7 | Writing order / PD type | 29 | 30 | 31 | 32 |
|  | USEL VPGM | 0 | $\alpha*1*\Delta t1$ | $\alpha*2*\Delta t1$ | $\alpha*3*\Delta t1$ |
|  | SEL/USEL VPASS | $\beta*28*\Delta t2$ | $\beta*29*\Delta t2$ | $\beta*30*\Delta t2$ | $\beta*31*\Delta t2$ |

F I G. 35

| | | | SU0 | SU1 | SU2 | SU3 |
|---|---|---|---|---|---|---|
| WL0 | PD type / Writing order | | 1 | 9 | 17 | 25 |
| | USEL VPGM | | 0 | $\alpha*1*\Delta t1$ | $\alpha*2*\Delta t1$ | $\alpha*3*\Delta t1$ |
| | SEL/USEL VPASS | | 0 | $\beta*8*\Delta t2$ | $\beta*16*\Delta t2$ | $\beta*24*\Delta t2$ |
| WL1 | PD type / Writing order | | 2 | 10 | 18 | 26 |
| | USEL VPGM | | 0 | $\alpha*1*\Delta t1$ | $\alpha*2*\Delta t1$ | $\alpha*3*\Delta t1$ |
| | SEL/USEL VPASS | | $\beta*1*\Delta t2$ | $\beta*9*\Delta t2$ | $\beta*17*\Delta t2$ | $\beta*25*\Delta t2$ |
| WL2 | PD type / Writing order | | 3 | 11 | 19 | 27 |
| | USEL VPGM | | 0 | $\alpha*1*\Delta t1$ | $\alpha*2*\Delta t1$ | $\alpha*3*\Delta t1$ |
| | SEL/USEL VPASS | | $\beta*2*\Delta t2$ | $\beta*10*\Delta t2$ | $\beta*18*\Delta t2$ | $\beta*26*\Delta t2$ |
| WL3 | PD type / Writing order | | 4 | 12 | 20 | 28 |
| | USEL VPGM | | 0 | $\alpha*1*\Delta t1$ | $\alpha*2*\Delta t1$ | $\alpha*3*\Delta t1$ |
| | SEL/USEL VPASS | | $\beta*3*\Delta t2$ | $\beta*11*\Delta t2$ | $\beta*19*\Delta t2$ | $\beta*27*\Delta t2$ |
| WL4 | PD type / Writing order | | 5 | 13 | 21 | 29 |
| | USEL VPGM | | 0 | $\alpha*1*\Delta t1$ | $\alpha*2*\Delta t1$ | $\alpha*3*\Delta t1$ |
| | SEL/USEL VPASS | | $\beta*4*\Delta t2$ | $\beta*12*\Delta t2$ | $\beta*20*\Delta t2$ | $\beta*28*\Delta t2$ |
| WL5 | PD type / Writing order | | 6 | 14 | 22 | 30 |
| | USEL VPGM | | 0 | $\alpha*1*\Delta t1$ | $\alpha*2*\Delta t1$ | $\alpha*3*\Delta t1$ |
| | SEL/USEL VPASS | | $\beta*5*\Delta t2$ | $\beta*13*\Delta t2$ | $\beta*21*\Delta t2$ | $\beta*29*\Delta t2$ |
| WL6 | PD type / Writing order | | 7 | 15 | 23 | 31 |
| | USEL VPGM | | 0 | $\alpha*1*\Delta t1$ | $\alpha*2*\Delta t1$ | $\alpha*3*\Delta t1$ |
| | SEL/USEL VPASS | | $\beta*6*\Delta t2$ | $\beta*14*\Delta t2$ | $\beta*22*\Delta t2$ | $\beta*30*\Delta t2$ |
| WL7 | PD type / Writing order | | 8 | 16 | 24 | 32 |
| | USEL VPGM | | 0 | $\alpha*1*\Delta t1$ | $\alpha*2*\Delta t1$ | $\alpha*3*\Delta t1$ |
| | SEL/USEL VPASS | | $\beta*7*\Delta t2$ | $\beta*15*\Delta t2$ | $\beta*23*\Delta t2$ | $\beta*31*\Delta t2$ |

F I G. 36

|  |  | SU0 | SU1 | SU2 | SU3 |
|---|---|---|---|---|---|
| WL0 | PD type \ Writing order | 1 | 9 | 17 | 25 |
|  | USEL VPGM | 0 | $\alpha*1*\Delta t1$ | $\alpha*2*\Delta t1$ | $\alpha*3*\Delta t1$ |
|  | SEL/USEL VPASS | 0 | $\beta*8*\Delta t2$ | $\beta*16*\Delta t2$ | $\beta*24*\Delta t2$ |
| WL7 | PD type \ Writing order | 2 | 10 | 18 | 26 |
|  | USEL VPGM | 0 | $\alpha*1*\Delta t1$ | $\alpha*2*\Delta t1$ | $\alpha*3*\Delta t1$ |
|  | SEL/USEL VPASS | $\beta*1*\Delta t2$ | $\beta*9*\Delta t2$ | $\beta*17*\Delta t2$ | $\beta*25*\Delta t2$ |
| WL1 | PD type \ Writing order | 3 | 11 | 19 | 27 |
|  | USEL VPGM | 0 | $\alpha*1*\Delta t1$ | $\alpha*2*\Delta t1$ | $\alpha*3*\Delta t1$ |
|  | SEL/USEL VPASS | $\beta*2*\Delta t2$ | $\beta*10*\Delta t2$ | $\beta*18*\Delta t2$ | $\beta*26*\Delta t2$ |
| WL6 | PD type \ Writing order | 4 | 12 | 20 | 28 |
|  | USEL VPGM | 0 | $\alpha*1*\Delta t1$ | $\alpha*2*\Delta t1$ | $\alpha*3*\Delta t1$ |
|  | SEL/USEL VPASS | $\beta*3*\Delta t2$ | $\beta*11*\Delta t2$ | $\beta*19*\Delta t2$ | $\beta*27*\Delta t2$ |
| WL2 | PD type \ Writing order | 5 | 13 | 21 | 29 |
|  | USEL VPGM | 0 | $\alpha*1*\Delta t1$ | $\alpha*2*\Delta t1$ | $\alpha*3*\Delta t1$ |
|  | SEL/USEL VPASS | $\beta*4*\Delta t2$ | $\beta*12*\Delta t2$ | $\beta*20*\Delta t2$ | $\beta*28*\Delta t2$ |
| WL5 | PD type \ Writing order | 6 | 14 | 22 | 30 |
|  | USEL VPGM | 0 | $\alpha*1*\Delta t1$ | $\alpha*2*\Delta t1$ | $\alpha*3*\Delta t1$ |
|  | SEL/USEL VPASS | $\beta*5*\Delta t2$ | $\beta*13*\Delta t2$ | $\beta*21*\Delta t2$ | $\beta*29*\Delta t2$ |
| WL3 | PD type \ Writing order | 7 | 15 | 23 | 31 |
|  | USEL VPGM | 0 | $\alpha*1*\Delta t1$ | $\alpha*2*\Delta t1$ | $\alpha*3*\Delta t1$ |
|  | SEL/USEL VPASS | $\beta*6*\Delta t2$ | $\beta*14*\Delta t2$ | $\beta*22*\Delta t2$ | $\beta*30*\Delta t2$ |
| WL4 | PD type \ Writing order | 8 | 16 | 24 | 32 |
|  | USEL VPGM | 0 | $\alpha*1*\Delta t1$ | $\alpha*2*\Delta t1$ | $\alpha*3*\Delta t1$ |
|  | SEL/USEL VPASS | $\beta*7*\Delta t2$ | $\beta*15*\Delta t2$ | $\beta*23*\Delta t2$ | $\beta*31*\Delta t2$ |

F I G. 37

| | | SU0 | SU1 | SU2 | SU3 |
|---|---|---|---|---|---|
| WL0 | PD type / Writing order | 1 | 2 | 3 | 4 |
| | USEL VPGM | 0 | $\alpha*1*\Delta t1$ | $\alpha*2*\Delta t1$ | $\alpha*3*\Delta t1$ |
| | SEL/USEL VPASS | 0 | 0 | 0 | 0 |
| WL7 | PD type / Writing order | 5 | 6 | 7 | 8 |
| | USEL VPGM | 0 | $\alpha*1*\Delta t1$ | $\alpha*2*\Delta t1$ | $\alpha*3*\Delta t1$ |
| | SEL/USEL VPASS | $\beta*4*\Delta t2$ | $\beta*5*\Delta t2$ | $\beta*6*\Delta t2$ | $\beta*7*\Delta t2$ |
| WL1 | PD type / Writing order | 9 | 10 | 11 | 12 |
| | USEL VPGM | 0 | $\alpha*1*\Delta t1$ | $\alpha*2*\Delta t1$ | $\alpha*3*\Delta t1$ |
| | SEL/USEL VPASS | $\beta*8*\Delta t2$ | $\beta*9*\Delta t2$ | $\beta*10*\Delta t2$ | $\beta*11*\Delta t2$ |
| WL6 | PD type / Writing order | 13 | 14 | 15 | 16 |
| | USEL VPGM | 0 | $\alpha*1*\Delta t1$ | $\alpha*2*\Delta t1$ | $\alpha*3*\Delta t1$ |
| | SEL/USEL VPASS | $\beta*12*\Delta t2$ | $\beta*13*\Delta t2$ | $\beta*14*\Delta t2$ | $\beta*15*\Delta t2$ |
| WL2 | PD type / Writing order | 17 | 18 | 19 | 20 |
| | USEL VPGM | 0 | $\alpha*1*\Delta t1$ | $\alpha*2*\Delta t1$ | $\alpha*3*\Delta t1$ |
| | SEL/USEL VPASS | $\beta*16*\Delta t2$ | $\beta*17*\Delta t2$ | $\beta*18*\Delta t2$ | $\beta*19*\Delta t2$ |
| WL5 | PD type / Writing order | 21 | 22 | 23 | 24 |
| | USEL VPGM | 0 | $\alpha*1*\Delta t1$ | $\alpha*2*\Delta t1$ | $\alpha*3*\Delta t1$ |
| | SEL/USEL VPASS | $\beta*20*\Delta t2$ | $\beta*21*\Delta t2$ | $\beta*22*\Delta t2$ | $\beta*23*\Delta t2$ |
| WL3 | PD type / Writing order | 25 | 26 | 27 | 28 |
| | USEL VPGM | 0 | $\alpha*1*\Delta t1$ | $\alpha*2*\Delta t1$ | $\alpha*3*\Delta t1$ |
| | SEL/USEL VPASS | $\beta*24*\Delta t2$ | $\beta*25*\Delta t2$ | $\beta*26*\Delta t2$ | $\beta*27*\Delta t2$ |
| WL4 | PD type / Writing order | 29 | 30 | 31 | 32 |
| | USEL VPGM | 0 | $\alpha*1*\Delta t1$ | $\alpha*2*\Delta t1$ | $\alpha*3*\Delta t1$ |
| | SEL/USEL VPASS | $\beta*28*\Delta t2$ | $\beta*29*\Delta t2$ | $\beta*30*\Delta t2$ | $\beta*31*\Delta t2$ |

F I G. 38

|  |  | SU0 | SU1 | SU2 | SU3 |
|---|---|---|---|---|---|
| WL0 | Writing order / PD type | 1 | 3 | 5 | 7 |
|  | USEL VPGM | 0 | $\alpha*1*\Delta t1$ | $\alpha*2*\Delta t1$ | $\alpha*3*\Delta t1$ |
|  | SEL/USEL VPASS | 0 | $\beta*2*\Delta t2$ | $\beta*4*\Delta t2$ | $\beta*6*\Delta t2$ |
| WL7 | Writing order / PD type | 2 | 4 | 6 | 8 |
|  | USEL VPGM | 0 | $\alpha*1*\Delta t1$ | $\alpha*2*\Delta t1$ | $\alpha*3*\Delta t1$ |
|  | SEL/USEL VPASS | $\beta*1*\Delta t2$ | $\beta*3*\Delta t2$ | $\beta*5*\Delta t2$ | $\beta*7*\Delta t2$ |
| WL1 | Writing order / PD type | 9 | 11 | 13 | 15 |
|  | USEL VPGM | 0 | $\alpha*1*\Delta t1$ | $\alpha*2*\Delta t1$ | $\alpha*3*\Delta t1$ |
|  | SEL/USEL VPASS | $\beta*8*\Delta t2$ | $\beta*10*\Delta t2$ | $\beta*12*\Delta t2$ | $\beta*14*\Delta t2$ |
| WL6 | Writing order / PD type | 10 | 12 | 14 | 16 |
|  | USEL VPGM | 0 | $\alpha*1*\Delta t1$ | $\alpha*2*\Delta t1$ | $\alpha*3*\Delta t1$ |
|  | SEL/USEL VPASS | $\beta*9*\Delta t2$ | $\beta*11*\Delta t2$ | $\beta*13*\Delta t2$ | $\beta*15*\Delta t2$ |
| WL2 | Writing order / PD type | 17 | 19 | 21 | 23 |
|  | USEL VPGM | 0 | $\alpha*1*\Delta t1$ | $\alpha*2*\Delta t1$ | $\alpha*3*\Delta t1$ |
|  | SEL/USEL VPASS | $\beta*16*\Delta t2$ | $\beta*18*\Delta t2$ | $\beta*20*\Delta t2$ | $\beta*22*\Delta t2$ |
| WL5 | Writing order / PD type | 18 | 20 | 22 | 24 |
|  | USEL VPGM | 0 | $\alpha*1*\Delta t1$ | $\alpha*2*\Delta t1$ | $\alpha*3*\Delta t1$ |
|  | SEL/USEL VPASS | $\beta*17*\Delta t2$ | $\beta*19*\Delta t2$ | $\beta*21*\Delta t2$ | $\beta*23*\Delta t2$ |
| WL3 | Writing order / PD type | 25 | 27 | 29 | 31 |
|  | USEL VPGM | 0 | $\alpha*1*\Delta t1$ | $\alpha*2*\Delta t1$ | $\alpha*3*\Delta t1$ |
|  | SEL/USEL VPASS | $\beta*24*\Delta t2$ | $\beta*26*\Delta t2$ | $\beta*28*\Delta t2$ | $\beta*30*\Delta t2$ |
| WL4 | Writing order / PD type | 26 | 28 | 30 | 32 |
|  | USEL VPGM | 0 | $\alpha*1*\Delta t1$ | $\alpha*2*\Delta t1$ | $\alpha*3*\Delta t1$ |
|  | SEL/USEL VPASS | $\beta*25*\Delta t2$ | $\beta*27*\Delta t2$ | $\beta*29*\Delta t2$ | $\beta*31*\Delta t2$ |

F I G. 39

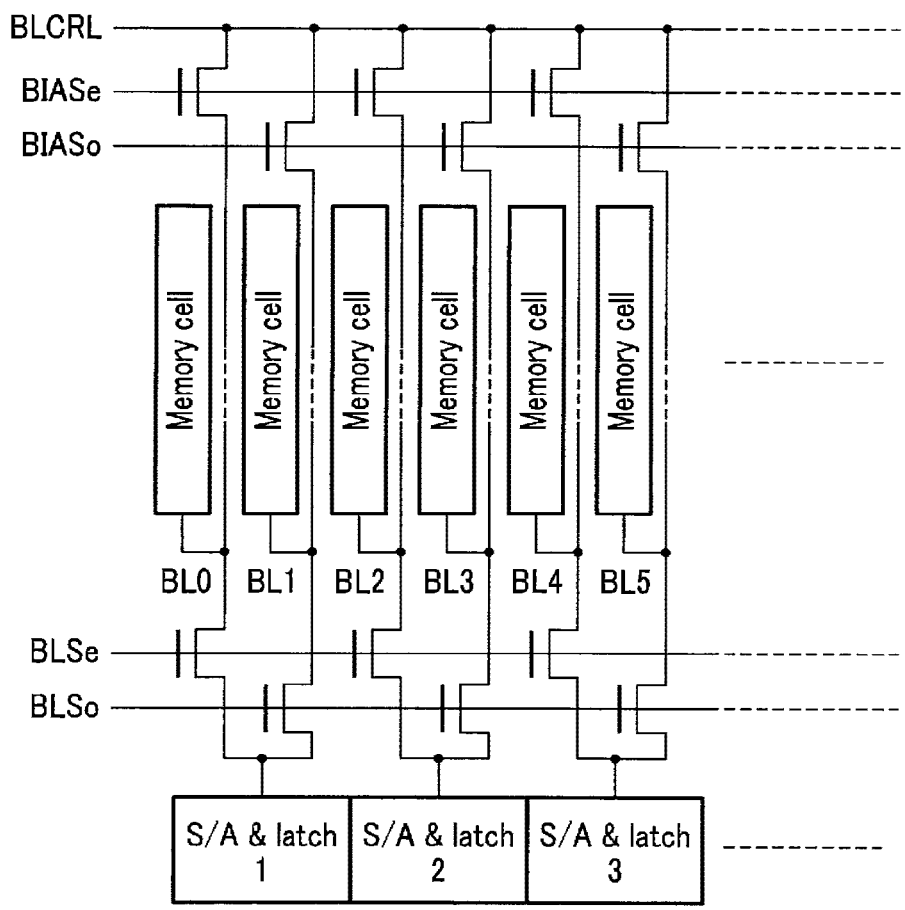
F I G. 40

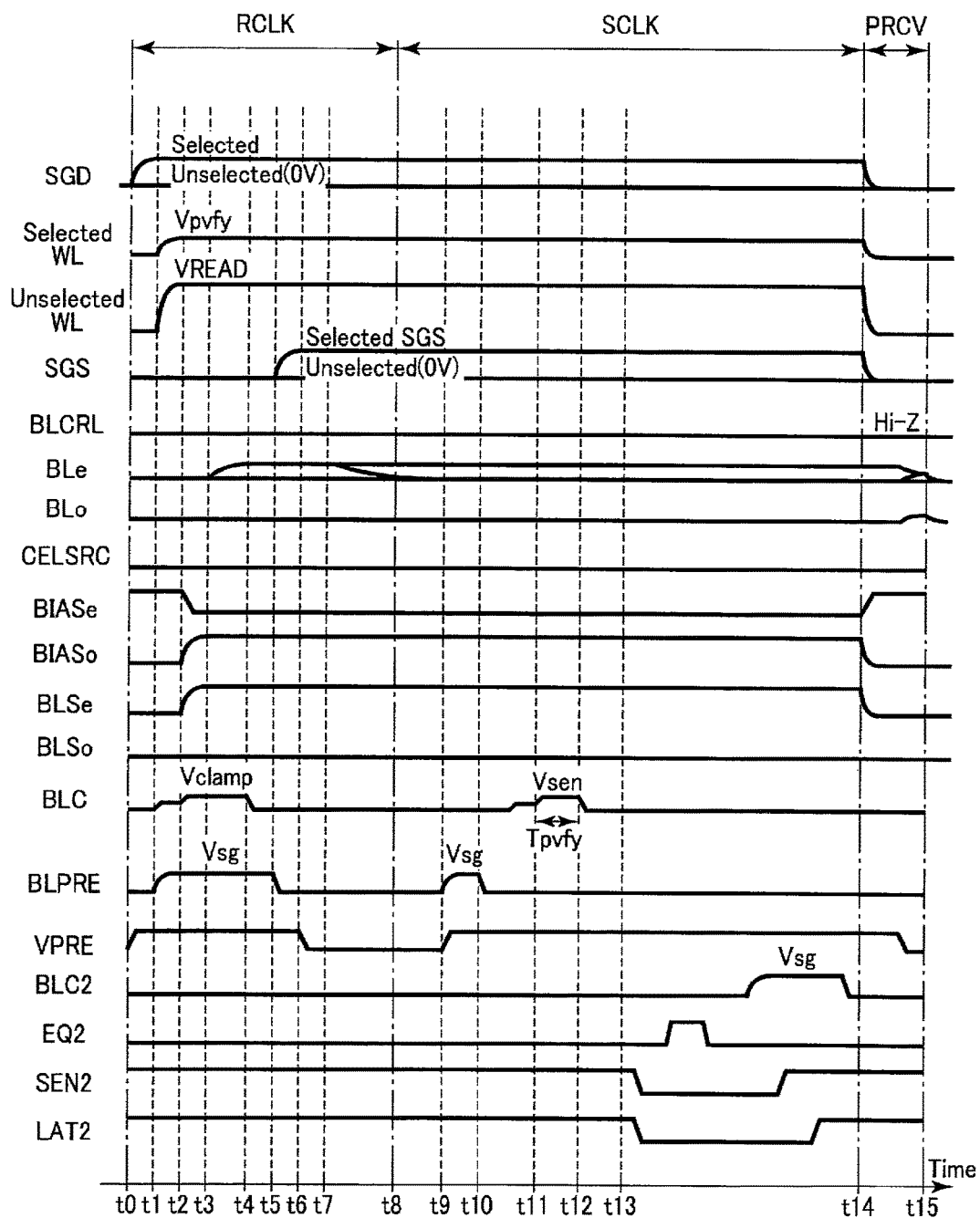
F I G. 42

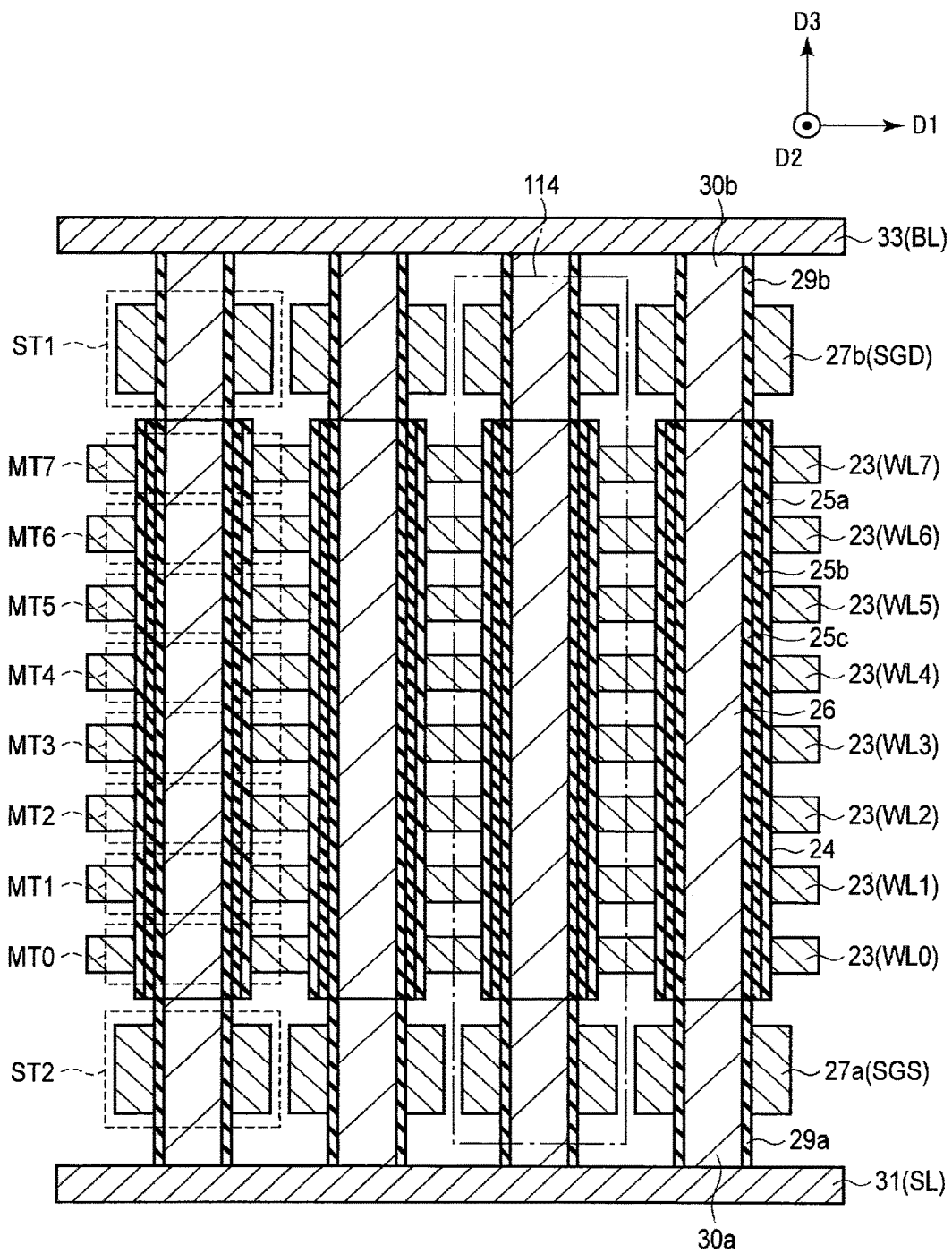
F I G. 44

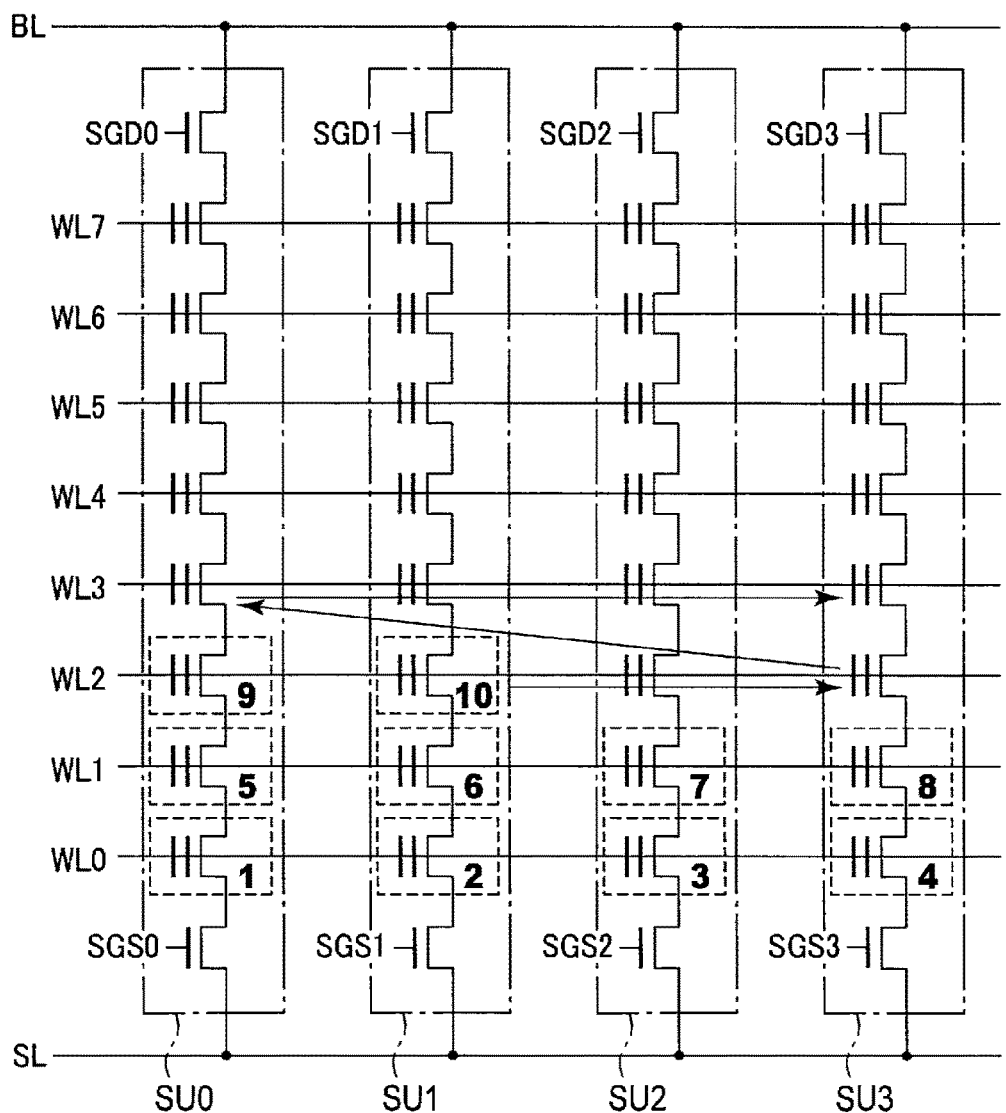
F I G. 45

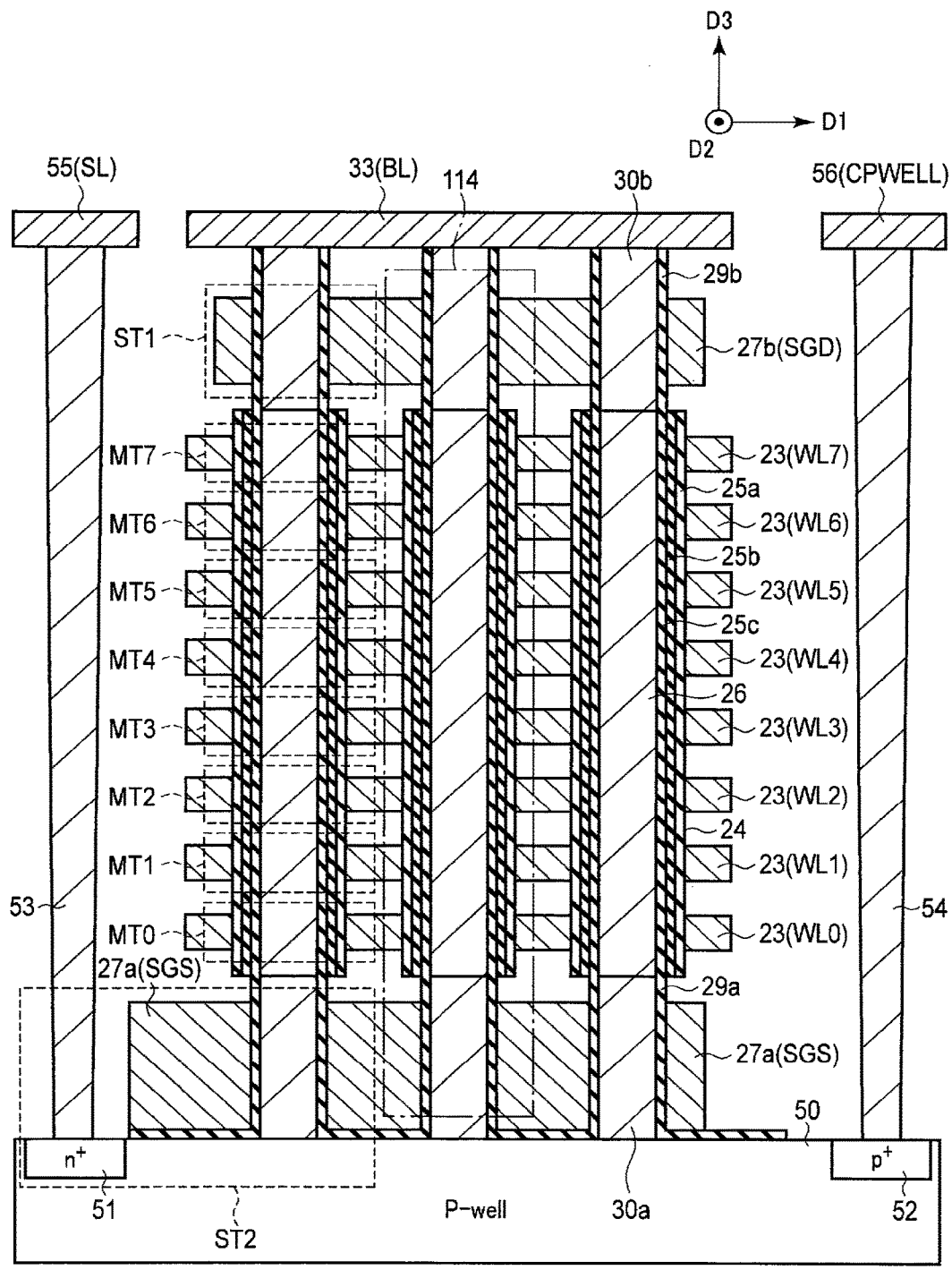
F I G. 47

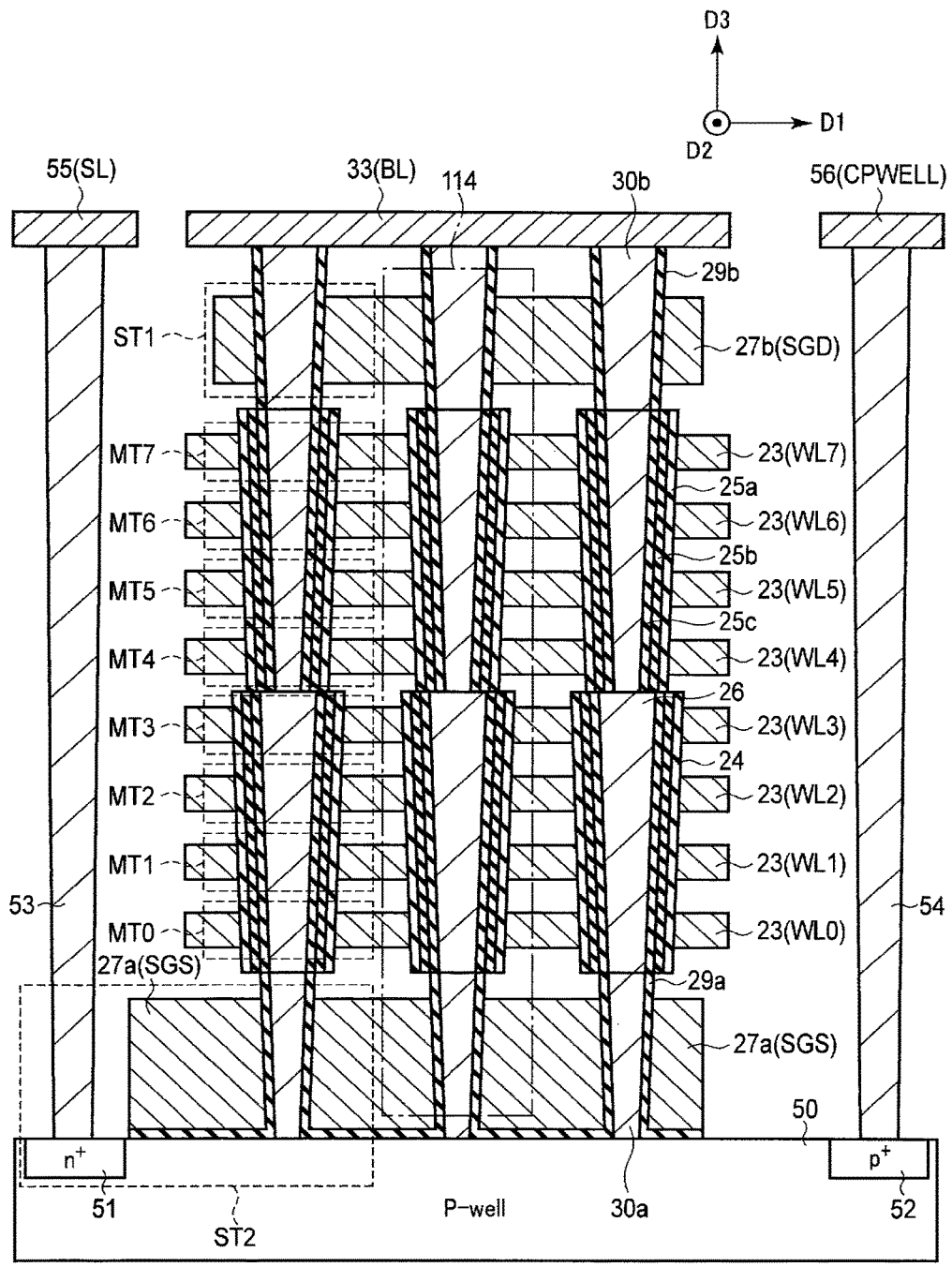
F I G. 49

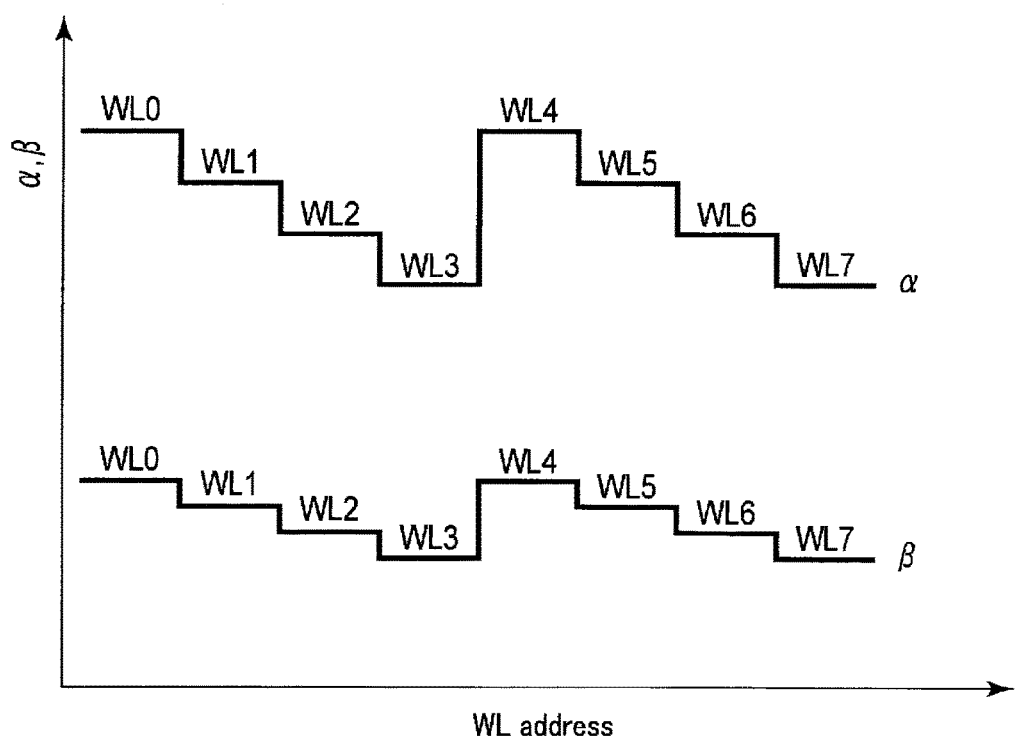
F I G. 50

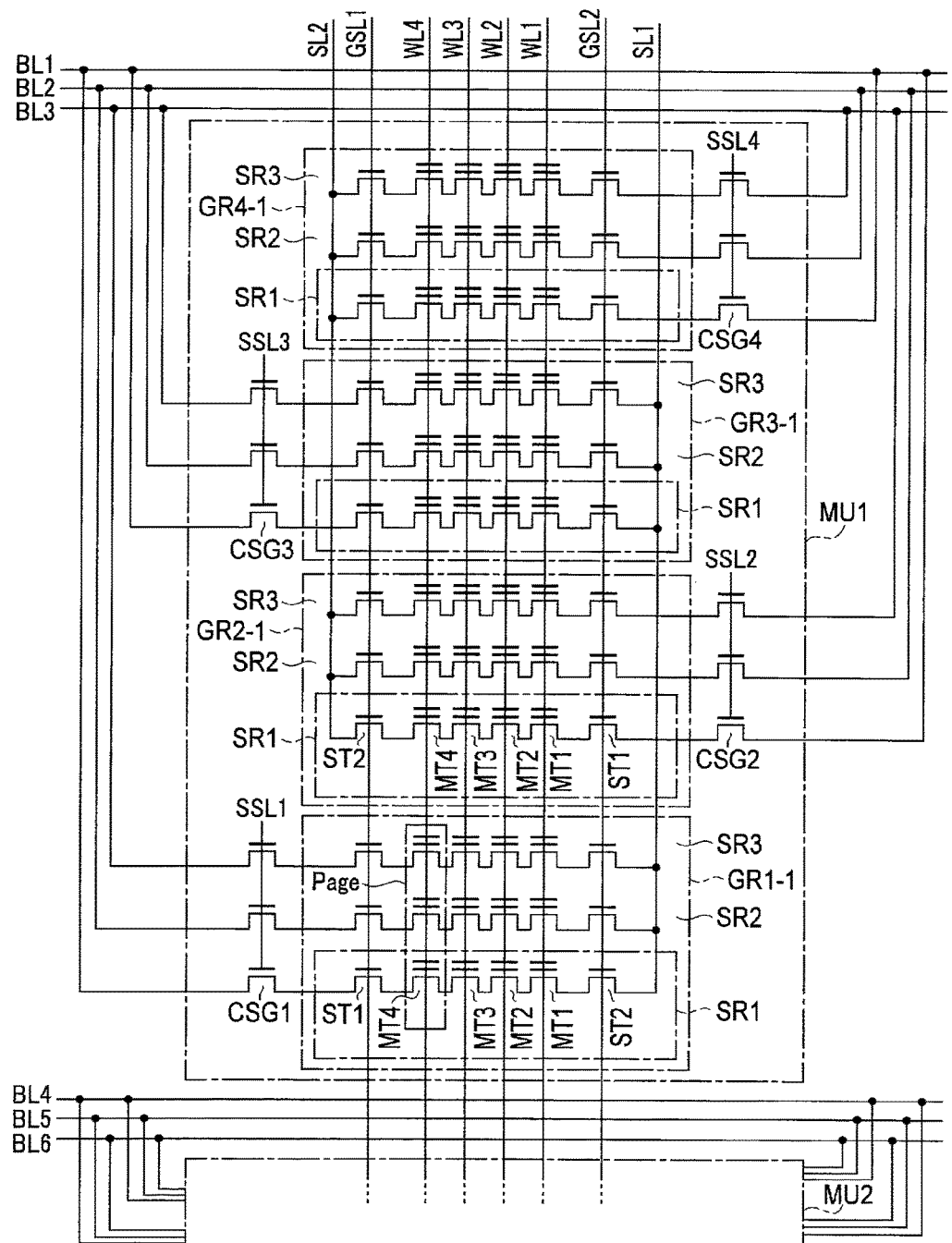
F I G. 51

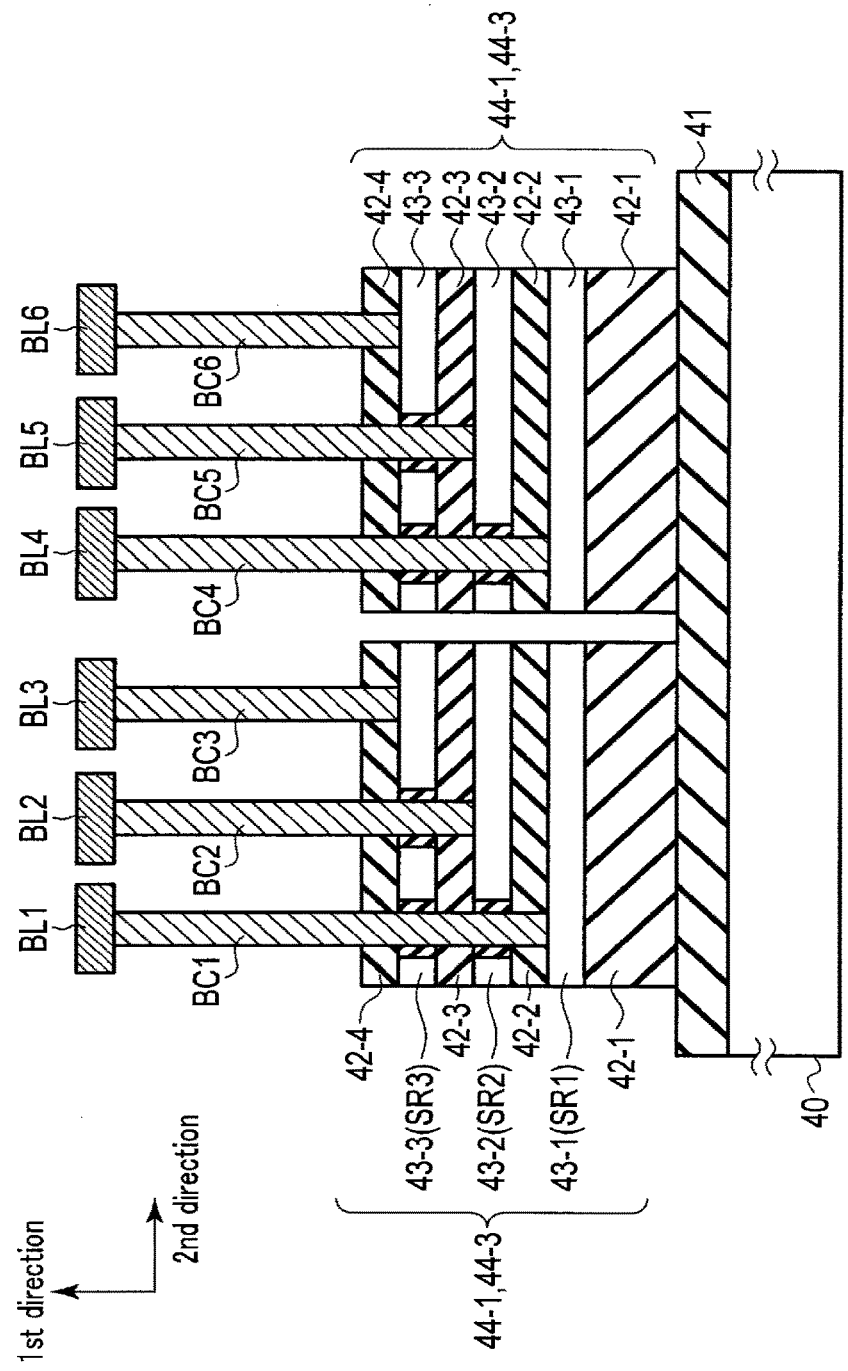
F I G. 55

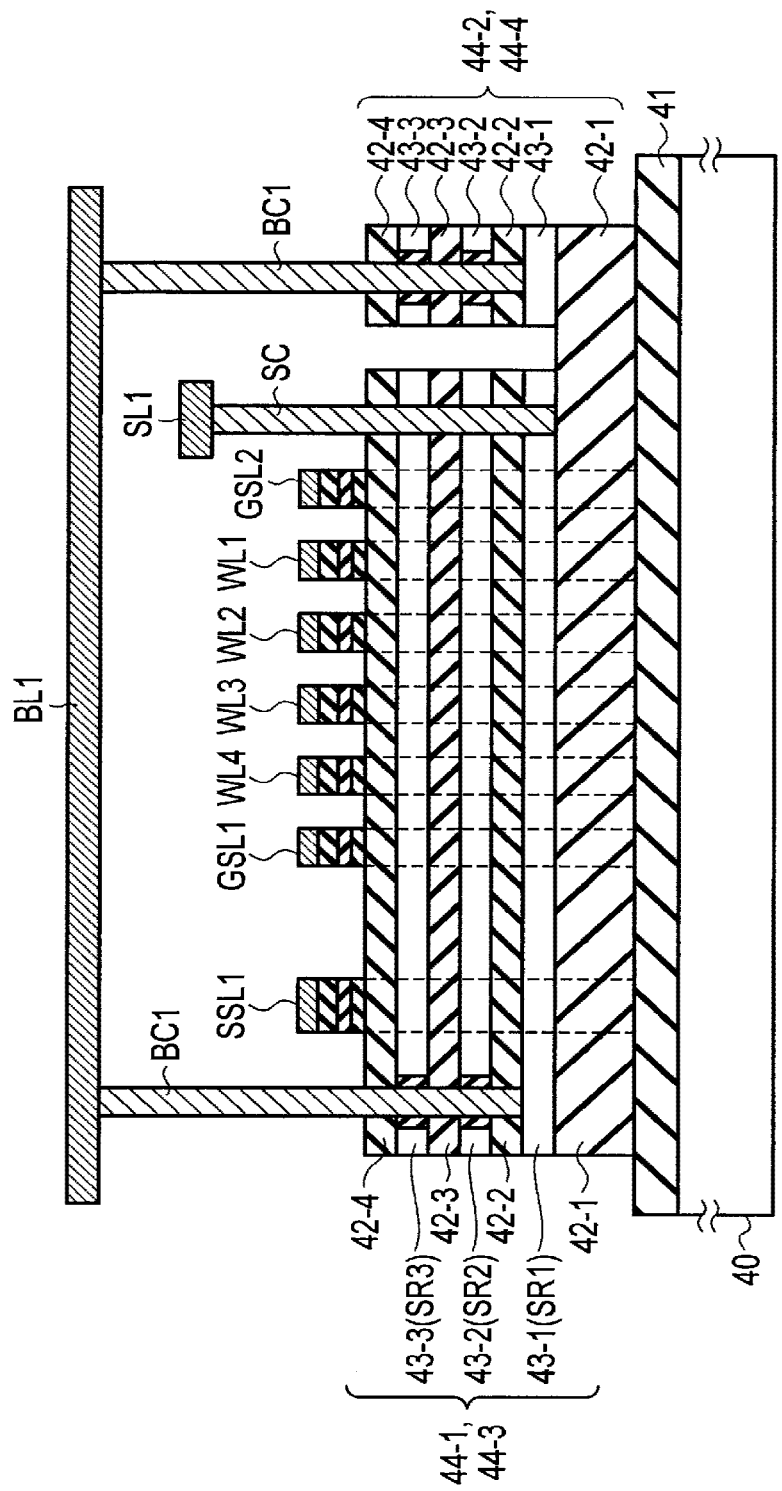
F I G. 56

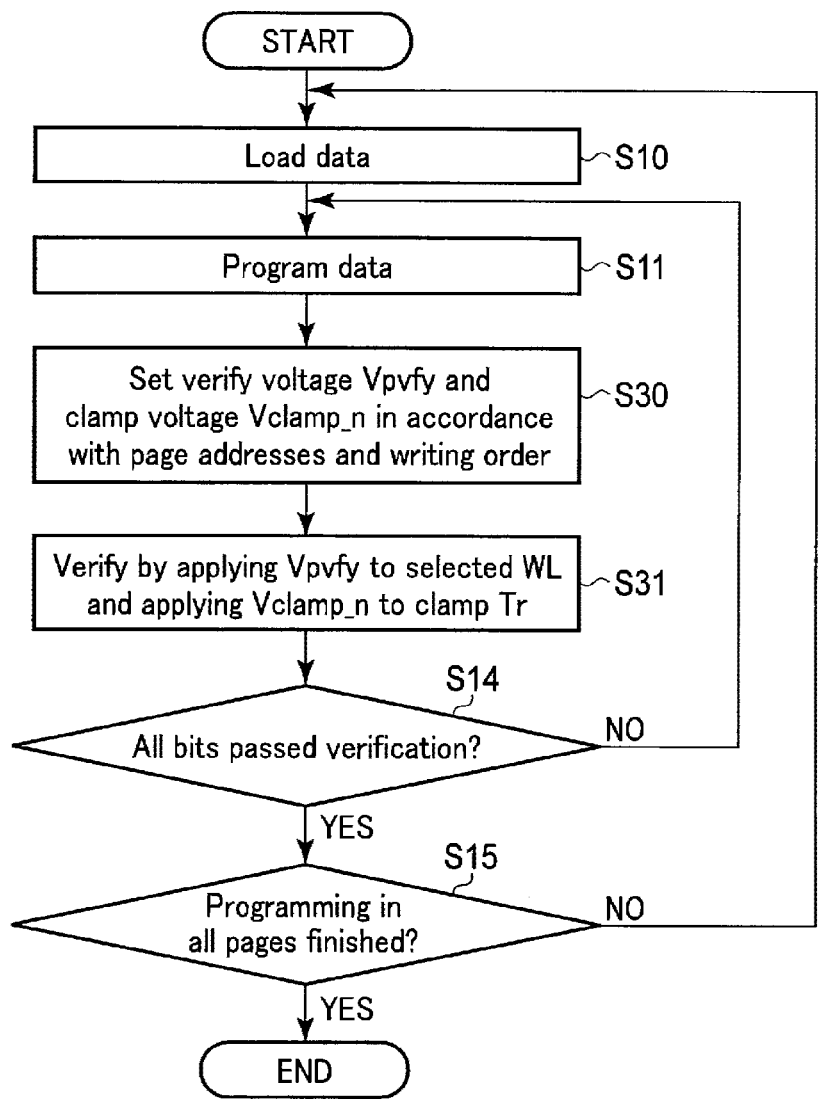
F I G. 57

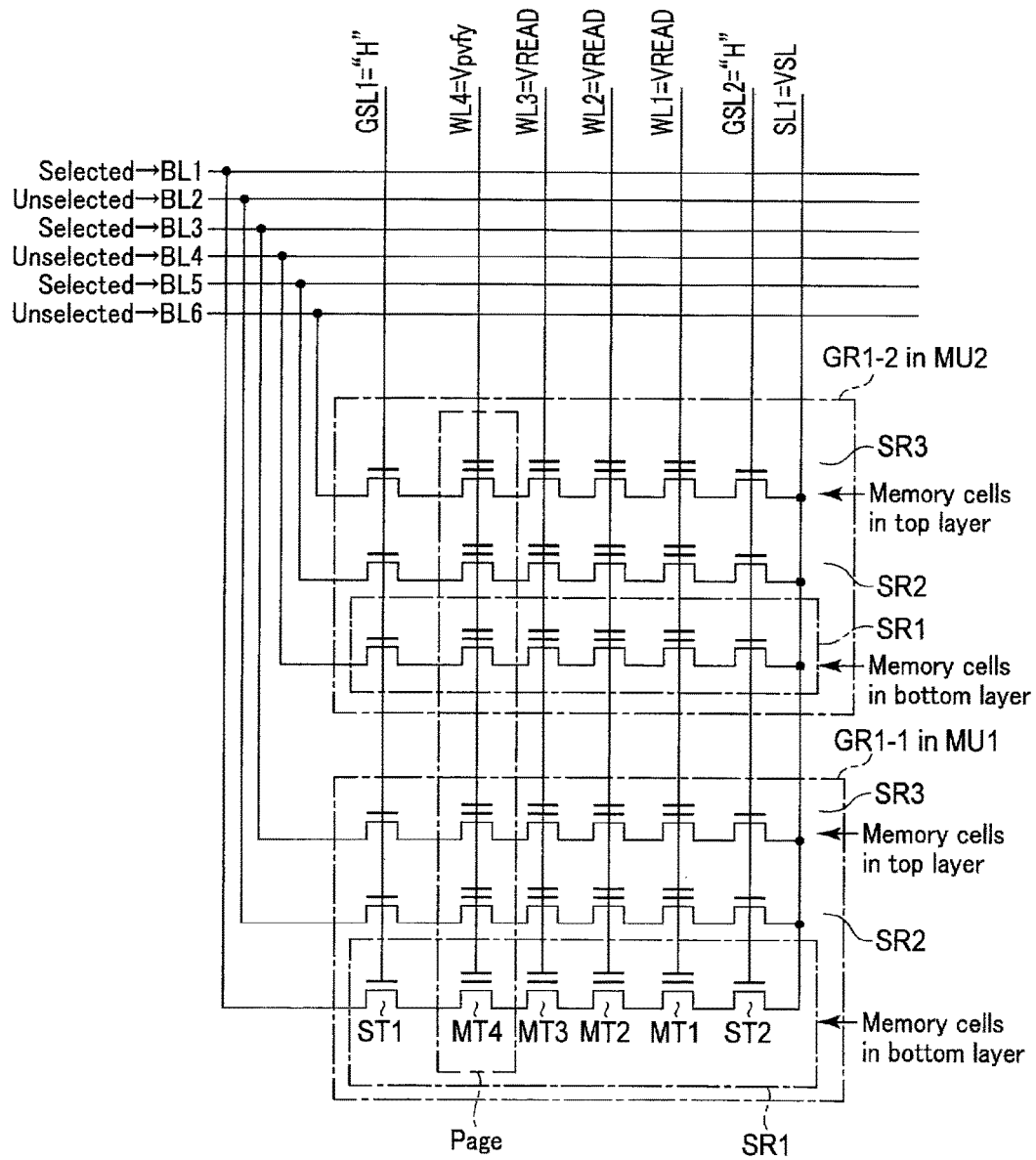
F I G. 58

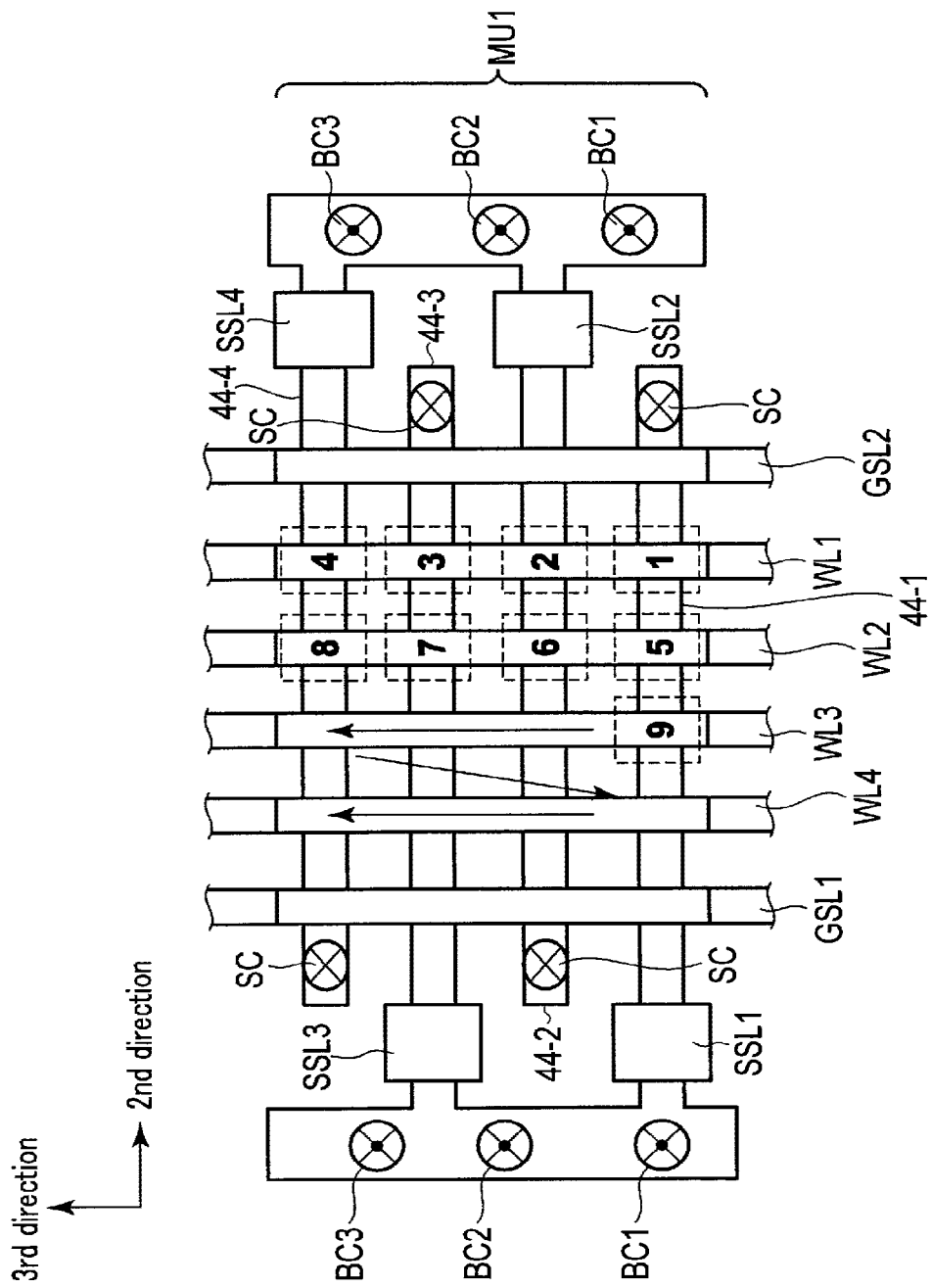
F I G. 60

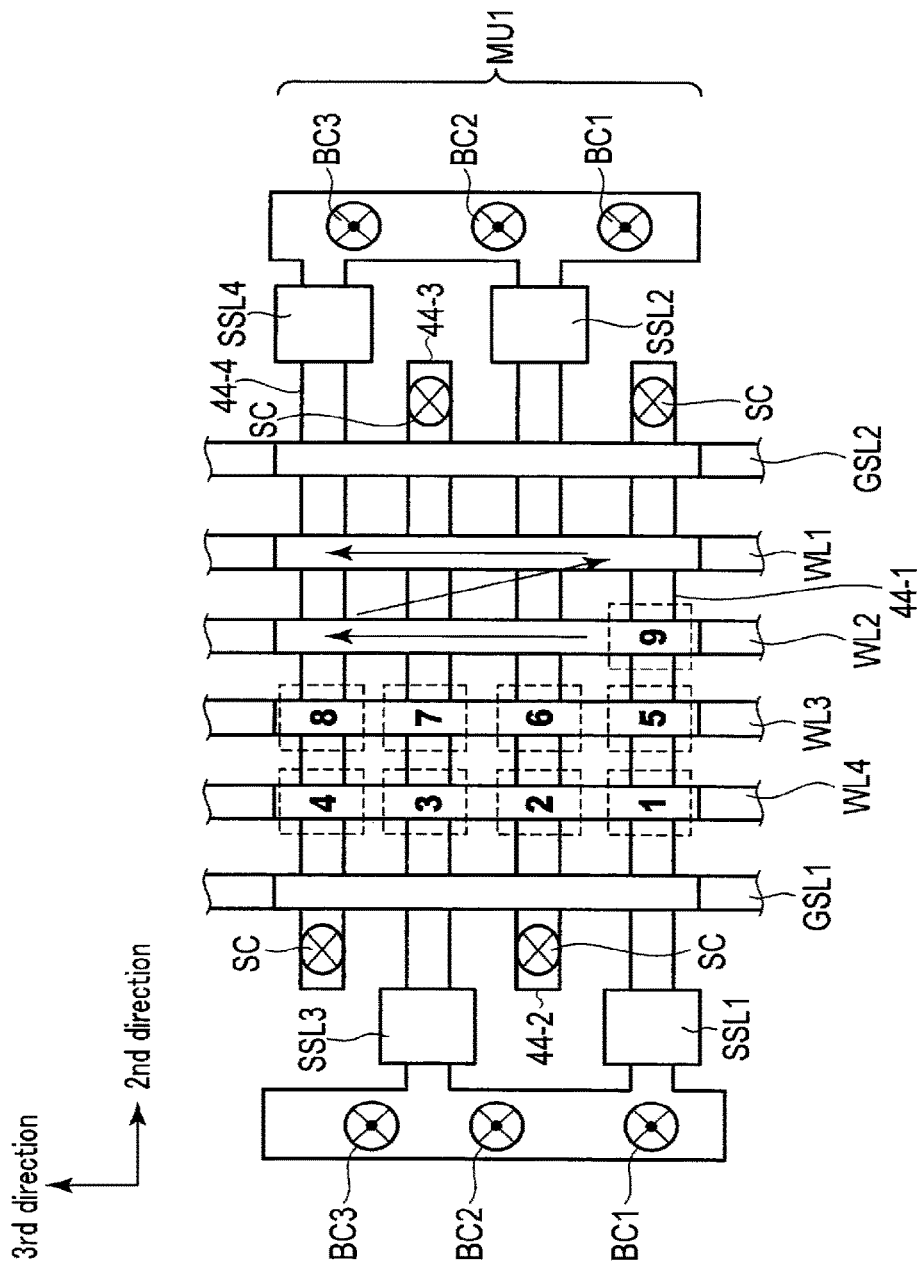
F I G. 61

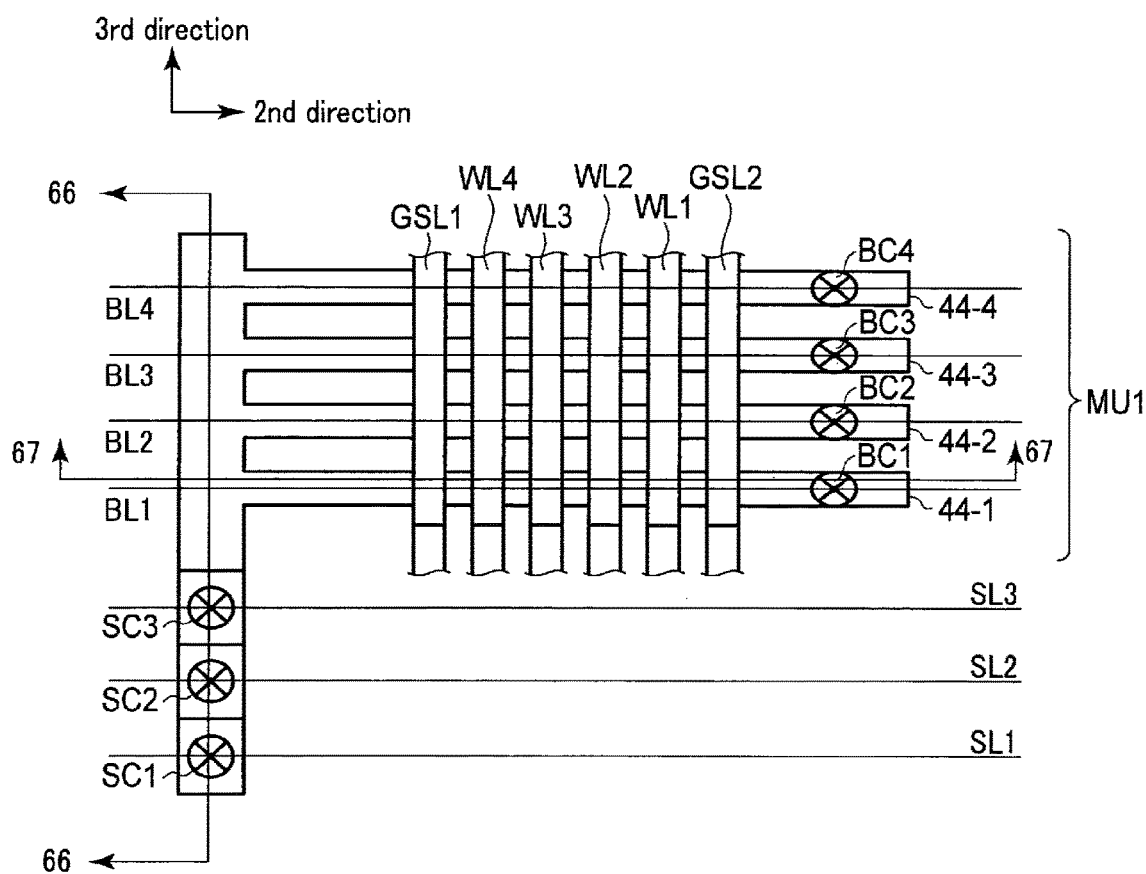
F I G. 65

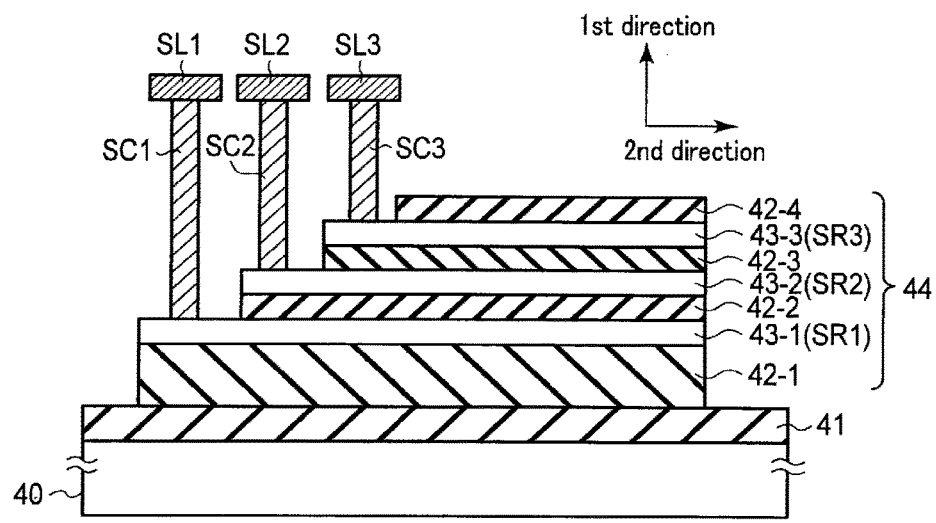
F I G. 66
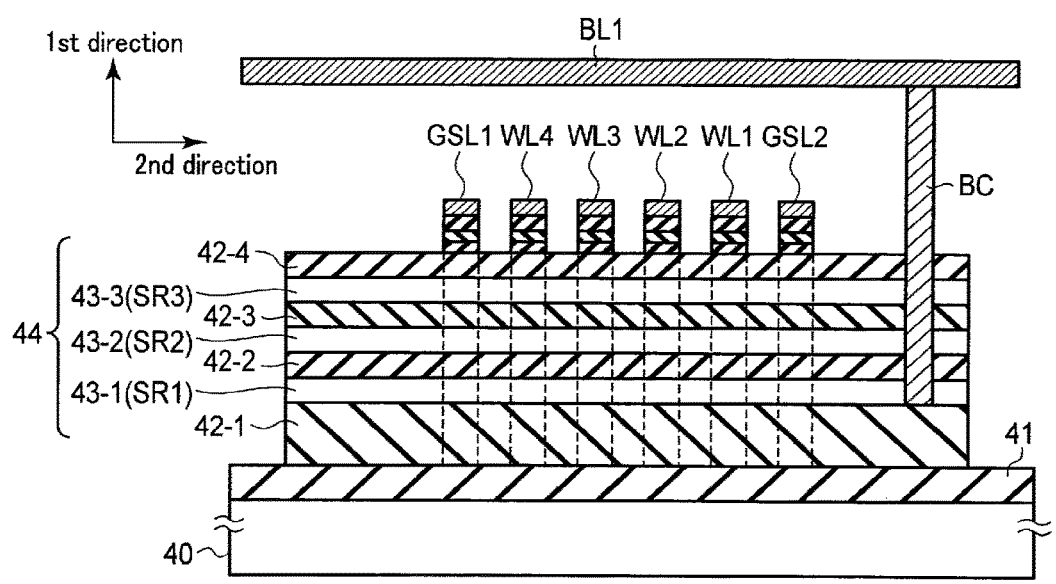
F I G. 67

SEMICONDUCTOR MEMORY DEVICE

CROSS-REFERENCE TO RELATED APPLICATIONS

This application is a Continuation Application of U.S. application Ser. No. 15/185,671 (now U.S. Pat. No. 9,633,745), filed Jun. 17, 2016, which is a Continuation Application of PCT Application No. PCT/JP2013/083870, filed Dec. 18, 2013, the entire contents of which are incorporated herein by reference.

FIELD

Embodiments described herein relate to a semiconductor memory device.

BACKGROUND

A NAND flash memory in which memory cells are three-dimensionally arrayed is known.

BRIEF DESCRIPTION OF THE DRAWINGS

FIG. 1 is a block diagram of a memory system according to a first embodiment;

FIG. 3 and FIG. 4 are a circuit diagram and a sectional view of the memory cell array according to the first embodiment;

FIG. 6 is a flowchart of a write operation according to the first embodiment;

FIG. 9 is a conceptual diagram of an offset table according to the first embodiment;

FIG. 14 is a conceptual diagram of an offset table according to the second embodiment;

FIG. 16 is a sectional view of a block according to the second embodiment;

FIG. 17 is a conceptual diagram of an offset table according to the second embodiment;

FIG. 18 is a timing chart showing the change of the verify level according to the second embodiment;

FIG. 20 is a conceptual diagram of an offset table according to the second embodiment;

FIG. 22 is a sectional view of a block according to the second embodiment;

FIG. 23 is a conceptual diagram of an offset table according to the second embodiment;

FIG. 25 is a graph showing the relation between word line addresses and sensitivity coefficients according to a third embodiment;

FIG. 26 is a sectional view of a NAND string;

FIG. 28 is a sectional view of a NAND string according to the third embodiment;

FIG. 29 to FIG. 31 are graphs showing the relation between word line addresses and sensitivity coefficients according to the third embodiment;

FIG. 32 is a circuit diagram of a sense circuit according to a fourth embodiment;

FIG. 34 is a timing chart in verification according to the fourth embodiment;

FIG. 35 to FIG. 39 are conceptual diagrams of an offset table of first to fifth write methods according to the fourth embodiment;

FIG. 40 is a block diagram of a semiconductor memory device according to the fourth embodiment;

FIG. 42 is a timing chart of various signals in verification according to the fourth embodiment;

FIG. 44 is a sectional view of a semiconductor memory device according to a fifth embodiment;

FIG. 45 is a circuit diagram of blocks according to the fifth embodiment;

FIG. 47 and FIG. 48 are a sectional view and a circuit diagram of the memory cell array according to the first modification of the fifth embodiment;

FIG. 49 is a sectional view of a memory cell array according to a second modification of the fifth embodiment;

FIG. 50 is a graph showing the relation between word line addresses and sensitivity coefficients according to the second modification of the fifth embodiment;

FIG. 51 to FIG. 53 are a circuit diagram, a perspective view, and a plan view of a memory cell array according to a sixth embodiment;

FIG. 54 to FIG. 56 are sectional views taken along the line 54-54, line 55-55, and line 56-56 in FIG. 53;

FIG. 57 is a flowchart of a write operation according to the sixth embodiment;

FIG. 58 is a circuit diagram of the memory cell array in verification according to the sixth embodiment;

FIG. 60 to FIG. 63 are plan views of a memory unit according to the sixth embodiment;

FIG. 64 and FIG. 65 are a perspective view and a plan view of the memory cell array according to the seventh embodiment; and FIG. 66 and FIG. 67 are sectional views taken along the line 66-66 and the line 67-67 in FIG. 65.

DETAILED DESCRIPTION

Figure 2:
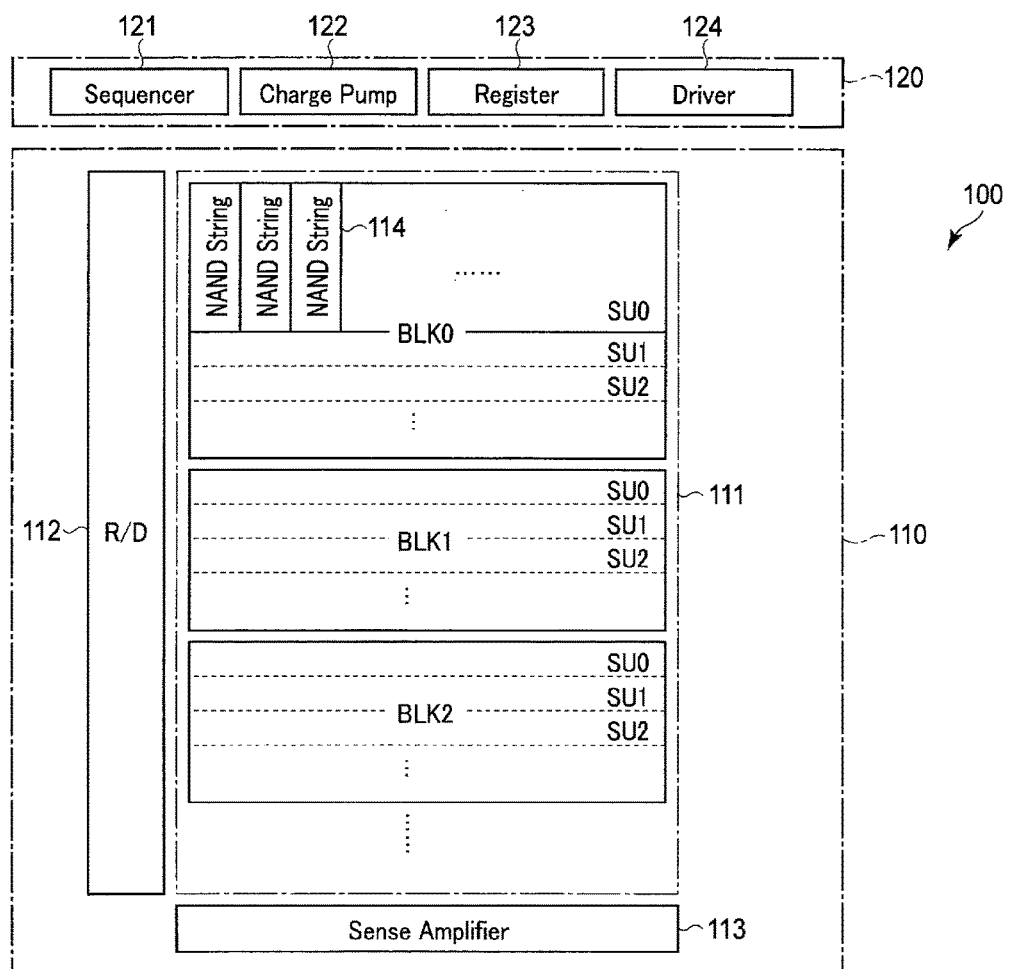
FIG. 2 is a block diagram of a semiconductor memory device according to the first embodiment.

In general, according to one embodiment, a semiconductor memory device includes a plurality of memory cells, and includes: a first page associated with a first memory cell; a second page associated with a second memory cell; a third page associated with a third memory cell; and a row decoder configured to apply voltages to gates of the first to third memory cells. In writing of data, data is written into the first page before data is written into the second page. A data write operation includes a program operation and a program verify operation. The row decoder is configured to apply a first verify voltage to the gate of the first memory cell in the program verify operation for the first page. The row decoder is configured to apply a second verify voltage different from the first verify voltage to the gate of the second memory cell in the program verify operation for the second page. The row decoder is configured to apply a third verify voltage different from the first and second verify voltages to the gate of the third memory cell in the program verify operation for the third page. The second verify voltage is a value which is shifted from the first verify voltage by at least a first coefficient. The third verify voltage is a value which is shifted from the first verify voltage by at least a second coefficient different from the first coefficient.

1. First Embodiment

A semiconductor memory device according to the first embodiment is described. A three-dimensionally stacked NAND flash memory in which memory cells are stacked above a semiconductor substrate is described below as an example.

1.1 Regarding Configuration 1.1.1 Regarding Configuration of Memory System

First, the configuration of a memory system including the semiconductor memory device according to the present embodiment is described with reference to FIG. 1. FIG. 1 is a block diagram of the memory system according to the present embodiment.

As shown, a memory system 1 includes a NAND flash memory 100 and a controller 200. The controller 200 and the memory 100 may be, for example, embedded into one semiconductor device, examples of which include a memory card such as an SD™ card, and a solid state drive (SSD).

The memory 100 includes memory cells, and stores data in a nonvolatile manner. Details of the configuration of the NAND-type flash memory 100 will be described later.

The controller 200 instructs the memory 100 to, for example, read, write, or erase in response to an instruction from an external host device. The controller 200 also manages a memory space in the memory 100.

The controller 200 includes a host interface circuit 210, an internal memory (RAM) 220, a processor (CPU) 230, a buffer memory 240, a NAND interface circuit 250, and an ECC circuit 260.

The host interface circuit 210 is connected to the host device via a controller bus, and controls communication with the host device. The host interface circuit 210 transfers the instruction and data received from the host device to the CPU 230 and the buffer memory 240, respectively. In response to an instruction from the CPU 230, the host interface circuit 210 transfers the data in the buffer memory 240 to the host device.

The NAND interface circuit 250 is connected to the memory 100 via a NAND bus, and controls communication with the memory 100. The NAND interface circuit 250 then transfers the instruction received from the CPU 230 to the memory 100, and in writing, transfers write data in the buffer memory 240 to the memory 100. Moreover, in reading, the NAND interface circuit 250 transfers, to the buffer memory 240, the data read from the memory 100.

The CPU 230 controls the overall operation of the controller 200. For example, in response to a write instruction from the host device, the CPU 230 issues a write instruction based on an NAND interface. The same also applies to reading and erasing. The CPU 230 also executes various processing for managing the memory 100 such as wear leveling. Moreover, the CPU 230 performs various calculations. For example, the CPU 230 performs data encryption processing and randomizing processing.

The ECC circuit 260 performs error checking and correcting (ECC) processing for data. That is, the ECC circuit 260 generates a parity on the basis of write data in data writing, and in reading, generates a syndrome from the parity to detect an error and corrects this error. The CPU 230 may have the function of the ECC circuit 260.

The embedded memory 220 is a semiconductor memory such as a DRAM, and is used as a working area for the CPU 230. The memory 220 holds firmware for managing the memory 100, and various management tables. The memory 220 according to the present embodiment holds an offset table. The offset table holds information about an offset of a verify voltage used during later-described program verification of data. The offset table is described in detail in the following sections 1.3.

1.1.2 Regarding Configuration of Semiconductor Memory Device

Next, the configuration of the semiconductor memory device 100 is described.

1.1.2.1 Regarding Overall Configuration of Semiconductor Memory Device

FIG. 2 is a block diagram of the NAND flash memory 100 according to the present embodiment. As shown, the memory 100 roughly includes a core unit 110 and a peripheral circuit 120.

The core unit 110 includes a memory cell array 111, a row decoder 112, and a sense amplifier 113.

The memory cell array 111 includes multiple (three in the example of FIG. 2) blocks BLK (BLK0, BLK1, BLK2, . . . ) including a set of nonvolatile memory cells each associated with a word line and a bit line. The block BLK corresponds to a data erase unit, and the data in the same block BLK is erased simultaneously. Each of the blocks BLK includes a plurality of string units SU (SU0, SU1, SU2, . . . ) that is a set of NAND strings 114 in which memory cells are connected in series. The number of blocks in the memory cell array 111 and the number of string units in one block BLK may be any numbers.

The row decoder 112 decodes a block address and a page address, and selects one of the word lines in the corresponding block. The row decoder 112 then applies appropriate voltages to the selected word line and unselected word lines.

In reading of data, the sense amplifier 113 senses and amplifies data read onto a bit line from the memory cells. In writing of data, the sense amplifier 113 transfers write data to the memory cells. Data is read or written in the memory cell array 111 in a unit of a plurality of memory cells, and this unit corresponds to a page.

The peripheral circuit 120 includes a sequencer 121, a charge pump 122, a register 123, and a driver 124.

The driver 124 supplies voltages necessary for writing, reading, and erasing of data to the row decoder 112, the sense amplifier 113, and an unshown source line driver. These voltages are applied to the memory cells (word lines, selection gate lines, back gate lines, bit lines, and source lines which will be described later) by the row decoder 112, the sense amplifier 113, and the source line driver.

The charge pump 122 steps up an externally supplied power supply voltage to supply a necessary voltage to the driver 124.

The register 123 holds various signals. For example, the register 123 holds the status of a data writing or erasing operation, and thereby informs the controller of whether the operation has been normally completed. Alternatively, the register 123 can also hold various tables.

The sequencer 121 controls the operation of the memory 100.

1.1.2.2 Regarding Memory Cell Array 111

Next, details of the configuration of the above memory cell array 111 are described. FIG. 3 is a circuit diagram of the block BLK0. The other blocks BLK also have similar configurations.

As shown, the block BLK0 includes, for example, four string units SU (SU0 to SU3). Each of the string units SU includes a plurality of NAND strings 114.

Each of the NAND strings 114 includes, for example, 8 memory cell transistors MT (MT0 to MT7), selection transistors ST1 and ST2, and a back gate transistor BT. The memory cell transistor MT includes a stack gate including a control gate and a charge storage layer, and holds data in a nonvolatile manner. The number of the memory cell transistors MT is not limited to 8, but may be 16, 32, 64, 128, or the like; the number of the memory cell transistors MT is not limited. The back gate transistor BT also includes a stacked gate including a control gate and a charge storage layer, as in the memory cell transistor MT. However, the back gate transistor BT does not hold data, and functions as a mere current path in writing, reading, and erasing of data. The memory cell transistors MT and the back gate transistor BT are arranged between the selection transistors ST1 and ST2 so that their current paths are connected in series. The back gate transistor BT is provided between the memory cell transistors MT3 and MT4. The current path of the memory cell transistor MT7 at one end of the series connection is connected to one end of the current path of the selection transistor ST1, and the current path of the memory cell transistor MT0 at the other end is connected to one end of the current path of the selection transistor ST2.

The gates of the selection transistors ST1 of the string units SU0 to SU3 are respectively connected in common to selection gate lines SGD0 to SGD3, and the gates of the selection transistors ST2 of the string units SU0 to SU3 are respectively connected in common to selection gate lines SGS0 to SGS3. In contrast, the control gates of the memory cell transistors MT0 to MT7 within the same block BLK0 are respectively connected in common to word lines WL0 to WL7, and the control gate of the back gate transistor BT is connected in common to back gate lines BG (BG0 to BG2 in the blocks BLK0 to BLK2).

That is, the memory cell transistors MT and the back gate transistors BT in the plurality of string units SU0 to SU3 in the same block BLK are connected to the same word lines WL0 to WL7 and the same back gate line BG, whereas, even in the same block BLK, the independent selection gate lines SGD and SGS are provided for the string units SU0 to SU3, respectively.

Furthermore, for the NAND strings 114 arranged in a matrix in the memory cell array 111, the other ends of the current paths of the selection transistors ST1 of the NAND strings 114 are connected in common to one of the bit lines BL (BL0 to BL(L−1), (L−1) are natural numbers equal to or more than 1). That is, the bit line BL connects the NAND strings 114 in common over the blocks BLK. The other ends of the current paths of the selection transistors ST2 are connected in common to a source line SL. The source line SL connects the NAND strings 114 in common over the blocks.

As described above, data in the memory cell transistors MT in the same block BLK are collectively erased. In contrast, data are collectively read and written in the memory cell transistors MT connected in common to one of the word lines WL in one of string units SU of one of the blocks BLK. This unit is referred to as a "page".

The memory cell array 111 may have another configuration. That is, the configuration of the memory cell array 111 is described in, for example, U.S. patent application Ser. No. 12/407,403 entitled "Three-dimensional Stacked Nonvolatile Semiconductor Memory" filed on Mar. 19, 2009, the entire contents of which is hereby incorporated by reference. The configuration of the memory cell array 111 is also described in U.S. patent application Ser. No. 12/406,524 entitled "Three-dimensional Stacked Nonvolatile Semiconductor Memory" filed on Mar. 18, 2009, the entire contents of which is hereby incorporated by reference. The configuration of the memory cell array 111 is also described in U.S. patent application Ser. No. 12/679,991 entitled "Non-volatile Semiconductor Storage Device and Method of Manufacturing the Same" filed on Mar. 25, 2010, the entire contents of which is hereby incorporated by reference. The configuration of the memory cell array 111 is also described in U.S. patent application Ser. No. 12/532,030 entitled "Semiconductor Memory and Method for Manufacturing Same" filed on Mar. 23, 2009, the entire contents of which is hereby incorporated by reference.

Figure 4:
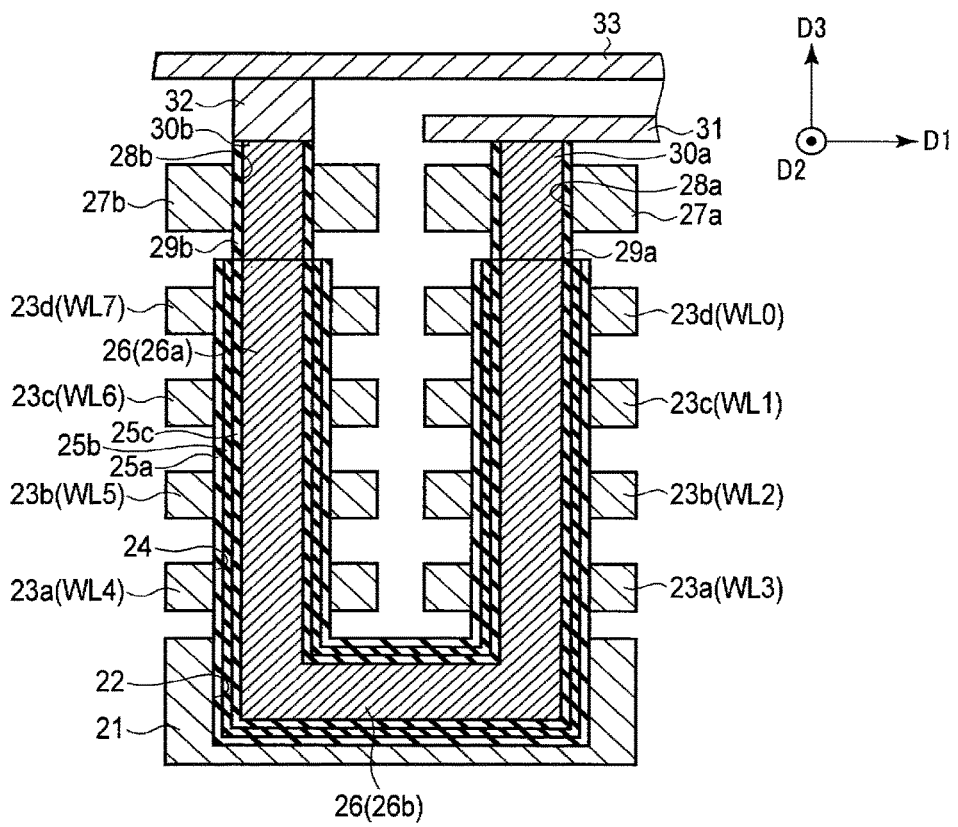

One configuration example of the memory cell array 111 is briefly described with reference to FIG. 4. FIG. 4 is a sectional view of the NAND string 114. A plurality of structures shown in FIG. 4 are arrayed in the depth direction (D2) of the sheet showing FIG. 4, and share the word lines WL, the selection gate lines SGD and SGS, and the back gate line BG to form one string unit SU.

A peripheral circuit such as the sense amplifier 113 is formed on a semiconductor substrate, and the memory cell array 111 is formed above the peripheral circuit. That is, as shown in FIG. 4, an electrically conductive layer (e.g. polycrystalline silicon layer) 21 which functions as the back gate line BG is formed above the semiconductor substrate. Electrically conductive layers (e.g. polycrystalline silicon layers) 23a to 23d which function as the word lines WL are further formed on the electrically conductive layer 21. Electrically conductive layers (e.g. polycrystalline silicon layers) 27a and 27b which function as the selection gate lines SGS and SGD are further formed on the conductive layer 23d.

A memory hole 22 is made through the conductive layers 27a, 27b, and 23a to 23d. A block insulating film 25a, a charge storage layer (insulating film) 25b, and a gate insulating film 25c are sequentially formed on the side surface of the memory hole 22, and an electrically conductive layer 26 fills the memory hole 22. The conductive layer 26 functions as the current path of the NAND string 114, and is a region in which a channel is formed during the memory cell transistor MT turned on.

Furthermore, electrically conductive layers 30a and 30b are formed on the conductive layer 26. A source line layer 31 is formed on the conductive layer 30a, and a bit line layer 33 is formed on the conductive layer 30b via an electrically conductive layer 32.

1.1.2.3 Regarding Threshold Distribution of Memory Cell Transistor

Figure 5:
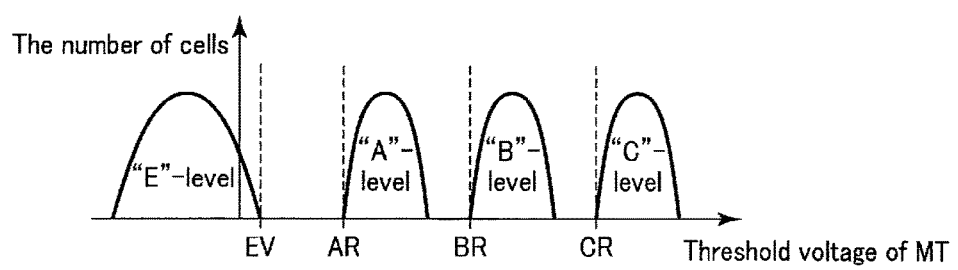
FIG. 5 is a graph showing the threshold distribution of memory cells according to the first embodiment.

FIG. 5 shows the threshold distribution that can be taken by the memory cell transistor MT according to the present embodiment. As shown in FIG. 5, the memory cell transistor MT can hold, for example, 2-bit data in accordance with its threshold. The 2-bit data correspond to, for example, an "E"-level, an "A"-level, a "B"-level, and a "C"-level in ascending order of threshold.

The "E"-level is a threshold in the state in which data are erased, and has, for example, a negative value (or may have a positive value) and is lower than a verify voltage EV. The "A"- to "C"-levels are thresholds in the state in which the charge storage layer is charged. The "A"-level has a threshold which is higher than a read level "AR" and lower than a read level "BR". The "B"-level has a threshold which is higher than a read level "BR" and lower than a read level "CR". The "C"-level has a threshold which is higher than the read level "CR".

Thus, by taking the four threshold levels, each of the memory cell transistors MT can store 2-bit data (4-level data).

1.2 Regarding Data Write Operation

Next, the data write operation according to the present embodiment is described with reference to FIG. 6. FIG. 6 is a flowchart of a write operation according to the present embodiment. The write operation roughly includes a program operation to charge the charge storage layer to raise the threshold, and a program verify operation to check the change of the threshold distribution as the result of the program operation. The processing shown in FIG. 6 is performed under the control of the sequencer 121.

As shown, the NAND flash memory 100 first loads data from the controller 200, and the data is held in the sense amplifier 113 (step S10).

In response to an instruction from the sequencer 121, the row decoder 112 then applies a voltage to the word lines WL, and the sense amplifier 113 applies a voltage to the bit lines BL, so that the data loaded in step S10 is programmed in the memory cell transistors page by page (step S11).

In response to an instruction from the sequencer 121, the charge pump 122 then sets and generates a verify voltage Vpvfy in accordance with page address and the writing order (step S12). The row decoder 112 then applies the verify voltage Vpvfy to the selected word line WL to perform a program verification (step S13). That is, the sense amplifier 113 reads data from the selected page in accordance with an instruction from the sequencer 121. The sequencer 121 then checks on the basis of the read data whether the threshold of the memory cell transistor MT has increased to a desired value. Hereinafter, it will be referred to as having "passed" the verification when the threshold has increased to the desired value, and it will be referred to as having "failed" the verification when the threshold has not increased to the desired value.

If all the bits in the selected page passed the verification (step S14, YES), the write operation in this page is finished. In contrast, if any of the bits failed the verification (step S14, NO), that is, if there is any bit in which writing has not been finished, the sequencer 121 returns to step S11, and again performs the program. In this instance, for example, the charge pump 122 shifts the verify voltage Vpvfy in accordance with the page address and the writing order under the instruction from the sequencer 121. That is, the charge pump 122 updates the verify voltage Vpvfy to (Vpvfy+ΔVx).

If all bits passed the verification in step S14 (step S14, YES), the sequencer 121 executes programming in the next page (step S15, NO). If the programming in all the pages is finished (step S15, YES), the write operation is completed.

Figure 7:
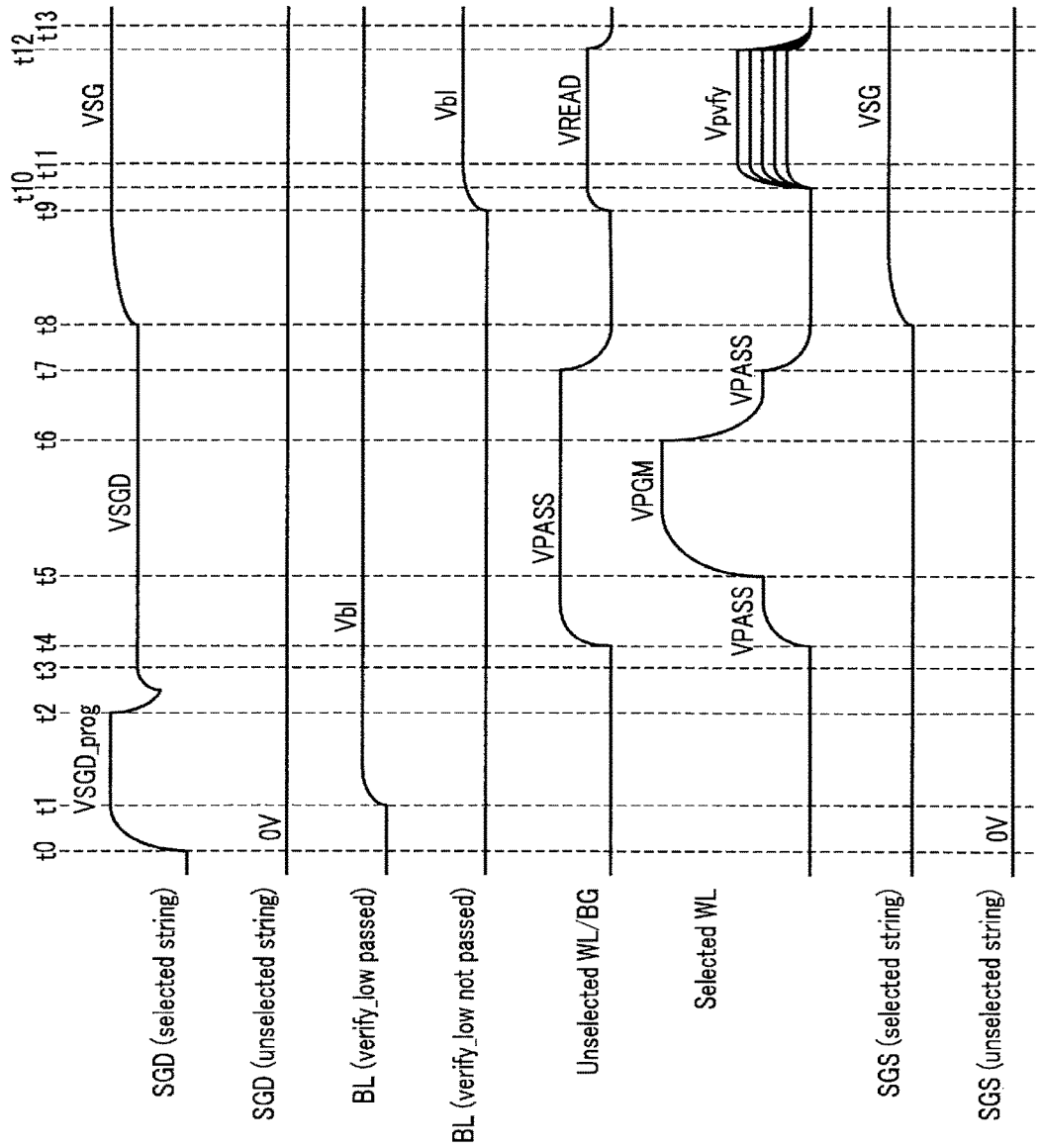
FIG. 7 is a timing chart of various signals in the write operation according to the first embodiment.

FIG. 7 is a timing chart showing potential changes of the signals on various signal line in data writing.

First, a program operation is performed. That is, at a time t0, an "H"-level (VSGD_prog) is applied to the selection gate line SGD in the selected string unit SU, and the selection transistor ST1 is turned on. The selection gate line SGS is set to an "L"-level (e.g. 0 V), and the selection transistor ST2 is turned off.

The sense amplifier 113 applies an "L"-level (e.g. 0 V) to the bit lines BL which have not passed the verification, and applies an "H"-level (Vbl) to the bit lines BL which have already passed the verification (time t1).

The row decoder 112 then decreases the potential of the selection gate line SGD to VSGD (time t3). The voltage VSGD is a voltage which turns on the selection transistor ST1 corresponding to the bit line BL that is provided with the "L"-level but which turns off the selection transistor ST2 corresponding to the bit line BL that is provided with the "H"-level. As a result, the bit lines BL which have already passed the verification are electrically floating.

The row decoder 112 applies a voltage VPASS to the selected word line, the unselected word lines, and the back gate line BG (time t4), and then increases the potential of the selected word line to a program voltage VPGM. The voltage VPASS is a voltage which turns on the memory cell transistor MT regardless of held data, and the program voltage is a voltage which serves to charge the charge storage layer by FN tunneling and which is higher than VPASS.

Data is programmed in the memory cell transistor MT by the application of the program voltage VPGM. The row decoder 112 then sets the potentials of all the word lines WL to 0 V to finish the program operation.

The sequencer 121 then performs the program verify operation. That is, the row decoder 112 applies an "H"-level (e.g. VSG) to the selection gate lines SGD and SGS in the selected string unit SU (time t8). The voltage VSG turns on the selection transistors ST1 and ST2.

The row decoder 112 then applies the verify voltage Vpvfy to the selected word line, and a voltage VREAD to the unselected word lines. The verify voltage Vpvfy corresponds to the program data, and the voltage VREAD turns on the memory cell transistor MT regardless of held data.

The sense amplifier 113 senses and amplifies the data read onto the bit lines BL. In accordance with the reading result, the sequencer 121 judges whether the programming in the selected page has been completed (i.e. whether the bit lines BL have passed the verification). If the programming has not been completed, the program operation for the selected page is repeated.

As described above, the row decoder 112 controls the verify voltage Vpvfy in accordance with the page address and the writing order. More specifically, the verify voltage Vpvfy is increased along with the advance of the page address on the basis of an offset table.

1.3 Regarding Verify Voltage

Next, the verify voltage Vpvfy is described. The verify voltage Vpvfy is determined by, for example, the offset table stored in the internal memory 220 of the controller 200. An offset amount in this offset table is determined on the basis of a verification target page and a page writing order in the block BLK.

Figure 8:
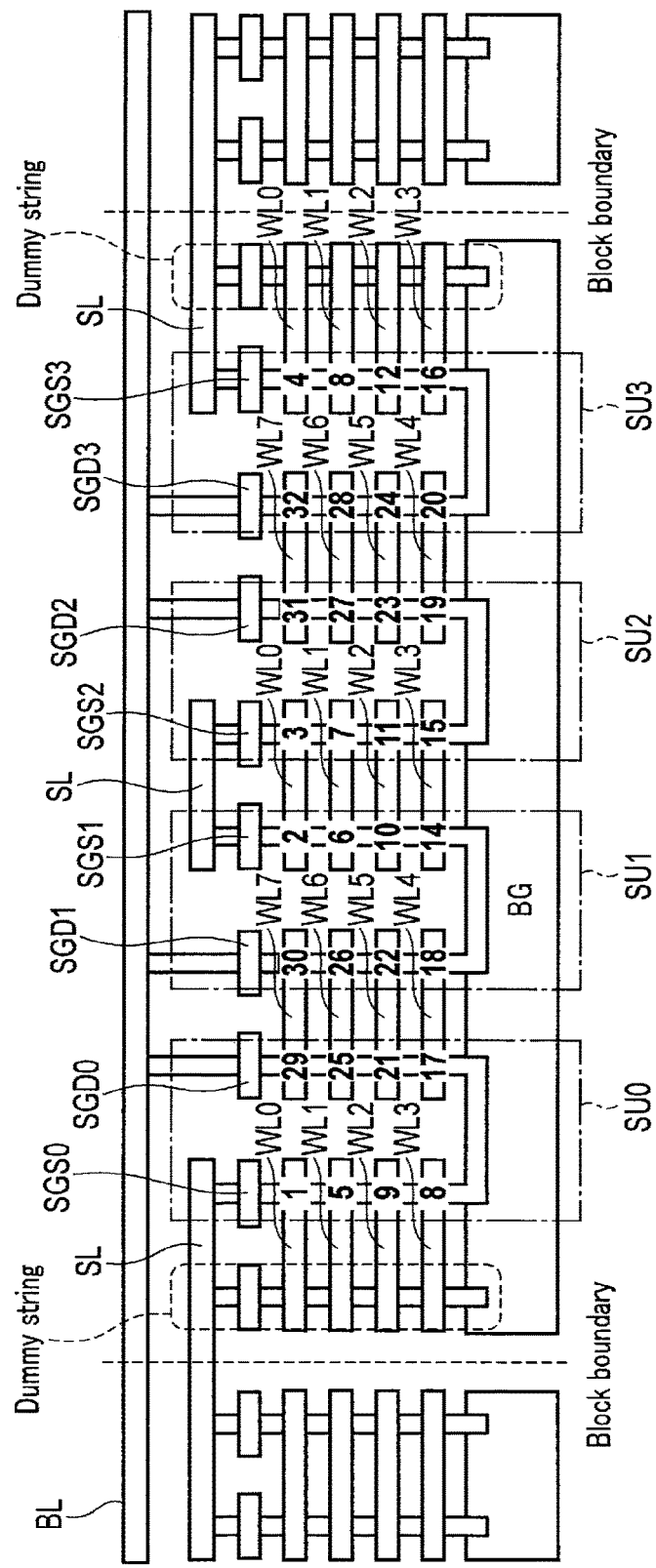
FIG. 8 is a sectional view of a block according to the first embodiment.

First, the writing order according to the present embodiment is described with reference to FIG. 8. FIG. 8 is a sectional view of one of the blocks BLK along the bit line direction. A plurality of the configurations shown in FIG. 8 is arrayed in the depth direction of the sheet showing FIG. 8, and the arrayed configurations form one block BLK. Numbers in boldface in the drawing indicate the page-by-page writing order.

As shown, according to the present embodiment, one of the word lines WL is first selected, and while this word line WL is being selected, the string units SU0 to SU3 are sequentially selected. The next word line WL is then selected, and while this word line WL is being selected, the string units SU0 to SU3 are sequentially selected in a similar manner.

More specifically, if the word line WL0 is selected, the selection gate line SGD0 is selected, so that the memory cell transistor MT0 in the string unit SU0 is programmed. While the word line WL0 is being selected, the selection gate line SGD1 is then selected, so that the memory cell transistor MT0 in the string unit SU1 is programmed. The selection gate lines SGD2 and SGD3 are then sequentially selected in a similar manner. After the memory cell transistor MT0 in the string unit SU3 is programmed, SGD0 to SGD3 are then sequentially selected while the word line WL1 is being selected. After the memory cell transistor MT1 in the string unit SU3 is programmed, SGD0 to SGD3 are then sequentially selected while the word line WL2 is being selected. After this, selections are made in a similar manner up to the word line WL7. A page address is allocated to each page in accordance with the above-mentioned writing order. Therefore, in the block BLK shown in FIG. 8, an initial page address PG1 is allocated to the word line WL0 of the string unit SU0, and a second page address PG2 is then allocated to the word line WL0 of the string unit SU1, and a final page address PG32 is finally allocated to the word line WL7 of the string unit SU3.

FIG. 9 is a conceptual diagram of the offset table according to the present embodiment. As shown, the offset table holds information regarding an offset amount for a certain initial verify voltage Vinit for each of the word lines WL and each of the string units SU. In the diagram, sections in which "USEL VPGM" is written indicate program disturbance caused by the program voltage VPGM when the string unit SU is not selected, and sections in which "SEL/USEL VPASS" is written indicate program disturbance caused by the voltage VPASS when the string unit SU is selected or not selected. $\Delta V1$ indicates a shift amount of the threshold attributed to the program disturbance caused by the program voltage VPGM in the unselected state. $\Delta V2$ indicates a shift amount of the threshold attributed to the program disturbance caused by the program voltage VPGM in the selected state or the unselected state. Moreover, $\alpha$ indicates a coefficient of sensitivity to stress resulting from VPGM, and $\beta$ indicates a coefficient of sensitivity to stress resulting from VPASS. When the values of $\alpha$ and $\beta$ are higher, the threshold is more apt to vary due to VPGM and VPASS. Boldfaced type numbers in FIG. 9 indicate the selection order of the pages in a certain block BLK. The verify voltage Vpvfy is then set to a value in which the value in each section is added to an initial verify voltage Vinit.

Figure 10:
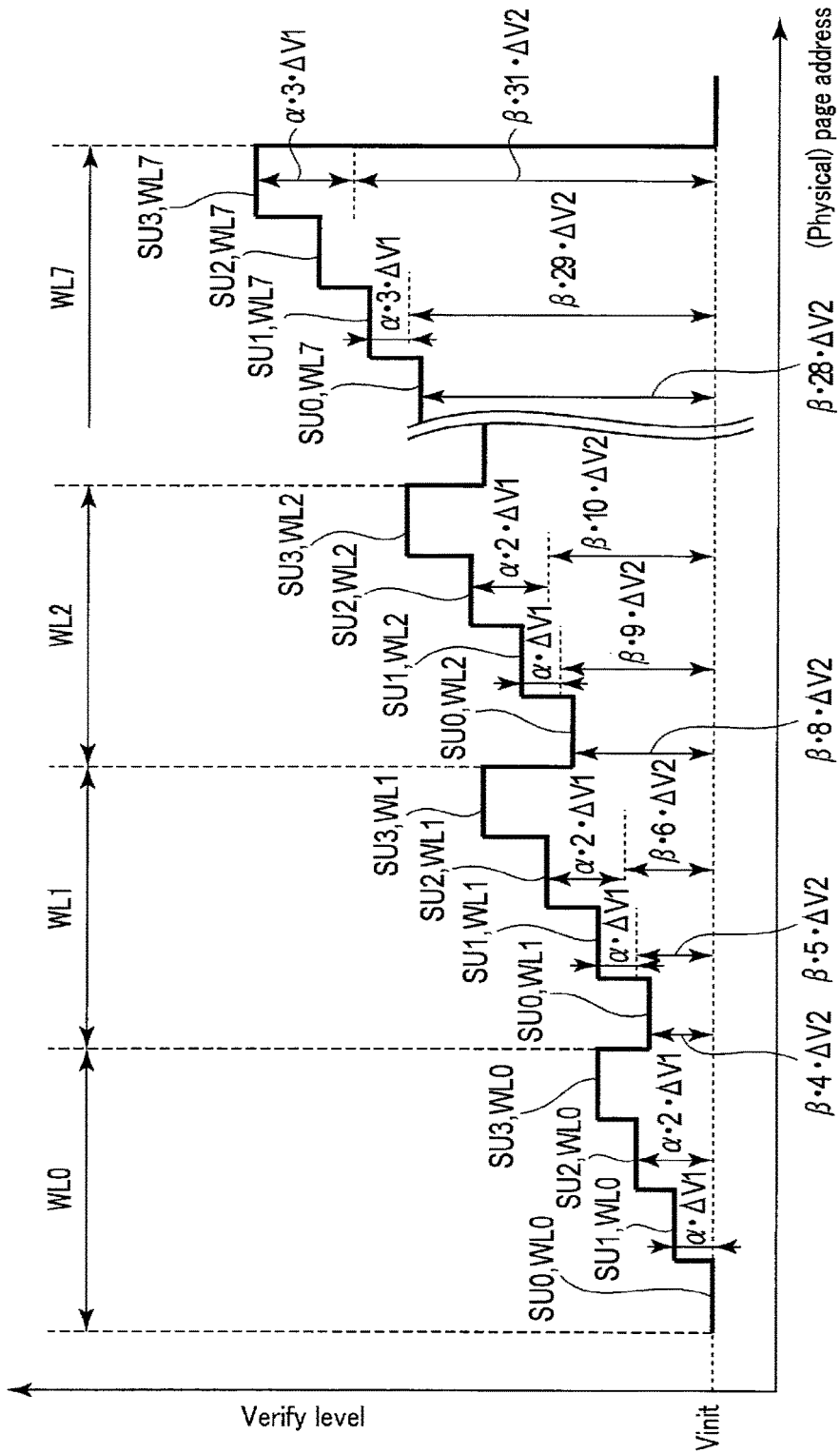
FIG. 10 is a timing chart showing the change of a verify level according to the first embodiment.

The change of the verify voltage Vpvfy is described with reference to FIG. 9 and FIG. 10. FIG. 10 is a timing chart showing the change of the verify voltage Vpvfy during the writing of data from the initial page address PG1 (the word line WL0 of the string unit SU0) to the final page address PG32 (the word line WL7 of the string unit SU3) in FIG. 8.

As shown, when data is written into the initial page address PG1, the verify voltage Vpvfy is set to the initial verify voltage Vinit which is applied to the selected word line by the row decoder 112. When data is written into the next page address PG2, the verify voltage Vpvfy is stepped up by $\alpha \cdot 1 \cdot \Delta V1$ in accordance with the offset table shown in FIG. 9. That is, Vpvfy=(Vinit+$\alpha \cdot 1 \cdot \Delta V1$). In a similar manner, when data is written into the next page address PG3, Vpvfy=(Vinit+$\alpha \cdot 2 \cdot \Delta V1$). When data is written into the next page address PG4, Vpvfy=(Vinit+$\alpha \cdot 3 \cdot \Delta V1$). In this way, the verify voltage Vpvfy is sequentially stepped up. The four page addresses PG1 to PG4 so far are the pages that are all allocated to the same word line WL1.

Pages into which data are written next are pages PG5 to PG8 allocated to the word line WL1. Therefore, the verify voltage Vpvfy is stepped down in accordance with the offset table, so that Vpvfy=(Vinit+$\beta \cdot 4 \cdot \Delta V2$). After this, Vpvfy is stepped up along with the increase of the page addresses. That is, Vpvfy=(Vinit+$\alpha \cdot 1 \cdot \Delta V1$+$\beta \cdot 5 \cdot \Delta V2$) when data is written into the next page address PG6, Vpvfy=(Vinit+$\alpha \cdot 2 \cdot \Delta V1$+$\beta \cdot 6 \cdot \Delta V2$) when data is written into the next page address PG7, and Vpvfy=(Vinit+$\alpha \cdot 3 \cdot \Delta V1$+$\beta \cdot 7 \cdot \Delta V2$) when data is written into the next page address PG8.

After this, data is written in a similar manner up to the final page address PG32.

1.4 Advantageous Effects According to the Present Embodiment

According to the present embodiment, it is possible to improve the operational reliability of the semiconductor memory device. The present advantageous effects are described below.

In a three-dimensionally stacked NAND flash memory, a block size is larger than in a planar NAND flash memory in which memory cells are two-dimensionally arrayed on a semiconductor substrate. Therefore, in the three-dimensionally stacked NAND flash memory, the number of times that a page to which the data has already written is subjected to the program disturbance is much greater than in the planar NAND flash memory. Thus, even if an incremental step pulse programming (ISPP) is performed, the threshold distribution after the end of the write operation varies from page to page, and the bit error rate might increase.

Figure 11:
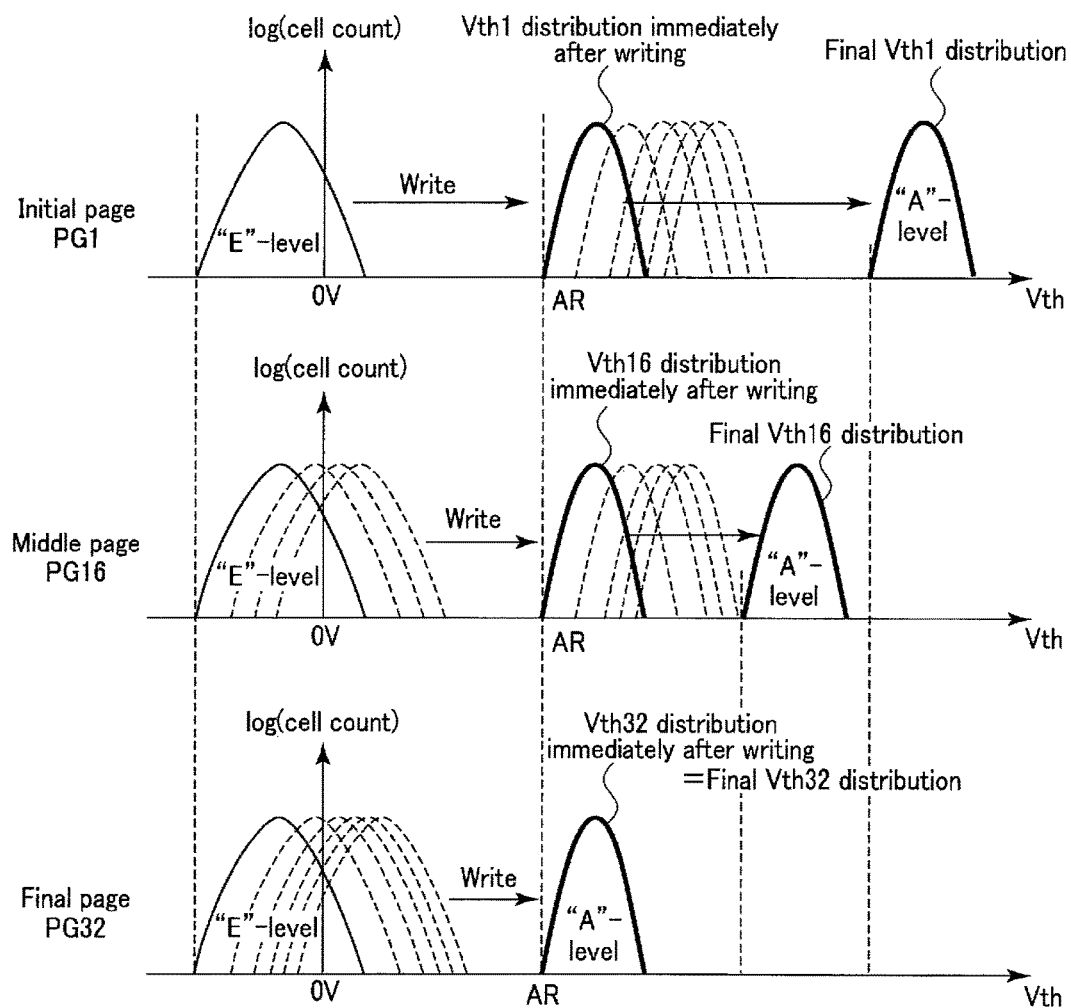
FIG. 11 is a graph showing the changes of the threshold distributions of the memory cells.

This situation is described with reference to FIG. 11. FIG. 11 is a graph showing the changes of the threshold distributions of the memory cell transistor MT in the case in which the "A"-level is written from an erase level by applying a general data write method in, for example, the NAND flash memory shown in FIG. 8. FIG. 11 shows the initial page PG1 (the word line WL0 of the string unit SU0), the middle page PG16 (the word line WL3 of the string unit SU3), and the final page PG32 (the word line WL7 of the string unit SU3).

As shown, data is first programmed in the initial page PG1. In this instance, the verify level (verify voltage) is set to "AR", and the thresholds immediately after writing are distributed within a given range in which "AR" is the minimum value. This also holds true with the middle page PG16 and the final page PG32.

However, after writing, the memory cell transistor MT in the initial page PG1 is subjected to stress by the subsequent write operations for the pages PG2 to PG32. More specifically, the memory cell transistor MT in the initial page PG1 is subjected to disturbance caused by VPGM during writing in the pages PG2 to PG4, and is subjected to disturbance caused by VPASS during writing in the pages PG5 to PG32. This disturbance increases the threshold of the initial page PG1 to a "final Vth1 distribution" in FIG. 11.

In contrast, after writing, the memory cell transistor MT in the middle page PG16 is subjected to stress by the subsequent write operations for the pages PG17 to PG32. However, the memory cell transistor MT in the middle page PG16 is not affected by writing in the pages PG1 to PG16 (the erase level before writing is affected, and the threshold shift of the erase level disappears due to the subsequent writing). Therefore, the amount of disturbance to which the middle page PG16 is subjected is nearly half of that of the initial page PG1, and the final threshold of the page PG16 is a value lower than that of the page PG1.

Furthermore, the final page PG32 is viewed. Writing in the pages PG1 to PG31 has been already finished at the time of writing in the page PG32, so that the page PG32 is not subjected to the program disturbance in the other pages.

As described above, the threshold distribution of the memory cell transistor MT greatly varies depending on the number of times that the memory cell transistor MT is subjected to the program disturbance, and reliability in data writing might deteriorate.

In this respect, according to the present embodiment, the above problems can be solved by the use of the offset table. That is, according to the present embodiment, in view of the fact that the thresholds of the memory cell transistors having smaller page addresses shift more in a positive direction as shown in FIG. 11, the verify level is set to the value to which the shift amount has been added in advance.

Figure 12:
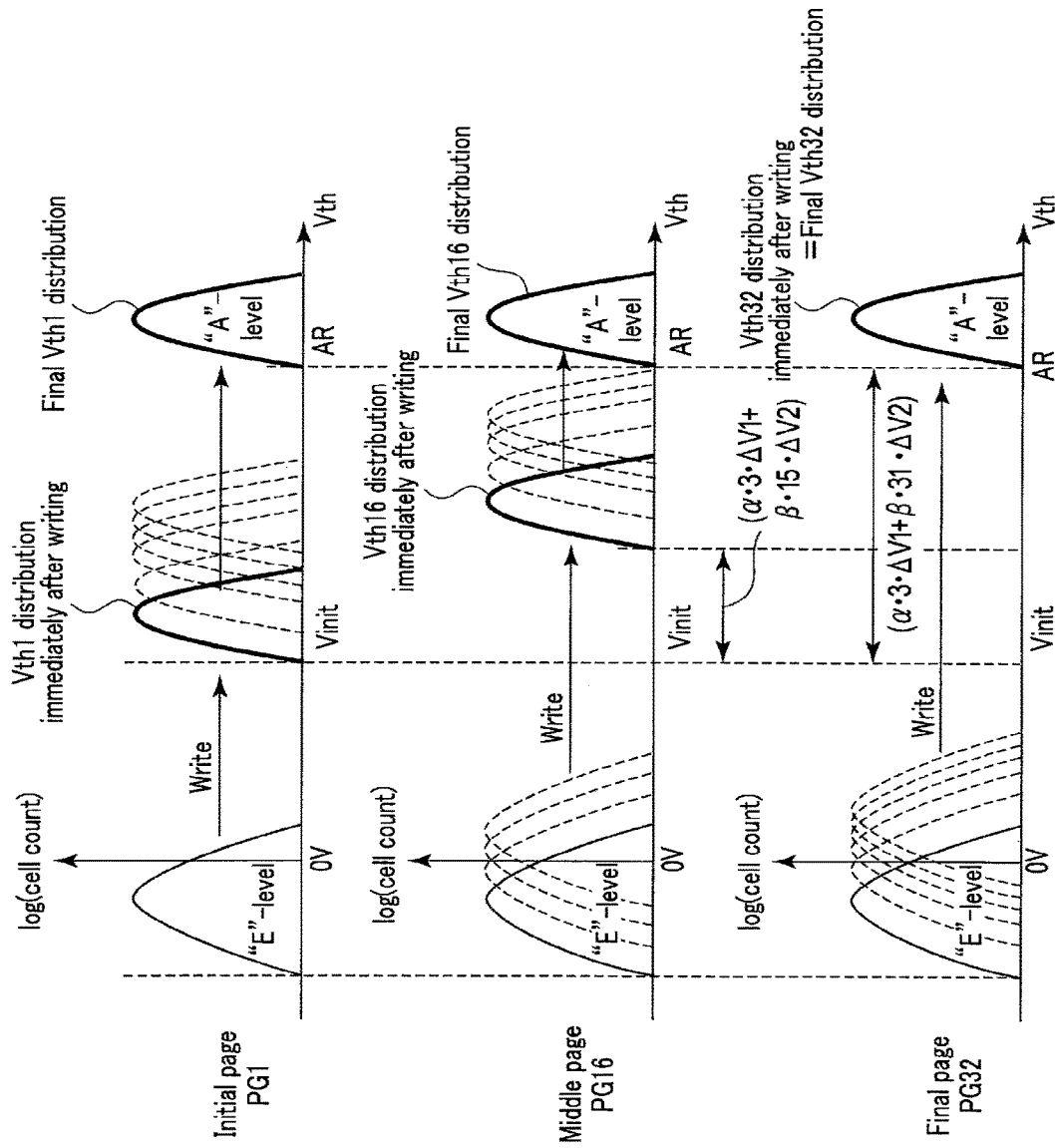
FIG. 12 is a graph showing the changes of the threshold distributions of the memory cells according to the first embodiment.

This situation is shown in FIG. 12. FIG. 12 is a graph showing, as in FIG. 11, the changes of the threshold distributions of the memory cell transistors MT in the NAND flash memory shown in FIG. 8.

As shown, suppose that an ideal lower limit value in the threshold distribution of the "A"-level is "AR". According to the present embodiment, the verify level is set to the initial value Vinit at the time of writing in the initial page PG1. This initial value corresponds to the threshold shift amount of the page PG1 described with reference to FIG. 11. That is, the threshold distribution immediately after writing in the initial page PG1 is set to be much lower than the desired value "AR" as shown in FIG. 12, and is, more specifically, ("AR"−($\alpha \cdot 3 \cdot \Delta V1 + \beta \cdot 31 \cdot \Delta V2$)).

The threshold distribution of the page PG1 shifts to a desired distribution due to the program disturbance caused during the subsequent writing in the pages PG2 to PG32.

This also holds true with the other pages PG2 to PG32. For example, in the case of the middle page PG16, the verify level is set to be lower than "AR" by ($\alpha \cdot 3 \cdot \Delta V1 + \beta \cdot 15 \cdot \Delta V2$). The threshold distribution of the page PG16 then shifts to a desired distribution due to the program disturbance caused during writing in the pages PG17 to PG32.

For the final page PG32, the verify level is set to Vinit+ ($\alpha \cdot 3 \cdot \Delta V1 + \beta \cdot 31 \cdot \Delta V2$), and this value is equal to "AR". The verify level is set to this value because the final page PG32 is not affected by the program disturbance during writing in the other pages PG1 to PG31.

Thus, according to the present embodiment, the shift of the threshold distribution resulting from the program disturbance is predicted, and the verify level is set to the corresponding value. It is therefore possible to reduce the page-to-page variation of the threshold distribution after the completion of the write operation, and improve the operational reliability in data writing.

2. Second Embodiment

Next, a semiconductor memory device according to the second embodiment is described. The present embodiment concerns several variations of the writing order of the pages in a block in the first embodiment described above. The differences between the first embodiment and the second embodiment are only described below. The writing order described in the first embodiment with reference to FIG. 8 is referred to as a "first write method", and the four second to fifth write methods are described in the present embodiment.

2.1 Second Write Method

Figure 13:
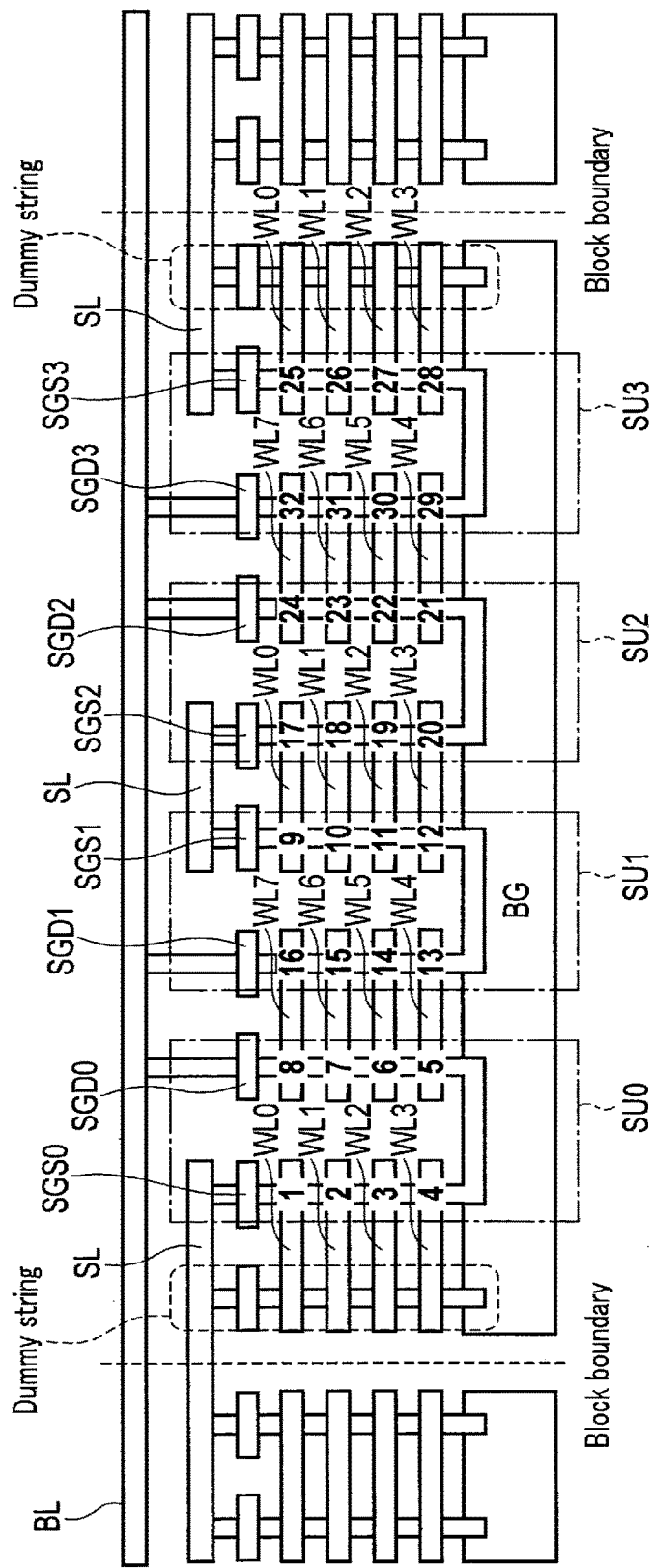
FIG. 13 is a sectional view of a block according to a second embodiment.

First, the second write method is described with reference to FIG. 13. FIG. 13 is a sectional view of a certain block BLK along the bit line direction, and corresponds to FIG. 8 described in the first embodiment.

As shown, according to the present embodiment, one of the string units SU is first selected, and the word lines WL0 to WL7 are sequentially selected in this string unit SU. The next string unit SU is then selected, and the word lines WL0 to WL7 are sequentially selected in this string unit SU in a similar manner.

More specifically, the string unit SU0 is selected by the selection of the selection gate line SGD0, and data is sequentially written into the memory cell transistors MT0 to MT7 in the string unit SU0 by the sequential selection of the word lines WL0 to WL7.

After that, the string unit SU1 is selected by the selection of the selection gate line SGD1, and data is sequentially written into the memory cell transistors MT0 to MT7 in the string unit SU1 by the sequential selection of the word lines WL0 to WL7.

Data is then sequentially written into the memory cell transistors MT of the string units SU2 and SU3 in a similar manner.

Figure 15:
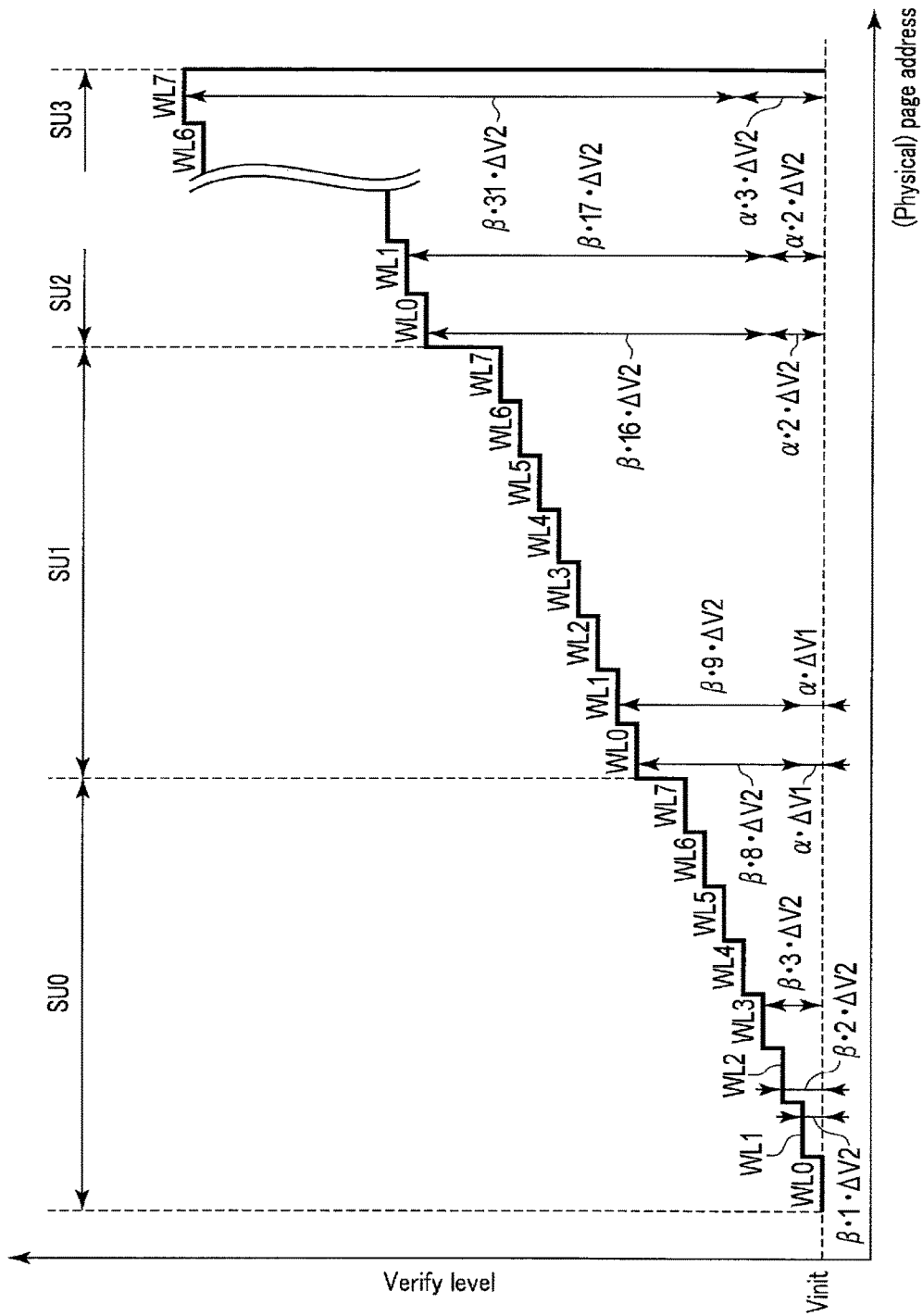
FIG. 15 is a timing chart showing the change of the verify level according to the second embodiment.

FIG. 14 is a conceptual diagram of an offset table according to the second write method. As in FIG. 9, boldfaced type numbers indicate the selection order of the pages in a certain block BLK. FIG. 15 is a timing chart showing the change of the verify voltage Vpvfy during the writing of data from the initial page address PG1 to the final page address PG32 in FIG. 13.

As shown, when data is written into the initial page address PG1, the verify voltage Vpvfy is set to the initial value Vinit. When data is written into the next page address PG2 (the word line WL1 of the string unit SU0), the verify voltage Vpvfy is stepped up by $\beta \cdot 1 \cdot \Delta V1$ in accordance with the offset table shown in FIG. 14. That is, Vpvfy=(Vinit+ $\beta \cdot 1 \cdot \Delta V1$). In a similar manner, when data is written into the next page address PG3, Vpvfy=(Vinit+$\beta \cdot 2 \cdot \Delta V1$). When data is written into the page address PG8, Vpvfy=(Vinit+ $\beta \cdot 7 \cdot \Delta V1$). In this way, the verify voltage Vpvfy is sequentially stepped up. The page addresses PG1 to PG8 so far are the pages that are all allocated to the same string unit SU0.

A page into which data is written next is the page PG9 allocated to the string unit SU1. Therefore, the verify voltage Vpvfy is further stepped up in accordance with the offset table, so that Vpvfy=(Vinit+$\alpha \cdot 1 \cdot \Delta V1 + \beta \cdot 8 \cdot \Delta V2$). After this, Vpvfy is also stepped up along with the increase of the page addresses. That is, Vpvfy=(Vinit+$\alpha \cdot 1 \cdot \Delta V1 + \beta \cdot 9 \cdot \Delta V2$) when data is written into the next page address PG10, and Vpvfy= (Vinit+$\alpha \cdot 1 \cdot \Delta V1 + \beta \cdot 10 \cdot \Delta V2$) when data is further written into the next page address PG11.

After this, data are written in a similar manner up to the final page address PG32. In this example, the verify level is always stepped up in contrast to the first write method.

2.2 Third Write Method

Next, the third write method is described with reference to FIG. 16. FIG. 16 is a sectional view of a certain block BLK along the bit line direction, and corresponds to FIG. 8 described in the first embodiment.

As shown, according to the third write method, as in the second write method, one of the string units SU is first selected, and the word lines WL are sequentially selected in this string unit SU. However, while the word lines WL are selected in ascending order of the distance from the selection gate line SGS (i.e. in the order of the word lines WL0 to WL7) according to the second write method, the word lines are selected from the upper layer (WL0, WL7) to the lower layer according to the third write method.

More specifically, the string unit SU0 is selected by the selection of the selection gate line SGD0. Further, the word lines WL0 (PG1) and WL7 (PG2) located in the uppermost layer are sequentially selected, the word lines WL1 (PG3) and WL6 (PG4) located in the second layer are then sequentially selected, the word lines WL1 (PG5) and WL5 (PG6) located in the third layer are then sequentially selected, and the word lines WL3 (PG7) and WL4 (PG8) located in the lowermost layer are finally sequentially selected. Consequently, data is first written into all the pages in the string unit SU0.

The string unit SU1 is then selected by the selection of the selection gate line SGD1. As in the string unit SU0, data are written in order from the word line WL located in the upper layer.

FIG. 17 is a conceptual diagram of an offset table according to the third write method. As in FIG. 9, boldfaced type numbers in the drawing indicate the selection order of the pages in a certain block BLK. FIG. 18 is a timing chart showing the change of the verify voltage Vpvfy during the writing of data from the initial page address to the final page address in FIG. 16.

As shown, the offset table and the change of the verify voltage Vpvfy according to the third write method are equivalent to those in FIG. 14 and FIG. 15 described according to the second write method in which the selection order of the word lines WL are changed.

2.3 Fourth Write Method

Figure 19:
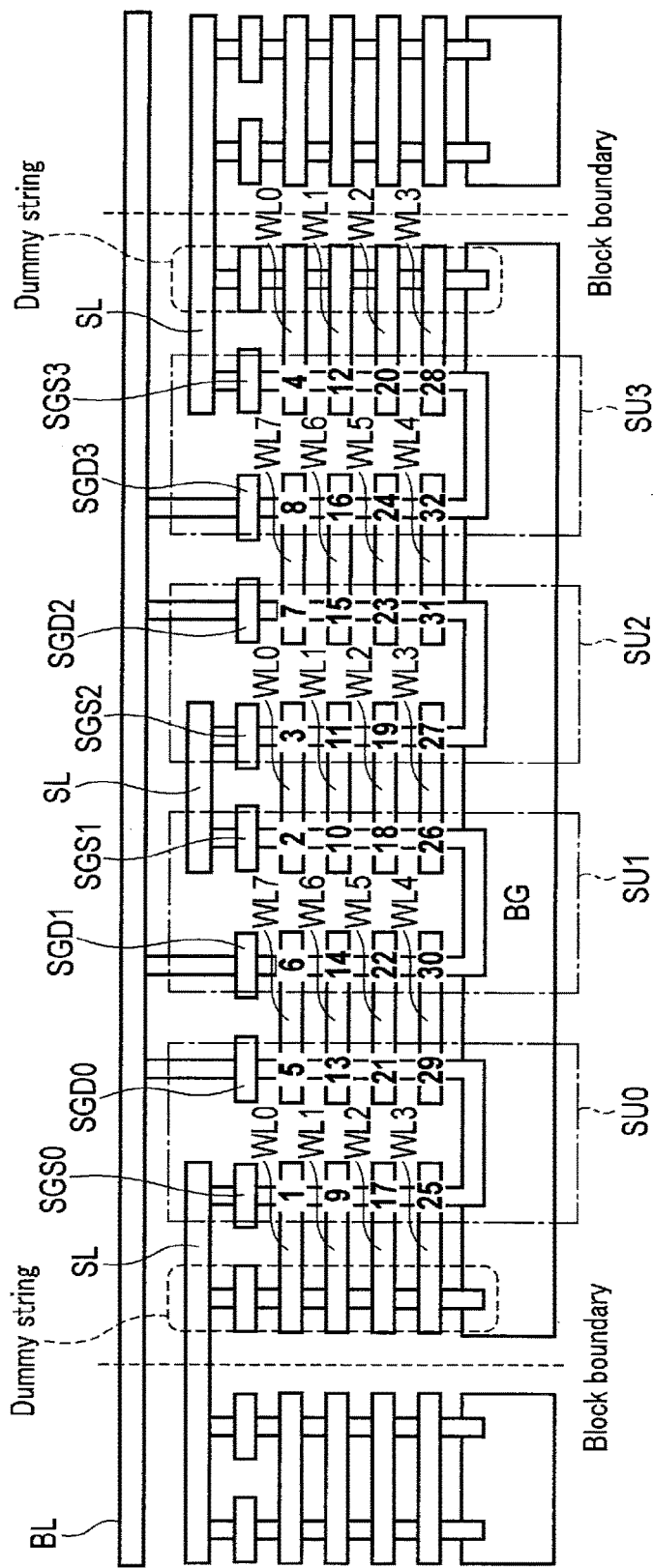
FIG. 19 is a sectional view of a block according to the second embodiment.

Next, the fourth write method is described with reference to FIG. 19. FIG. 19 is a sectional view of a certain block BLK along the bit line direction, and corresponds to FIG. 8 described in the first embodiment.

As shown, according to the fourth write method, as in the first write method, one of the word lines WL is first selected, and the memory cell transistors MT in each of the string units SU0 to SU3 connected to this word line WL are sequentially selected. However, while the word lines WL are selected in ascending order of the distance from the selection gate line SGS (i.e. in the order of the word lines WL0 to WL7) according to the first write method, the word lines are selected from the upper layer (WL0, WL7) to the lower layer according to the fourth write method.

More specifically, the word line WL0 located in the uppermost layer is first selected. The string units SU0 to SU3 (PG1 to PG4) are then sequentially selected by the sequential selection of the selection gate lines SGD0 to SGD3. The word line WL7 which is also located in the uppermost layer is then selected. The string units SU0 to SU3 (PG5 to PG8) are then sequentially selected in a similar manner. In this way, writing into the page corresponding to the word line WL in the uppermost layer in the block BLK is completed.

After that, the word line WL1 located in the second layer is then selected. The string units SU0 to SU3 (PG9 to PG12) are then sequentially selected by the sequential selection of the selection gate lines SGD0 to SGD3. The word line WL6 which is also located in the second layer is then selected. The string units SU0 to SU3 (PG13 to PG16) are then sequentially selected in a similar manner. In this way, writing into the page corresponding to the word line WL in the second layer in the block BLK is completed.

After this, data is sequentially written in a similar manner into the pages corresponding to the third and lowermost word lines WL.

Figure 21:
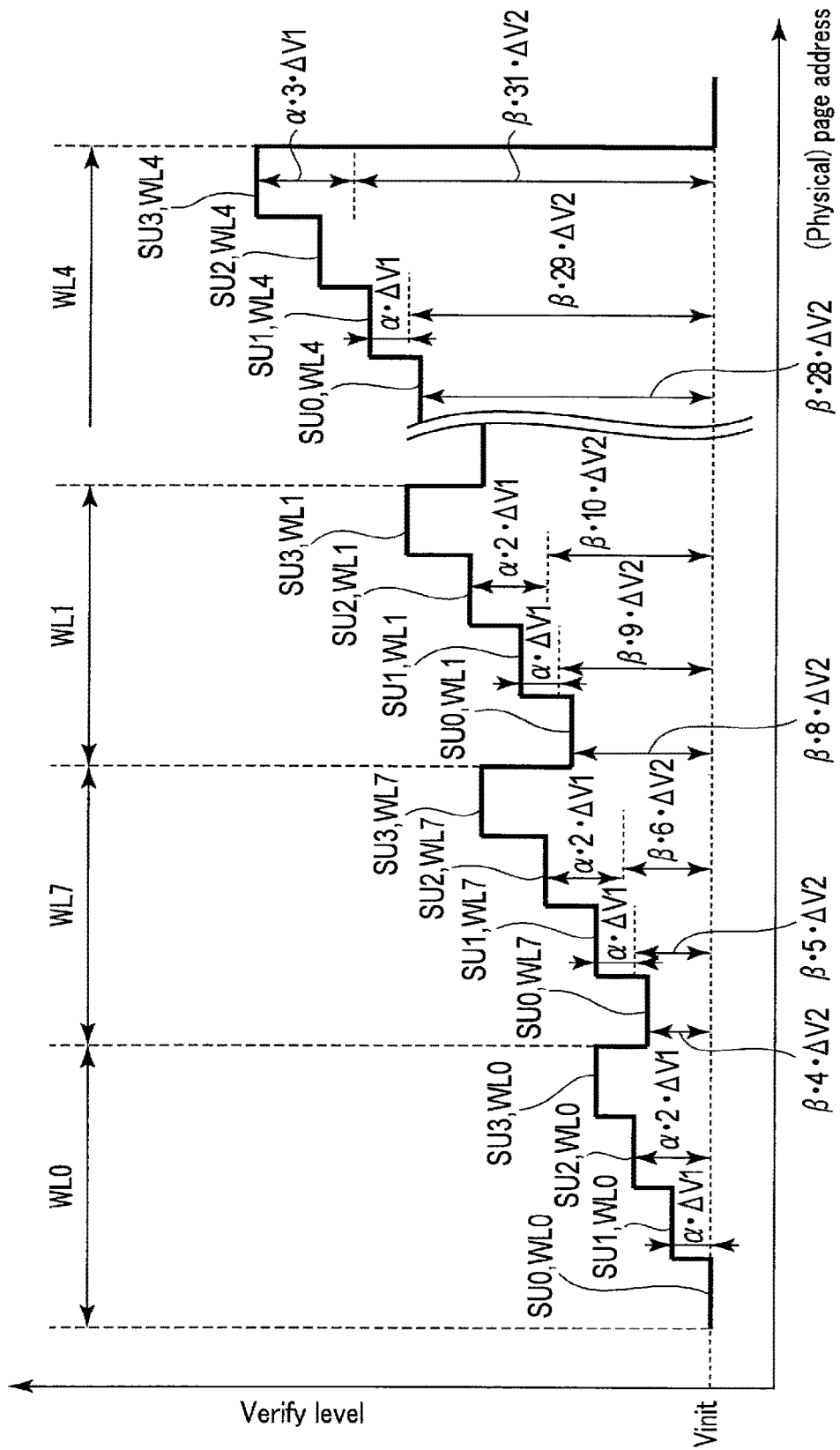
FIG. 21 is a timing chart showing the change of the verify level according to the second embodiment.

FIG. 20 is a conceptual diagram of an offset table according to the fourth write method. As in FIG. 9, boldfaced type numbers in the drawing indicate the selection order of the pages in a certain block BLK. FIG. 21 is a timing chart showing the change of the verify voltage Vpvfy during the writing of data from the initial page address to the final page address in FIG. 19.

As shown, the offset table and the change of the verify voltage Vpvfy according to the fourth write method are equivalent to those in FIG. 9 and FIG. 10 described according to the first write method in which the selection order of the word lines WL are changed.

2.4 Fifth Write Method

Next, the fifth write method is described with reference to FIG. 22. FIG. 22 is a sectional view of a certain block BLK along the bit line direction, and corresponds to FIG. 8 described in the first embodiment.

As shown, according to the fifth write method, as in the fourth write method, the word line WL in the uppermost layer is first selected, and the memory cell transistors MT in each of the string units SU connected to this word line are sequentially selected. However, while the memory cell transistors MT are selected in order from the uppermost layer by the word line according to the fourth write method, the memory cell transistors MT are selected by the string unit SU in the fifth write method.

More specifically, the string unit SU0 is first selected. Further, the word lines WL0 and WL7 (PG1 and PG2) located in the uppermost layer are sequentially selected. The string unit SU1 is then selected. The word lines WL0 and WL7 (PG3 and PG4) are sequentially selected again. The string unit SU2 is then selected. Further, the word lines WL0 and WL7 (PG5 and PG6) are sequentially selected again. The string unit SU3 is then selected. Further, the word lines WL0 and WL7 (PG7 and PG8) are sequentially selected again. In this way, writing into the pages corresponding to the word lines WL0 and WL7 in the uppermost layer in the block BLK is completed.

The string unit SU0 is then selected. Further, the word lines WL1 and WL6 (PG9 and PG10) located in the second layer are sequentially selected. The string unit SU1 is then selected. The word lines WL1 and WL6 (PG11 and PG12) are sequentially selected again. The string unit SU2 is then selected. Further, the word lines WL1 and WL6 (PG13 and PG14) are sequentially selected. The string unit SU3 is then selected. Further, the word lines WL1 and WL6 (PG15 and PG16) are sequentially selected. In this way, writing into the pages corresponding to the word lines WL1 and WL6 in the second layer is completed.

After that, data is also written in a similar manner into the pages corresponding to the third and lowermost word lines WL.

Figure 24:
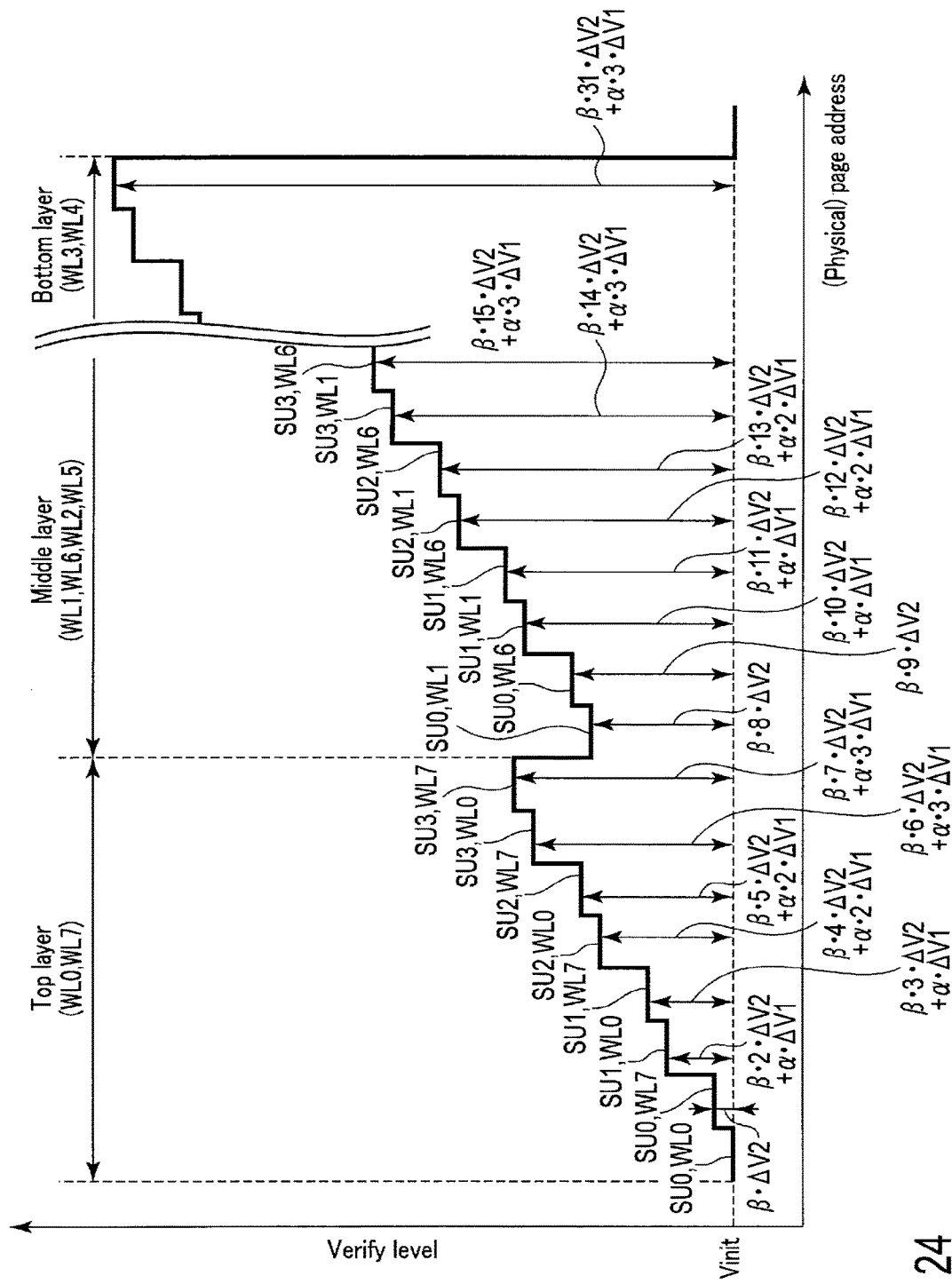
FIG. 24 is a timing chart showing the change of the verify level according to the second embodiment.

FIG. 23 is a conceptual diagram of an offset table according to the fifth write method. As in FIG. 9, boldfaced type numbers in the drawing indicate the selection order of the pages in a certain block BLK. FIG. 24 is a timing chart showing the change of the verify voltage Vpvfy during the writing of data from the initial page address to the final page address in FIG. 21.

As shown, according to the fifth write method, the verify level is increased in the period of writing into the word lines located in the same layer. However, if the selected layer is changed, that is, if the word line located in a lower layer is selected, the verify level is decreased by the value of the term of the sensitivity coefficient α, and the verify level again increases from this level.

2.5 Advantageous Effects According to the Present Embodiment

As described above, the second embodiment can be applied to various write methods.

3. Third Embodiment

Next, a semiconductor memory device according to the third embodiment is described. The present embodiment relates to the sensitivity coefficients α and β described in the first and the second embodiments above. The differences between the first and second embodiments and the third embodiment are only described below.

3.1 Regarding Sensitivity Coefficients α and β

FIG. 25 is a graph showing the relation between the sensitivity coefficients α and β and word line addresses (or page addresses) according to the present embodiment. The allocation of the page addresses in FIG. 25 corresponds to FIG. 8 described in the first embodiment, and the layer of the word line WL to be selected changes in the order of the upper layer→the middle layer→the lower layer→the middle layer→the upper layer in accordance with the increase of the word line addresses (or the page addresses).

According to the present embodiment, as shown in FIG. 25, the sensitivity coefficients α and β are higher in the word lines in the lower layers, and the sensitivity coefficients α and β are lower in the word lines in the upper layers.

3.2 Advantageous Effects According to the Present Embodiment

The sensitivity coefficients according to the present embodiment allow more accurate program verification, and allow the distribution width of threshold voltages to be narrower. The present advantageous effects are described below.

FIG. 26 is a schematic diagram of the sectional structure of the NAND string 114. In the example of FIG. 26, the number of the stacked word lines WL is (m+1), and the number of the word lines is (2m+1). The present configuration is manufactured in the following manner. That is, the back gate line BG is first formed. (m+1) interlayer insulating films and (m+1) word line layers are alternately formed, and a memory hole MH is then made through the (m+1) interlayer insulating films and the (m+1) word line layers. The memory hole MH is then filled with a polycrystalline silicon layer.

In the three-dimensionally stacked NAND flash memory, the degree of integration of the memory cells can be improved by increasing the number of the layers of the word lines. However, the memory hole MH is more tapered if the number of layers is greater, and a diameter $d_{MH}$ of the memory hole MH is smaller in the lower layers and larger in the higher layers. As a result, the disturbance to which the memory cells are subjected varies from layer to layer. More specifically, the disturbance is greater in the lower layers, and the disturbance is smaller in the upper layers. The variation amount of the threshold also varies from layer to layer because of the difference of the disturbance. This situation is described with reference to FIG. 27.

Figure 27:
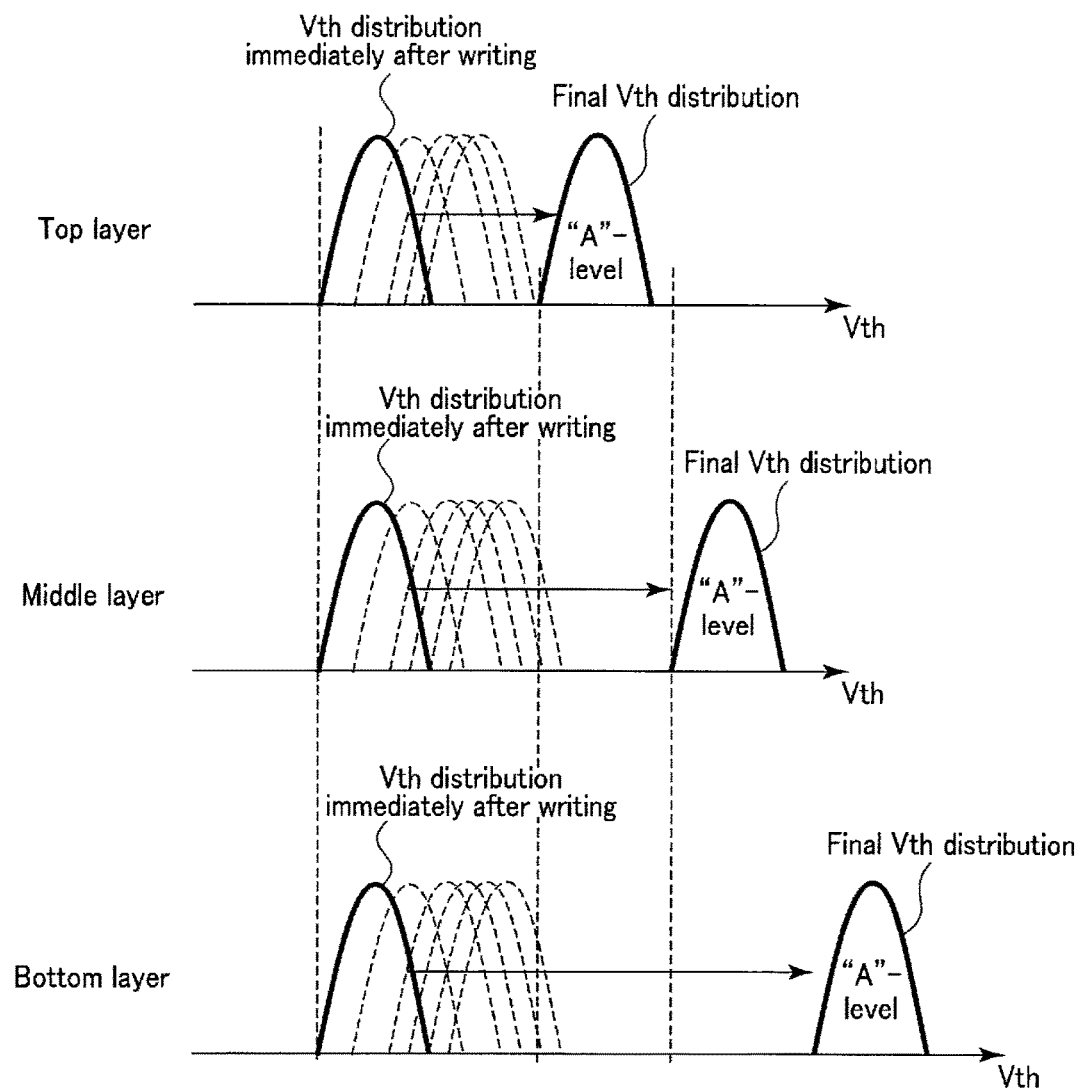
FIG. 27 is a graph showing the variation of the threshold distribution of the memory cells.

FIG. 27 is a graph showing the threshold distribution of the memory cells, and shows the changes of the thresholds from the time immediately after writing to the completion of writing in the memory cells connected to the word line in the uppermost layer (top layer), the word line in the middle layer, and the word line in the lowermost layer (bottom layer). In the cases in FIG. 27, the number of times that the program disturbance is caused is the same to explain the relation between the threshold changes and the layers.

As shown, in the memory cell transistor located in the uppermost layer, the program disturbance is small, so that the variation of the threshold is the smallest. In contrast, in the memory cell transistor located in the lowermost layer, the variation of the threshold is the greatest because of the influence of the great program disturbance.

In view of this fact, according to the present embodiment, the values of the sensitivity coefficients α and β are higher in the lower layers in which disturbance is greater. The sensitivity coefficients α and β are higher, so that the difference between the threshold distribution immediately after writing to a certain page (or lower layer page) and the threshold distribution at the completion of writing in the whole block can be greater, and a great threshold variation shown in FIG. 27 can be offset.

3.3 Modifications of the Present Embodiment

Various methods can be selected for the setting of the sensitivity coefficients α and β. For example, although both the sensitivity coefficients α and β have layer dependence as has been described in the above embodiments with reference to FIG. 25, at least one of the sensitivity coefficients may have layer dependence.

In the embodiments described above, a plurality of word lines is managed as one zone, and α and β are managed zone by zone. This situation is shown in FIG. 28. As shown, the word lines WL are collectively managed in four layers. That is, the word lines WL0 to WL3 and WL(2m−2) to WL(2m+1) formed in the uppermost layer to the fourth layer are treated as a zone ZN1. The word lines WL4 to WL7 and WL(2m−6) to WL(2m−3) formed in the fifth layer to the eighth layer are treated as a zone ZN2. The same applies to the rest. The word lines WL(m−3) to WLm and WL(m+1) to WL(m+4) formed in the four lowermost layers are treated as a zone ZN((m+1)/4). The sensitivity coefficients α and β are then set for each of the zones ZN.

Figure 29:
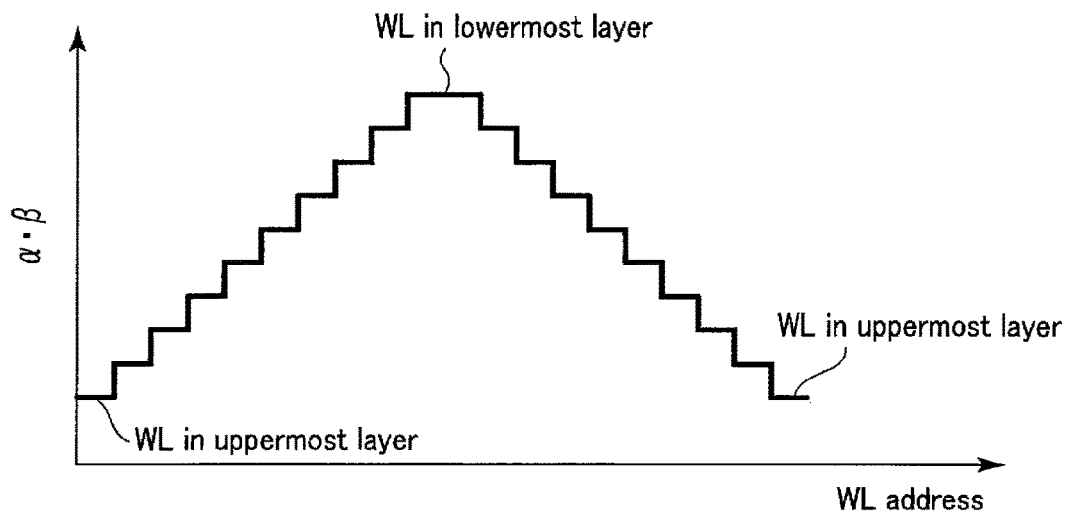

Naturally, the sensitivity coefficients α and β may be set not zone by zone but per word line. This situation is shown in FIG. 29. FIG. 29 is a graph showing the changes of the sensitivity coefficients α and β in comparison with the word line addresses (or the page addresses). In the case shown in FIG. 29, simply, a memory hole diameter $d_{MH}$ is the smallest in the lowermost layer, and the memory hole diameter $d_{MH}$ is larger in the upper layers. However, the relation between the memory hole diameter $d_{MH}$ and the layers is not so simple, and may be more complicated.

Figure 30:
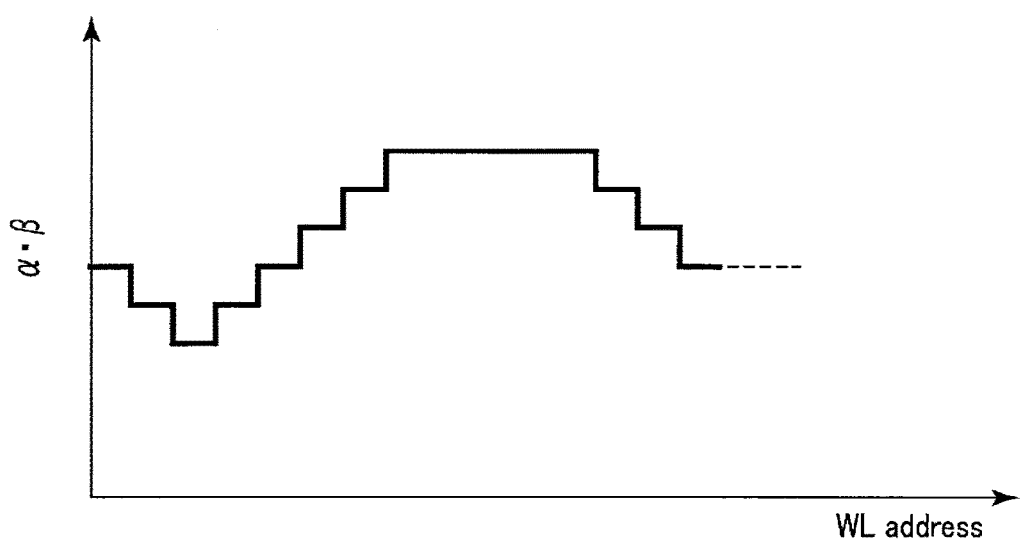

For example, the diameter $d_{MH}$ may increase in the lowermost layer to the N-th layer in order, the diameter $d_{MH}$ may be small in the (N+1)-th layer, and the diameter $d_{MH}$ may again increase from there. In this case, the sensitivity coefficients α and β are not controlled in accordance with the depth of the layers but in accordance with the diameter $d_{MH}$. That is, the relation between the diameter $d_{MH}$ of the memory hole MH and the layers is not particularly limited. In the embodiments described above, the word line voltage has only to be changed in accordance with the degree of disturbance that is dependent on the diameter $d_{MH}$. Therefore, the relation of the sensitivity coefficients α and β with the page addresses may be, for example, as shown in a graph in FIG. 30.

Furthermore, when the memory cell transistor MT is a multi-level cell (MLC) capable of holding 2 or more bits of data, the sensitivity coefficients α and β may be set for each write level.

For example, when the memory cell transistor MT is capable of holding 2-bit data, the verify operation is performed for each of "A"-, "B"-, and "C"-levels. In general, the memory cell transistor MT at the "A"-level (a write level having the lowest threshold) is most susceptible to program disturbance, and the memory cell transistor MT at the "C"-level (a write level having the highest threshold) is least susceptible to program disturbance.

Therefore, as shown in a graph of FIG. 31, the sensitivity coefficients α and β may be prepared for each write level. The sensitivity coefficients α and β having higher values are used in the verification of the write level having a high threshold.

4. Fourth Embodiment

Next, a semiconductor memory device according to the fourth embodiment is described. In the present embodiment, the verify voltage is not changed in accordance with the page addresses and the writing order as in the first to third embodiments, but the sense period is changed. Two types of sense amplifiers are described below, and the differences between the first to third embodiments and the fourth embodiment are only described.

4.1 First Example of Sense Amplifier

A first configuration example of the sense amplifier 113 is described. The first configuration example is a type of sense amplifier which senses a current flowing through the bit lines BL. The sense amplifier 113 includes, for example, a plurality of sense circuits provided to correspond to the bit lines BL. The sense circuits are formed on the semiconductor substrate, and provided, for example, immediately under the memory cell array 111 described above. FIG. 32 is a circuit diagram of a sense circuit.

As shown, a sense circuit 50 includes a sense amplifier unit 51 and a latch circuit 52. For example, when each memory cell transistor holds 2 or more bits of data, two or more latch circuits are provided.

The sense amplifier unit 51 senses and amplifies the data read onto the bit lines BL, and applies a voltage to the bit lines BL in accordance with the data held by the latch circuit 52. That is, the sense amplifier unit 51 is a module which directly controls the bit lines BL. The latch circuit 52 temporarily holds data. In writing of data, the latch circuit 52 holds write data received from the controller 200. In reading of data, the latch circuit 52 holds the data sensed and amplified by the sense amplifier unit 51, and sends the data to the controller 200.

The sense amplifier unit 51 includes n-channel MOS transistors 60 to 68, a p-channel MOS transistor 69, and a capacitive element 70.

The transistor 60 has its gate to which a signal BLS is applied, and has one end of its current path connected to the corresponding bit line BL. The transistor 61 has one end of its current path connected to the other end of the current path of the transistor 60, has its gate to which a signal BLC is applied, and has the other end of its current path connected to a node SCOM. The transistor 61 clamps the corresponding bit line BL to a potential corresponding to the signal BLC.

The transistor 69 charges the bit lines BL and the capacitive element 70. The transistor 69 has its gate connected to a node INV_S, its drain connected to a node SSRC, and its source applied with a power supply voltage VDD. The transistor 62 precharges the bit lines BL. The transistor 62 has its gate to which a signal BLX is applied, its drain connected to the node SSRC, and its source connected to the node SCOM. The transistor 64 charges the capacitive element 70. The transistor 64 has its gate to which a signal HLL is applied, its drain connected to the node SSRC, and its source connected to a node SEN. The transistor 63 discharges the node SEN in data sensing. The transistor 63 has its gate to which a signal XXL is applied, its drain connected to the node SEN, and its source connected to the node SCOM. The transistor 68 fixes the bit lines BL at a constant potential. The transistor 68 has its gate connected to the node INV_S, its drain connected to the bit line BL, and its source connected to a node SRCGND.

The capacitive element 70 is charged when the bit line BL is precharged. The capacitive element 70 has one electrode connected to the node SEN, and the other electrode to which a signal CLK is applied.

The transistor 65 has its gate to which a signal BLQ is applied, its source connected to the node SEN, and its drain connected to a node LBUS. The node LBUS is a signal path which connects the sense amplifier unit 51 and the data latch 52. The transistor 66 stores read data in the data latch 52. The transistor 66 has its gate to which a signal STB is applied, and its drain connected to the node LBUS.

The transistor 67 senses whether the read data is "0" or "1". The transistor 67 has its gate connected to the node SEN, its drain connected to the source of the transistor 66, and its source grounded.

The node INV_S is a node inside the latch circuit 52, and can take a level corresponding to the held data in the latch circuit 52. For example, the node INV_S reaches the "H"-level if a selected memory cell turns on in reading of data and the node SEN decreases enough. In contrast, the node INV_S reaches the "L"-level if the selected memory cell is off and the node SEN keeps a constant potential.

In the configuration described above, various control signals are provided by, for example, the sequencer 121. The operation of the sense circuit 50 is described in detail in the following section 4.2.

4.2 Data Write Operation

Figure 33:
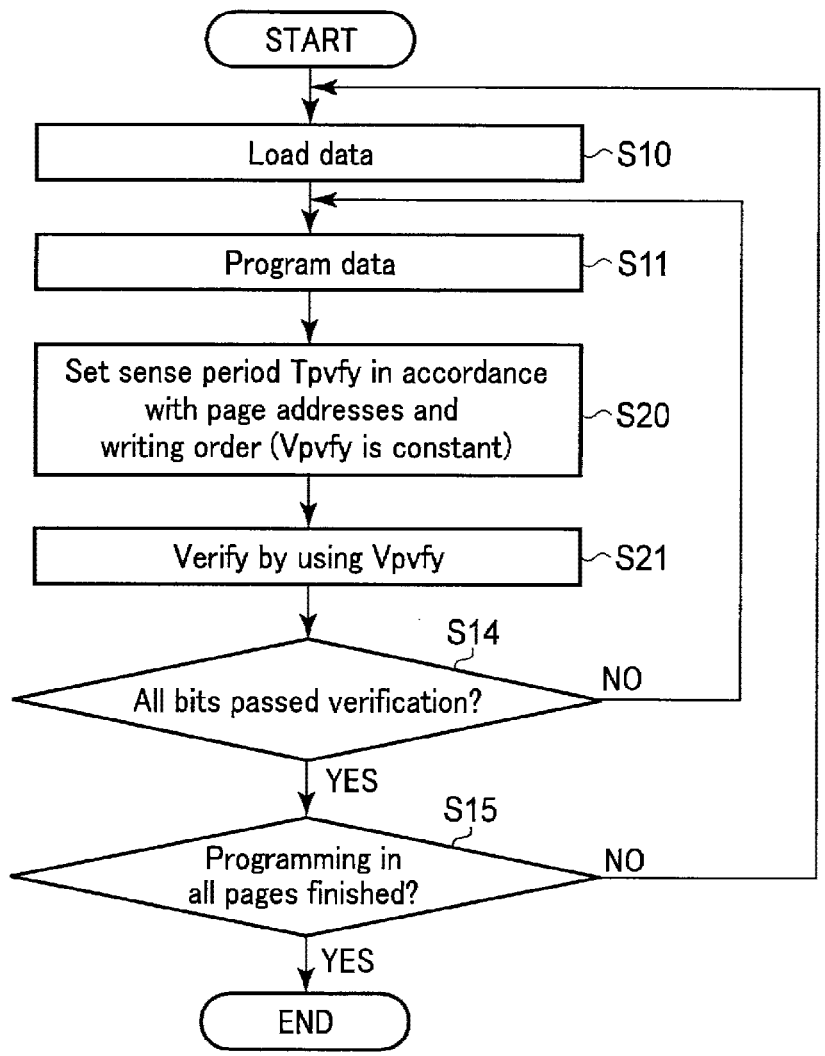
FIG. 33 is a flowchart of a write operation according to the fourth embodiment.

Next, a data write method using the sense amplifier 113 according to the first configuration example is described with reference to FIG. 33. FIG. 33 is a flowchart showing the data write method according to the present embodiment. As shown, the method according to the present embodiment is different from the method in FIG. 6 described in the first embodiment in that a sense period Tpvfy is changed instead of the verify voltage Vpvfy. That is, after the programming of data (step S11), the sequencer 121, for example, sets the sense period Tpvfy in accordance with the page addresses and the writing order (step S20). The sense circuit 50 then performs the program verify operation by sensing a bit line current for the set sense period Tpvfy (step S21).

If all the bits in the selected page pass the verification (step S14, YES), the write operation for this page is finished. In contrast, if any of the bits fail the verification (step S14, NO), the sequencer 121, for example, returns to step S11, again performs the program.

In this instance, for example, the sequencer 121 shifts the sense period Tpvfy in accordance with the page addresses and the writing order. That is, the sequencer 121 updates the sense period Tpvfy to (Tpvfy+ΔTx).

If all the bits pass the verification in step S14 (step S14, YES), the sequencer 121 executes programming in the next page (step S15, YES). If the programming in all the pages is finished (step S15, YES), the write operation is completed.

FIG. 34 is a timing chart showing the voltage change of each signal line in the program verify operation. As shown, predetermined potentials are applied to the selected word line, the unselected word lines, and the selection gate lines SGD and SGS by the row decoder 112 (time t0). That is, the row decoder 112 applies the verify voltage Vpvfy to the selected word line, and applies the voltage VREAD to the unselected word lines. Further, the row decoder 112 applies a voltage to the selection gate lines SGD and SGS. That is, the row decoder 112 applies the voltage VSG to the selection gate lines SGD and SGS corresponding to the selected string unit SU to turn on the selection transistors ST1 and ST2. On the other hand, the row decoder 112 applies, for example, 0 V or a negative voltage VBB to the selection gate lines SGD and SGS corresponding to the selected string units SU to turn off the selection transistors ST1 and ST2.

The sequencer 121 then set the signal BLS to the "H"-level to connect the sense circuit 50 to the corresponding bit line BL. The node INV_S is reset, and set to the "L"-level.

The sense circuit 50 then precharges the bit line BL. That is, the sequencer 121 sets the signals BLX and BLC to the "H"-level (time t1). As a result, the bit line BL is precharged by the voltage VDD via the current paths of the transistors 60 to 62, and 69. A voltage Vclamp is a voltage to determine a bit line voltage, and the bit line voltage is clamped at the voltage Vbl by transistor 61.

The sense circuit 50 then charges the node SEN. That is, the sequencer 121 sets the signal HLL to the "H"-level (time t2). The potential of the signal HLL at the "H"-level is a voltage VH, and this voltage enables the transistor 64 to transfer the voltage VDD. As a result, the transistor 64 turns on, and the node SEN is charged to the voltage VDD. The node SEN is charged up to a time t3. If the potential of the node SEN reaches VDD, the transistor 67 turns on.

The sense circuit 50 then senses the bit line BL. That is, the sequencer 121 sets the signal XXL to the "H"-level (time t4). As a result, the transistor 63 turns on, and the node SEN is electrically connected to the bit line BL. If the selected memory cell is on, a current flows to the source line SL from the node SEN, and the potential of the node SEN drops. On the other hand, if the selected memory cell is off, no current flows to the source line SL from the node SEN, and the potential of the node SEN substantially keeps VDD. The sequencer 121 sets (asserts) the signal XXL at the "H"-level for the aforementioned period Tpvfy.

Finally, the sense circuit 50 strobes data. That is, the sequencer 121 sets the signal STB to the "H"-level (time t6). As a result, the transistor 66 turns on. If the transistor 67 is on (i.e. SEN="H"), the node LBUS is discharged to substantially VSS, and the "L"-level is stored in the node INV_S. If the transistor 67 is off (i.e. SEN="L"), the potential of the node LBUS keeps VDD, and the "H"-level is stored in the node INV_S.

4.3 Regarding Offset Table

The sense period Tpvfy according to the present embodiment is stored in the offset table described in the first to third embodiments. FIG. 35 to FIG. 39 are conceptual diagram of the offset tables used in the first to fifth write methods described in the first and second embodiments.

In the drawings, $\Delta t1$ corresponds to a threshold shift amount resulting from the program disturbance caused by the program voltage VPGM when the string unit SU is unselected. $\Delta t2$ corresponds to a threshold shift amount resulting from the program disturbance caused by the program voltage VPGM when the string unit SU is selected or unselected.

As shown, the offset table according to the present embodiment holds the amount of offset from an initial sense period Tinit. For example, according to the first write method, the sense period is set to the initial value Tinit when the word line WL0 (PG1) of the string unit SU0 is selected as shown in FIG. 35. When the word line WL0 (PG2) of the string unit SU1 is selected, the sense period is increased $\alpha \cdot \Delta t1$ compared to the initial value, and set to (Tinit+$\alpha \cdot \Delta t1$). When the word line WL1 (PG6) of the string unit SU1 is selected, the sense period is set to (Tinit+$\alpha \cdot \Delta t1$+$\beta \cdot 5 \cdot \Delta t2$).

When the word line WL7 (PG32) of the string unit SU3 is finally selected, the sense period is set to a longest period (Tinit+$\alpha \cdot 3 \cdot \Delta t1$+$\beta \cdot 31 \cdot \Delta t2$).

The offset amount in each write method corresponds to those in FIG. 9, FIG. 14, FIG. 17, FIG. 20, and FIG. 23 in which $\Delta V1$ and $\Delta V2$ are rewritten to $\Delta t1$ and $\Delta t2$. Therefore, the change of the sense period Tpvfy in each write method corresponds to those in FIG. 10, FIG. 15, FIG. 18, FIG. 21, and FIG. 24 in which $\Delta V1$ and $\Delta V2$ are similarly read as $\Delta t1$ and $\Delta t2$, Vinit is read as Tinit, and the longitudinal axis is read as the sense period Tpvfy.

4.4 Second Example of Sense Amplifier

Next, a second configuration example of the sense amplifier 113 is described. The second configuration example is a type of sense amplifier which senses the voltage of the bit line BL.

The voltage-sensing type sense amplifier shields the adjacent bit lines to perform a sense operation. That is, according to the voltage-sensing method, the voltage variation of the bit line is sensed. Here, when one bit line is discharged, the adjacent bit line is subject to the potential variation of the discharged bit line due to coupling. As a result, erroneous reading of data might occur. Therefore, according to the voltage-sensing method, data is read every even bit line or every odd bit line. The odd bit lines are fixed (shielded) at a constant potential when data are read from even bit lines. The even bit lines are fixed at a constant potential when data are read from odd bit lines.

In this method of shielding adjacent bit lines (hereinafter referred to as a "bit line shielding method"), the sense amplifier 113 has a plurality of sense circuits (S/A & latch), and one sense circuit (S/A & latch) is shared by two bit lines, as shown in FIG. 40. That is, in the configuration used, adjacent bit lines are classified into even and odd bit lines, and the adjacent even and odd bit lines share one sense circuit.

In the read operation according to this bit line shielding method, an even bit transfer gate (BLSe) is turned on, and the even bit lines are connected to the sense amplifier when data in the even bit lines are read. At the same time, a ground transistor (BIASo) is turned on so that the odd bit lines are connected to BLCRL and brought to a predetermined potential. If the sense amplifier (S/A) precharges the even bit lines in this state, the even bit lines are properly precharged without being affected by the odd bit lines because the potentials of the odd bit lines are kept at the predetermined potential. This precharge potential is determined by a gate voltage such as the signal BLC, and is, for example, 0.7 V.

In contrast, when data in the odd bit lines are read, an odd bit transfer gate (BLSo) is turned on, and the odd bit lines are connected to the sense amplifier. At the same time, a ground transistor (BIASe) is turned on so that the even bit lines are connected to BLCRL. If the sense amplifier (S/A) precharges the odd bit lines in this state, the odd bit lines are properly precharged without being affected by the even bit lines because the potentials of the even bit lines are kept at the predetermined potential. This precharge potential is also a voltage which is clamped by the signal BLC as in the case of the recharging of the even bit lines.

Thus, according to this bit line shielding method, adjacent unselected bit lines are grounded during the read operation, so that it is possible to perform an accurate read operation without the influence of the signals of the adjacent bit lines.

Figure 41:
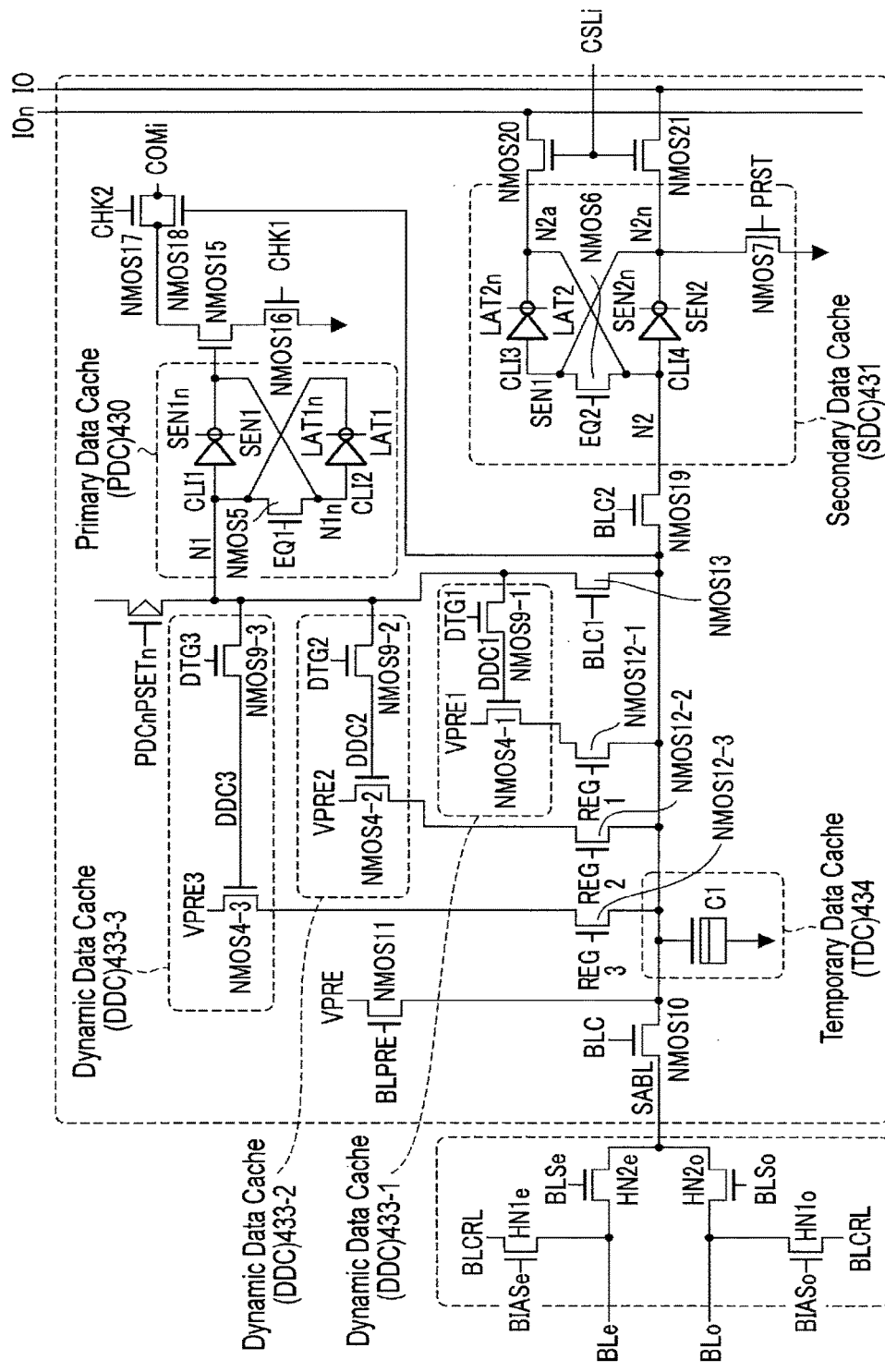
FIG. 41 is a circuit diagram of the sense circuit according to the fourth embodiment.

FIG. 41 is a circuit diagram of the sense circuit (S/A & latch) corresponding to a pair of bit lines BLe and BLo (e.g. BL0 and BL1) shown in FIG. 40.

As shown, the sense circuit includes a primary data cache (PDC) 430, a secondary data cache (SDC) 431, three dynamic data caches (DDC) 433 (433-1 to 433-3), and a temporary data cache (TDC) 434. The dynamic data caches 433 and the temporary data cache 434 may be provided when necessary. The dynamic data caches 433 can also be used as caches for holding data to write a middle potential (VQPW) between VDD (high potential) and VSS (low potential) during programming.

The primary data cache 430 includes clocked inverters CLI1 and CLI2, and an n-channel transistor NMOS5. The secondary data cache 431 includes clocked inverters CLI3 and CLI4, and n-channel transistors NMOS6 and NMOS7. The dynamic data cache 433 includes n-channel transistors NMOS4 and NMOS9. The temporary data cache 434 includes a capacitance element C1. The circuit configurations of the primary data cache 430, the secondary data cache 431, the dynamic data cache 433, and the temporary data cache 434 are not limited to the circuit configurations shown in FIG. 41, and other circuit configurations can also be used.

Although the n-channel MOS transistors are used as the transistors which control the input and output of data in data caching in the example of FIG. 41, p-channel MOS transistors may be used.

The sense amplifier is connected to the corresponding even bit line BLe and odd bit line BLo by n-channel MOS transistors HN2e and HN2o, respectively. The signals BLSe and BLSo are input to the gates of the transistors HN2e and HN2o, respectively. The sources of n-channel MOS transistors HN1e and HN1o are connected to the even bit line BLe and the odd bit line BLo. The transistors HN1e and HN1o have their gates to which signals BIASe and BIASo are respectively input, and have their drains to which the signal BLCRL is input.

4.5 Program Verify Operation

FIG. 42 shows a timing chart of various signals in the program verification in the sense amplifier according to the second configuration example. The verify operation corresponds to the processing in step S21 described with reference to FIG. 33. The signals are provided by, for example, the sequencer 121 described with reference to FIG. 2.

As shown, the selection gate line (SGD) of the selected string unit SU in the selected block is first brought to the "high" level at the time t0. In the sense amplifier, a precharge power supply voltage VPRE is set to VDD. 0 V or the unselect voltage VBB (e.g. a negative voltage) is applied to unselected selection gate lines SGD.

At the time t1, the word lines WL are set up in the core unit. That is, the row decoder 112 applies the verify voltage Vpvfy to the selected word line, and applies the voltage VREAD to the unselected word lines.

The sense amplifier also precharges the bit line (the even bit line BLe in the example of FIG. 42) to be read. Specifically, a signal BLPRE is set to the "high" level to turn on a transistor NMOS11, and the temporary data cache (TDC) 434 is precharged by the voltage VDD.

At the times t2 to t3, the bit line selection signals BLSe and BLSo and bias selection signals BIASe and BIASo are set. In the example of FIG. 42, the bit line selection signal BLSe is set to the "high" level because the even bit line BLe is selected, and the signal BIASo is set to the "high" level because the odd bit line BLo is fixed to BLCRL (=Vss).

The clamp voltage Vclamp for bit line precharging is applied to the signal BLC, and the even bit line BLe is precharged to, for example, 0.7 V.

As a result, in the core unit, the even bit line BLe is charged to, for example, 0.7 V, and the odd bit line BLo is fixed to Vss.

At the time t4, the signal BLC is set to 0 V, and the bit line BLe is brought into an electrically floating state.

At the time t5, Vsg is applied to the source-side selection gate line SGS of the selected string unit. 0 V or the unselect voltage VBB (e.g. a negative voltage) is applied to the other unselected selection gate lines SGS. Thus, the bit lines are not discharged if the threshold of the memory cells is higher than the verify level, and a read current flows so that the bit lines are discharged if the threshold is lower.

At the period t9 to t10, the signal BLPRE is set to Vsg while the signal VPRE is at VDD, and the temporary data cache TDC is thereby precharged to VDD.

At the period t11 to t12, a sense voltage Vsen is applied to the signal BLC. At the same time, if the potential of the selected bit line BLe is higher than (Vsen−Vth), a transistor NMOS10 (a transistor to which the signal BLC is applied) remains cut off, and VDD is held in the node TDC. Vth is a threshold voltage of the memory cell transistor. In contrast, if the potential of the selected bit line BLe is lower than (Vsen−Vth), the transistor NMOS10 turns on, so that the node TDC is discharged and thus becomes substantially equal to the potential (e.g. 0.4 V) of the bit line BLe.

At the period t13 to t14, sensed data are loaded into the secondary data cache SDC. Specifically, signals SEN2 and LAT2 are temporarily turned off, and a signal EQ2 is set to VDD so that a node SEN1 and a node N2 have the same potential. Subsequently, a signal BLC2=VDD+Vth, and the data in the TDC is transferred to the SDC. As a result, the data in the SDC becomes "1" if the node TDC is originally "high". The data in the SDC becomes "0" if the node TDC is "low" (e.g. 0.4 V).

In this way, data are read from the even bit line BLe. Thereafter, a recovery operation is performed at the period t14 to t15, and each node and each signal are reset.

The odd bit line BLo is read in a similar manner. In this case, in contrast to the example of FIG. 42, the signal BLSo is set to "high", and the signal BLSe is set to "low". The signal BIASe is set to "high", and the signal BIASo is set to "low".

Thus, the voltage-sensing type sense amplifier is also used to the semiconductor memory device. In this case, the sense period Tpvfy is a period in which the sense voltage Vsen is applied to the signal BLC. This period is set by, for example, the sequencer 121 in accordance with the offset table compliant with the write methods shown in FIG. 35 to FIG. 39.

4.6 Advantageous Effects According to the Present Embodiment

Advantageous effects similar to those in the first to third embodiments are obtained by the configuration according to the present embodiment as well.

That is, according to the first to third embodiments, the verify voltage is changed in accordance with the page addresses and the writing order so that the threshold voltage at the end of writing in all the pages will be a value within a desired range as has been described with reference to FIG. 12.

Figure 43:
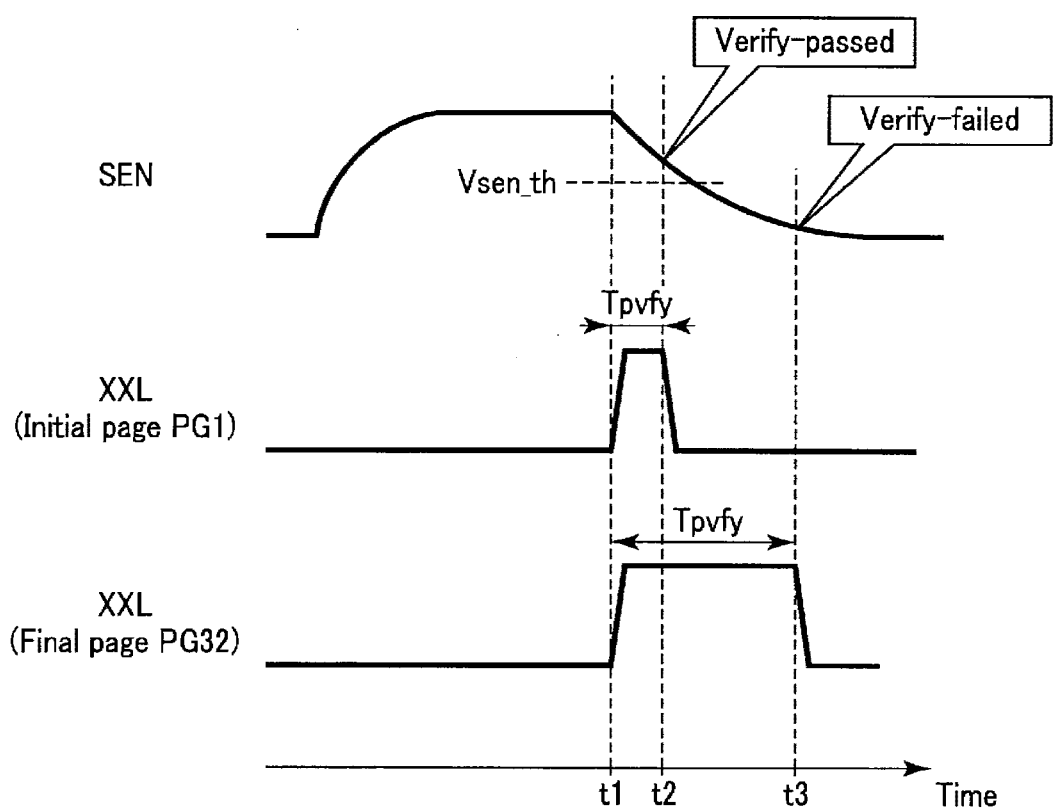
FIG. 43 is a timing chart of signals SEN and XXL in verification according to the fourth embodiment.

In contrast, according to the present embodiment, the sense period Tpvfy is changed in accordance with the page addresses and the writing order, and similar advantageous effects are obtained. This is described with reference to FIG. 43. FIG. 43 is a timing chart showing the changes of the potential of the node SEN and the potential of the signal XXL in verification according to the first configuration example (current-sensing type sense amplifier).

By way of example, suppose that a potential change from the precharge of the node SEN to its discharge in verification is as shown in FIG. 43.

In this instance, in the sense amplifier, the signal XXL is set to the "high" level, so that the node SEN is discharged, and data is sensed. According to the present embodiment, the period Tpvfy in which this signal XXL is asserted is changed in accordance with the page addresses and the writing order. For example, the period Tpvfy is minimized for the initial page PG1, and the period Tpvfy is maximized for the final page PG32.

Thus, in the example shown in FIG. 43, the period Tpvfy is short in the initial page PG1, so that at the time t2 in which the signal XXL is set to "low" level, the node SEN is higher than a data judgment threshold Vsen_th. Therefore, the page PG1 passes the verification. Thus, no further program operation is executed for the page PG1.

On the other hand, the period Tpvfy is long in the final page PG32, so that at the time t3 in which the signal XXL is set to "low" level, the node SEN is lower than the data judgment threshold Vsen_th. Therefore, the page PG32 fails the verification. Thus, a further program operation is executed for the page PG32.

As described above, in the page in which the threshold voltage tends to vary due to disturbance, the sense period Tpvfy is reduced so that the potential of the node SEN is compared at a higher level with the threshold Vsen_th. On the other hand, in the page in which the threshold voltage does not easily vary, the sense period Tpvfy is increased so that the potential of the node SEN is compared at a much lowered level with the threshold Vsen_th. Thus, a writing operation similar to that in FIG. 12 described in the first embodiment can be performed.

This also holds true with the voltage-sensing type sense amplifier according to the second configuration example. That is, according to the second configuration example, the discharge period of the node TDC is changed in accordance with the page addresses and the writing order, so that similar advantageous effects are obtained.

Naturally, the second and third embodiments can also be applied to the present embodiment. That is, the second to fifth write methods can be applied, and the sensitivity coefficients α and β can be set as has been described in the third embodiment.

5. Fifth Embodiment

Next, a semiconductor memory device according to the fifth embodiment is described. In the present embodiment, the configuration of the memory cell array 111 is modified in the first to fourth embodiments. The differences between the first to fourth embodiments and the fifth embodiment are only described below.

5.1 Configuration of Memory Cell Array

FIG. 44 is a sectional view of the memory cell array 111 according to the present embodiment along the bit line direction, and corresponds to FIG. 4 described in the first embodiment.

As shown, a semiconductor layer 26 may be in the shape of one column instead of the U-shape described with reference to FIG. 4. In this case, as shown in FIG. 44, the source line layer 31 is formed above the semiconductor substrate, and a plurality of columnar semiconductor layers 30 and 26 are formed on the source line layer 31. Around the semiconductor layers 30 and 26, the selection transistor ST2, the memory cell transistors MT0 to MT7, and the selection transistor ST1 are formed in order from the bottom, and the bit line layer 33 is further formed above the transistor ST1. In the present configuration, the back gate transistor BT is unnecessary.

FIG. 45 is an equivalent circuit diagram of a certain block BLK along the bit line direction according to the present embodiment, in boldfaced type numbers indicate the writing order. In the case shown in FIG. 45, the first write method described above in the first embodiment is applied.

As shown, writing of data starts with the lowermost word line WL0, and ends with the uppermost word line WL7. That is, the lowermost word line WL0 is first selected, and while this word line WL0 is being selected, the string units SU0 to SU3 (the selection gate lines SGD0 to SGD3) are sequentially selected. The word line WL1 located higher than the word line WL0 is then selected, and while the word line WL1 is being selected, the string units SU0 to SU3 are sequentially selected in a similar manner. After that, selections are made in a similar manner up to the uppermost word line WL7.

Therefore, in the block BLK shown in FIG. 45, the initial page address PG1 is allocated to the word line WL0 of the string unit SU0, and the second page address PG2 is allocated to the word line WL0 of the string unit SUL and finally a final page address PG32 is allocated to the word line WL7 of the string unit SU3. The allocation of the page addresses is similar to that according to the first write method.

5.2 Verify Voltage

The offset table according to the present embodiment is similar to that described with reference to FIG. 9 in the first embodiment, and the relation between the page addresses and the verify voltage is also similar to that in FIG. 10.

Figure 46:
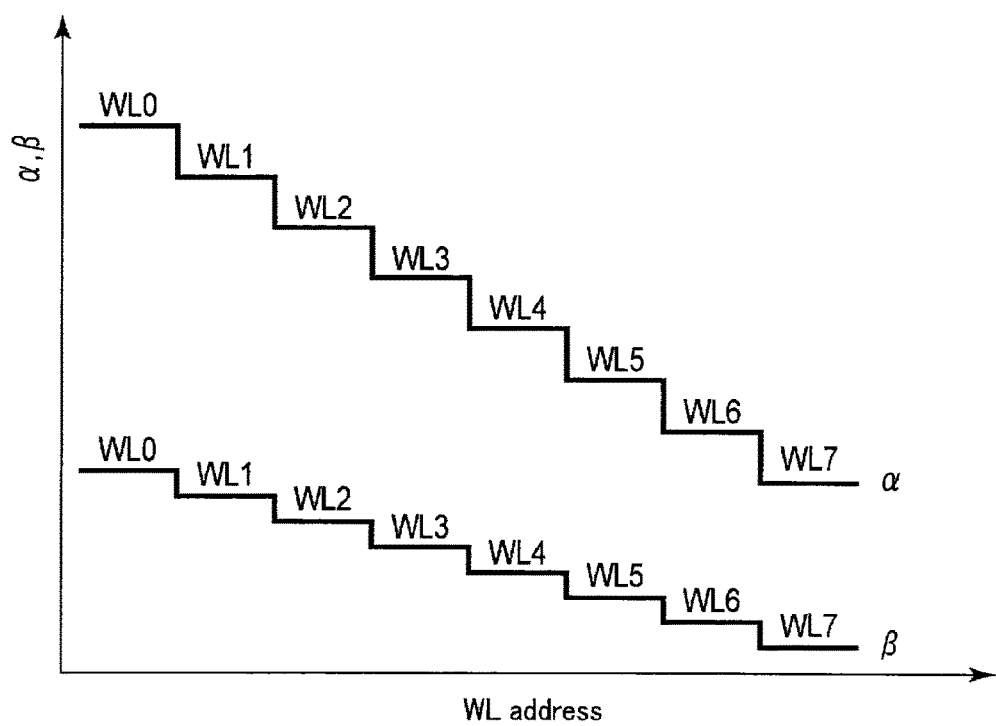
FIG. 46 is a graph showing the relation between word line addresses and sensitivity coefficients according to the fifth embodiment.

However, when the sensitivity coefficients α and β have layer dependence, the relation in FIG. 25 described in the third embodiment is modified as shown in FIG. 46 according to the present embodiment. That is, the sensitivity coefficients α and β also decreases together with the page addresses. This is because a selected word line is located in a higher layer when the page address is greater. In other words, when the page address is greater, the diameter of the memory hole is larger, and the influence of disturbance is smaller.

5.3 Advantageous Effects According to the Present Embodiment

As described above, the first to fourth embodiments can also be applied to the NAND flash memory having the structure shown in FIG. 44.

Although the first write method is applied in the example described according to the above embodiments, the second to fifth write methods may naturally be applied. The offset tables and the verify voltages are as shown in FIG. 14 and FIG. 15, FIG. 17 and FIG. 18, FIG. 20 and FIG. 21, and FIG. 23 and FIG. 24 when the second to fifth write methods are applied.

5.4 Modifications of the Present Embodiment 5.4.1 First Modification

Figure 48:
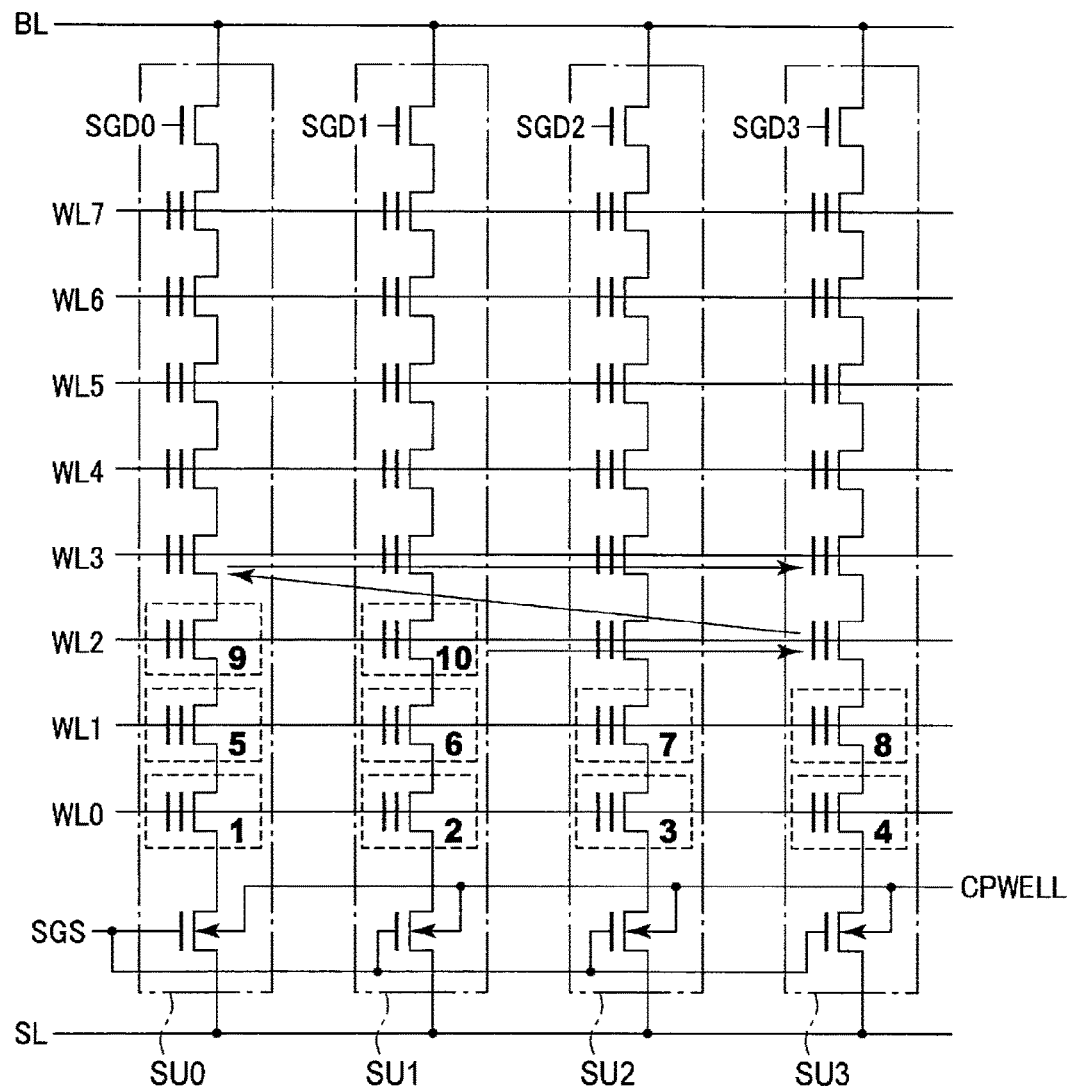

FIG. 47 and FIG. 48 show the configuration of the memory cell array according to the first modification of the present embodiment. FIG. 47 is a sectional view corresponding to FIG. 44. FIG. 48 is a circuit diagram corresponding to FIG. 45.

As shown, the NAND string 114 may be formed on, for example, a p-type well region 50. A pillar semiconductor layer 30a is formed on the well region 50. An n⁺-type impurity diffused layer 51 and a p⁺-type impurity diffused layer 52 are formed on the well region 50. A contact plug 53 is formed on the diffused layer 51, and a metal interconnect layer 55 which functions as the source line SL is formed to be connected to the contact plug 53. A contact plug 54 is formed on the diffused layer 52, and a metal interconnect layer 56 which functions as a well line CPWELL is formed to be connected to the contact plug 54. The well line CPWELL is a signal line to apply a potential to the well region 50. The metal interconnect layers 55 and 56 are formed in, for example, the same layer as a metal interconnect layer 33 which functions as the bit line BL.

In the block BLK, the selection gate lines SGS are connected in common. A gate insulating film 29a of the selection transistor ST2 is not only formed on the side surface of the pillar 30a but also formed on the well region 50, and is connected in common to the string units SU. Further, a gate electrode 27a of the selection transistor ST2 fills the region between the adjacent pillars 30a, and is formed up to the vicinity of the diffused layer 51.

According to the present configuration, the selection transistor ST2 functions as a four-terminal device (a gate, a source, a drain, and a substrate). A voltage can be applied to the well region 50 and the pillar 26 by the well line CPWELL. Therefore, a positive voltage is applied to the well line CPWELL, and 0 V or a negative voltage is applied to the word line WL, so that data can be erased by FN tunneling.

During reading of data, the channel of the selection transistor ST2 is formed not only on the side surface of the pillar 30a but also formed on the surface of the well region 50 along the gate insulating film 29a. As a result, the current path of each of the NAND strings 114 is electrically connected to the source line SL via the diffused layer 51 and the contact plug 53. Therefore, the thickness of the gate insulating film 29a between the well region 50 and the gate electrode 27a is substantially the same as the thickness of the gate insulating film 29a between the pillar 30a and the gate electrode 27a.

The contact plugs 53 and 54 may be formed in a boundary portions of the block BLK, or may be formed in particular regions within the block BLK.

5.4.2 Second Modification

Next, the second modification is described with reference to FIG. 49. FIG. 49 shows the sectional structure of the memory cell array in the case in which the memory hole is made in two separate steps in the example of FIG. 47, in which a tapered shape generated in the memory hole is highlighted.

As has been described in the third embodiment, in the three-dimensionally stacked NAND flash memory, when the number of the word line layers is greater, the degree of integration can be improved, but the depth of the memory hole MH also increases on the other hand. When the depth is greater, the difference of diameter between the bottom and top of the memory hole MH is greater. As a result, in order to make the memory hole which reaches the bottom (p-well 50) from the top layer, the diameter at the top of the memory hole MH is larger, thereby the adjacent memory holes MH more easily cause a short circuit. On the other hand, if the diameter at the top of the memory hole MH is smaller, the memory hole does not have a complete opening, which leads to an open circuit of the memory hole (that is, the memory hole does not reach the bottom).

Accordingly, the memory hole MH may be made in separate steps. FIG. 49 shows the case in which the memory hole MH is made in two separate steps. In FIG. 49, a first memory hole MH is first made at the stage in which the selection gate line SGS and the word lines WL0 to WL3 are formed. A gate insulating film and a charge storage layer, for example, are then formed in the first memory hole MH, and the first memory hole MH is further filled with a polycrystalline silicon layer.

After the word lines WL4 to WL7 and the selection gate line SGD are sequentially formed, a second memory hole MH is made. The second memory hole MH is made so that its bottom reaches the upper surface of the first memory hole MH. Because the memory hole MH has a tapered shape, the diameter of the bottom surface of the second memory hole MH is smaller than the diameter of the upper surface of the first memory hole MH. Therefore, as shown in FIG. 49, the gate insulating film, the charge storage layer, and the block insulating film are discontinuous between the word lines WL0 to WL3 and WL4 to WL7.

The relation between the sensitivity coefficients $\alpha$ and $\beta$ and the word line addresses (or the page addresses) in the configuration described above is shown in FIG. 50. As shown, for the word lines WL0 to WL3, the memory hole diameter sequentially increases, so that the sensitivity coefficients $\alpha$ and $\beta$ decrease as well. However, the memory hole diameter is discontinuous between the word lines WL3 and WL4, and the memory hole diameter of the word line WL4 is larger than the memory hole diameter of the word line WL3. Therefore, the sensitivity coefficients $\alpha$ and $\beta$ are also increased. In this way, the sensitivity coefficients $\alpha$ and $\beta$ can be set suitably to the memory hole diameter.

This example can also be applied to both the structure shown in FIG. 44 and the structure shown in FIG. 4.

6. Sixth Embodiment

Next, a semiconductor memory device according to the sixth embodiment is described. In the present embodiment, the first to fourth embodiments are applied to the semiconductor memory device having the memory cell array 111 which is different in configuration from that according to the fifth embodiment. The differences between the first to fourth embodiments and the sixth embodiment are only described below.

6.1 Configuration of Memory Cell Array

FIG. 51 is a circuit diagram of the memory cell array 111 according to the present embodiment, and shows the configuration of one of the blocks BLK. As shown, the block BLK includes memory units MU (MU1 and MU2). Although two memory units MU are only shown in FIG. 51, there may be three or more memory units MU, and the number of memory units MU is not limited.

Each of the memory units MU includes, for example, four string groups GR (GR1 to GR4). When the memory units MU1 and MU2 are differentiated from each other, the string groups GR of the memory unit MU1 are respectively referred to as GR1-1 to GR4-1, and the string groups GR of the memory unit MU2 are respectively referred to as GR1-2 to GR4-2.

Each of the string groups GR includes, for example, three NAND strings SR (SR1 to SR3). Naturally, the number of the NAND strings SR is not limited to three, and may be four or more. Each of the NAND strings SR includes the selection transistors ST1 and ST2, and four memory cell transistors MT (MT1 to MT4). The number of the memory cell transistors MT is not limited to four, and may be five or more or may be three or less.

In the string group GR, the three NAND strings SR1 to SR3 are sequentially stacked above the semiconductor substrate. The NAND string SR1 is formed in the lowermost layer, and the NAND string SR3 is formed in the uppermost layer. That is, while the memory cell transistors MT in the NAND string are stacked in the vertical direction above the surface of the semiconductor substrate in FIG. 4 described in the first embodiment, the memory cell transistors MT in the NAND string are arrayed in a direction parallel to the surface of the semiconductor substrate according to the present embodiment, and such NAND strings are stacked in the vertical direction. The selection transistors ST1 and ST2 included in the same string group GR are respectively connected to the same selection gate lines GSL1 and GSL2, and the control gates of the memory cell transistors MT located in the same column are connected to the same word line WL. Further, the drains of three selection transistors ST1 in a certain string group GR are connected to different bit lines BL, and the sources of the selection transistors ST2 are connected to the same source line SL.

The selection transistors ST1 and ST2 in the odd string groups GR1 and GR3 and the even string groups GR2 and GR4 are arrayed so that their positions are reversed. That is, in the example of FIG. 51, the selection transistors ST1 of the string groups GR1 and GR3 are located at the left end of the NAND string SR, and the selection transistor ST2 is located at the right of the NAND string SR. In contrast, the selection transistors ST1 of the string groups GR2 and GR4 are located at the right end of the NAND string SR, and the selection transistor ST2 is located at the left of the NAND string SR.

The gates of the selection transistors ST1 of the string groups GR1 and GR3 are connected to the same selection gate line GSL1, and the gates of the selection transistors ST2 are connected to the same selection gate line GSL2. On the other hand, the gates of the selection transistors ST1 of the string groups GR2 and GR4 are connected to the same selection gate line GSL2, and the gates of the selection transistors ST2 are connected to the same selection gate line GSL1.

The four string groups GR1 to GR4 included in a certain memory unit MU are connected to the same bit line BL, and different memory units MU are connected to different bit lines BL. More specifically, in the memory unit MU1, the drains of the selection transistors ST1 of the NAND strings SR1 to SR3 in the string groups GR1 to GR4 are connected to the bit lines BL1 to and BL3 via column select gates CSG (CSG1 to CSG4), respectively. The column select gates CSG are similar in configuration to, for example, the memory cell transistor MT and the selection transistors ST1 and ST2, and select one string group GR to be selected as the bit line BL in each memory unit MU. Therefore, the gates of the column select gates CSG1 to CSG4 associated with the respective string groups GR are controlled by different control signal lines SSL1 to SSL4.

The memory units MU having the configuration described above are vertically arrayed in the drawing sheet of FIG. 51. These memory units MU2, MU3, . . . share the word lines WL, and the selection gate lines GSL1 and GSL2 with the memory unit MU1. On the other hand, the bit lines BL are independent. For example, three bit lines BL4 to BL6 different from those for the memory unit MU1 are associated with the memory unit MU2. The number of the bit lines BL associated with each memory unit MU corresponds to the total number of the NAND strings SR included in one string group GR. Therefore, if there are four layers of NAND strings, four bit lines BL are provided, which also holds true with the numbers of others. The control signal lines SSL1 to SSL4 may be shared by the memory units MU or may be independently controlled.

In the configuration described above, a set of memory cell transistors MT connected to the same word line WL in the string group GR selected one by one from each of the memory units MU is a "page".

Figure 52:
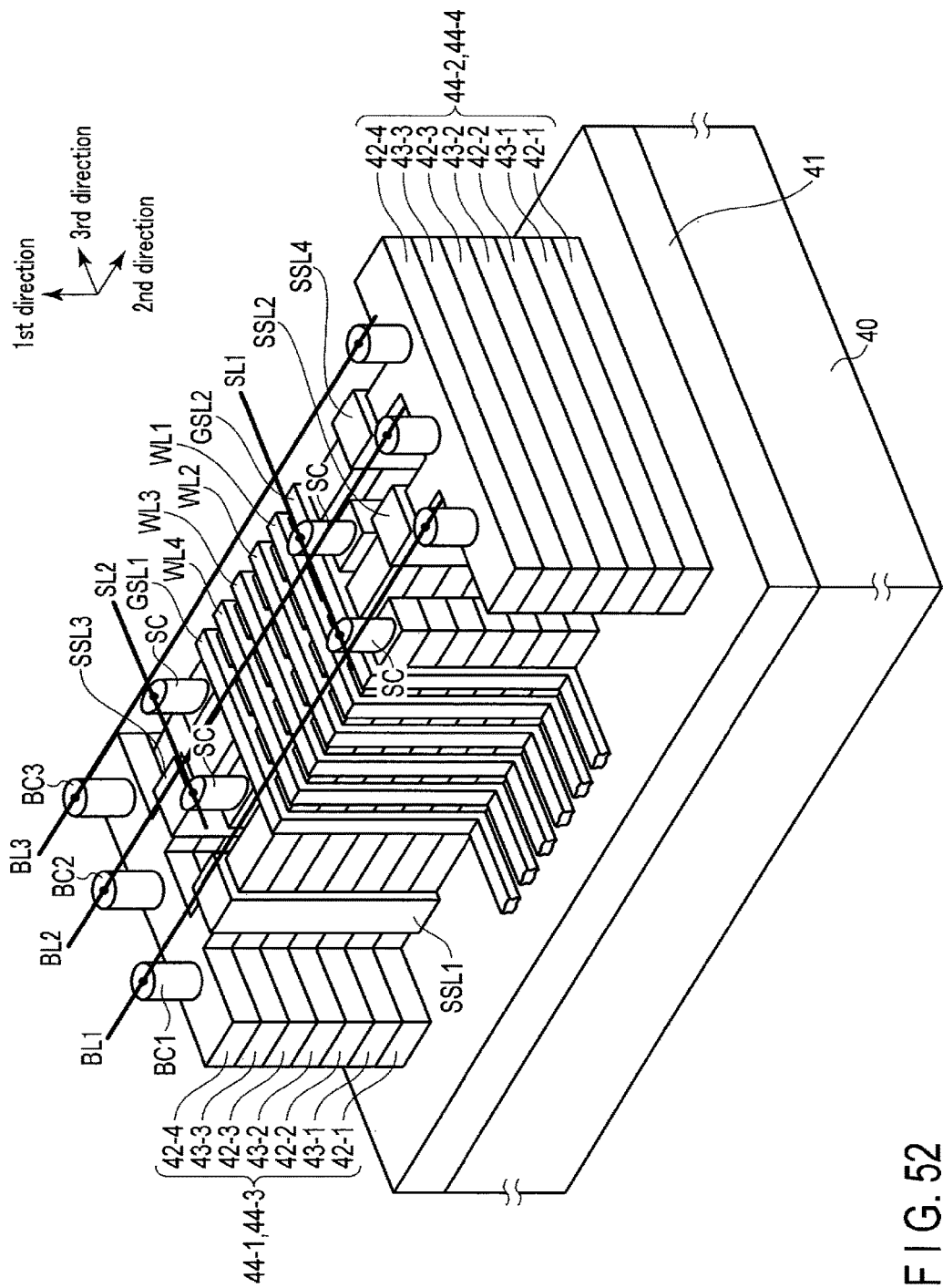
Figure 53:
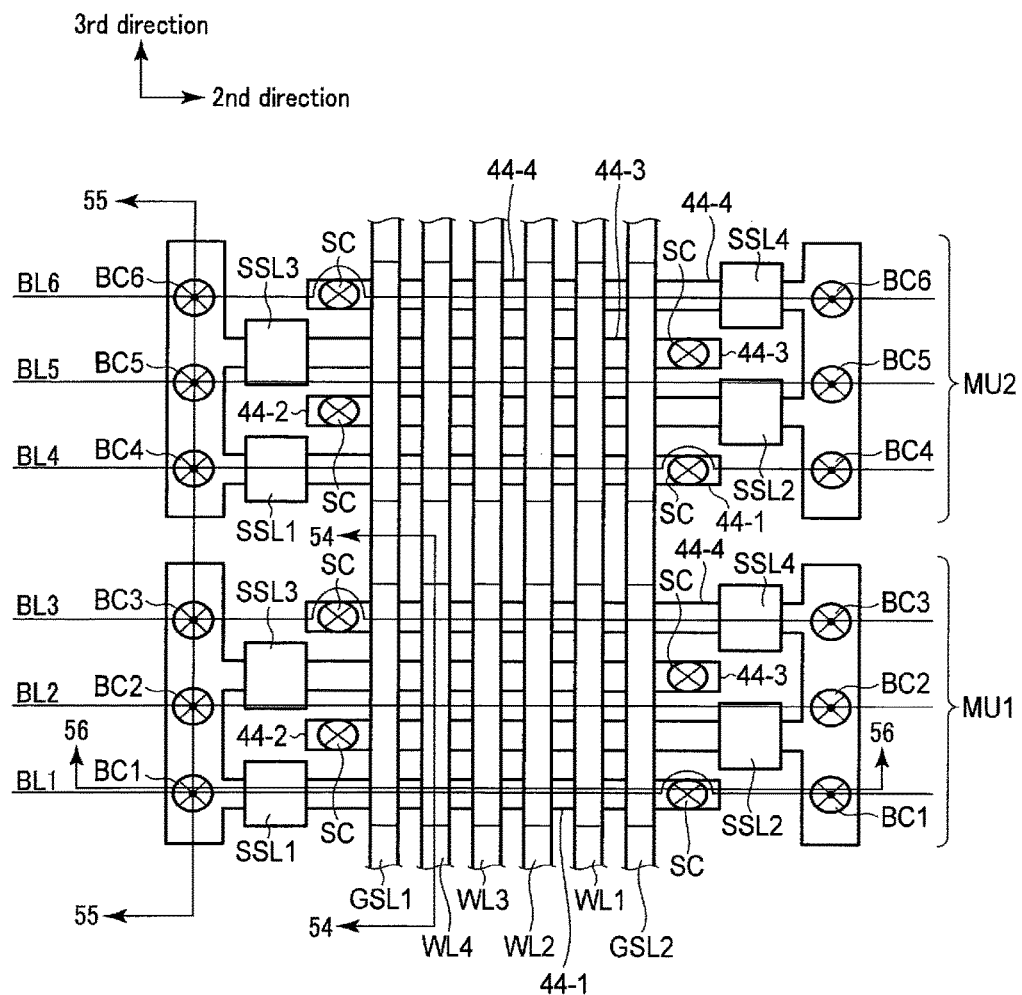
Figure 54:
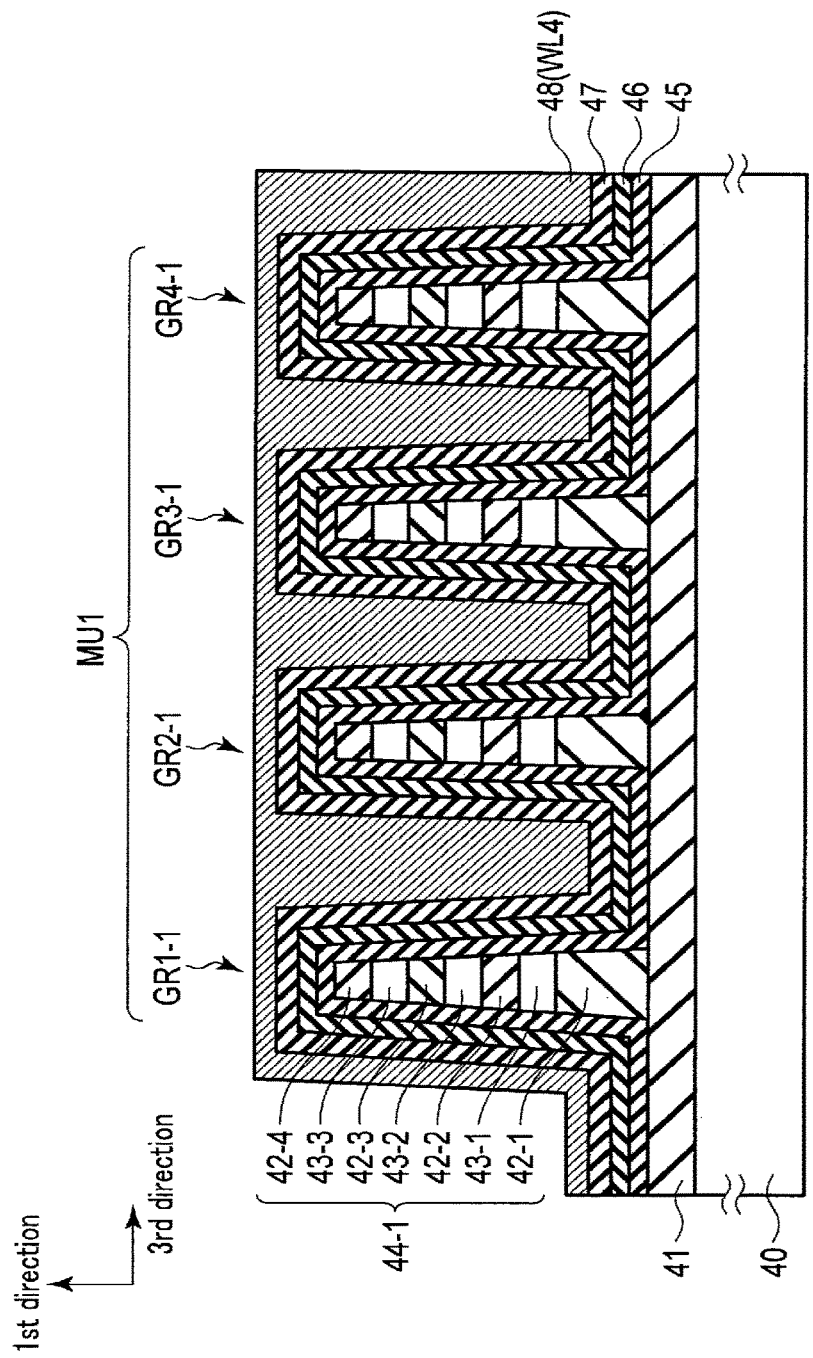

FIG. 52 and FIG. 53 are a perspective view and a plan view of the block BLK. FIG. 54 is a sectional view taken along the line 54-54 in FIG. 53. FIG. 55 is a sectional view taken along the line 55-55 in FIG. 53. FIG. 56 is a sectional view taken along the line 56-56 in FIG. 53. One memory unit MU is shown in FIG. 52, FIG. 54, and FIG. 56, and two memory units MU1 and MU2 are shown in FIG. 53 and FIG. 55.

As shown, an insulating film 41 is formed on a semiconductor substrate 40, and the block BLK is formed on the insulating film 41.

For example, four fin-shaped structures 44 (44-1 to 44-4) which have a striped shape along a second direction orthogonal to a first direction that is a direction perpendicular to the surface of the semiconductor substrate 40 are formed on the insulating film 41 so that one memory unit MU is formed. Each of the fin-shaped structures 44 includes insulating films 42 (42-1 to 42-4) and semiconductor layers 43 (43-1 to 43-3) that are provided along the second direction. In each of the fin-shaped structures 44, the insulating films 42-1 to 42-4 and the semiconductor layers 43-1 to 43-3 are alternately stacked so that four stacked layer structures extending in the direction perpendicular to the surface of the semiconductor substrate 40 are formed. Each of the fin-shaped structures 44 corresponds to the string group GR described with reference to FIG. 51. The lowermost semiconductor layer 43-1 corresponds to the current path (region in which a channel is formed) of the NAND string SR1, the uppermost semiconductor layer 43-3 corresponds to the current path of the NAND string SR3, and the intervening semiconductor layer 43-2 corresponds to the current path of the NAND string SR2.

A gate insulating layer 45, a charge storage layer 46, a block insulating layer 47, and a control gate 48 are sequentially formed on the upper surface and side surface of the fin-shaped structure 44 (see FIG. 54). The charge storage layer 46 is formed by, for example, an insulating film. The control gate 48 is formed by, for example, an conductive film, and functions as the word line WL or selection gate lines GSL1 and GSL2. The word line WL and the selection gate lines GSL1 and GSL2 are formed across the fin-shaped structures 44 between the memory units MU. On the other hand, the control signal lines SSL1 to SSL4 are independent in each of the fin-shaped structures 44.

The fin-shaped structure 44 has one end drawn to the end of the block BLK, and is connected to the bit line BL in the drawn region. In example of the memory unit MU1, one end of each of the odd fin-shaped structures 44-1 and 44-3 is drawn to a certain region along the second direction and connected in common, and contact plugs BC1 to BC3 are formed in this region. The contact plug BC1 connects the semiconductor layer 43-1 and the bit line BL1 of the string groups GR1 and GR3, and is insulated from the semiconductor layers 43-2 and 43-3. The contact plug BC2 connects the semiconductor layer 43-2 and the bit line BL2 of the string groups GR1 and GR3, and is insulated from the semiconductor layers 43-1 and 43-3. The contact plug BC3 connects the semiconductor layer 43-3 and the bit line BL3 of the string groups GR1 and GR3, and is insulated from the semiconductor layers 43-1 and 43-2.

On the other hand, one end of each of the even fin-shaped structures 44-2 and 44-4 is drawn to a region facing one end of each of the fin-shaped structures 44-1 and 44-3 in the second direction and connected in common, and contact plugs BC1 to BC3 are formed in this region. The contact plug BC1 formed in this region connects the semiconductor layer 43-1 and the bit line BL1 of the string groups GR2 and GR4, and is insulated from the semiconductor layers 43-2 and 43-3. The contact plug BC2 connects the semiconductor layer 43-2 and the bit line BL2 of the string groups GR2 and GR4, and is insulated from the semiconductor layers 43-1 and 43-3. The contact plug BC3 connects the semiconductor layer 43-3 and the bit line BL3 of the string groups GR2 and GR4, and is insulated from the semiconductor layers 43-1 and 43-2.

Naturally, the above structure corresponds to the memory unit MU1. For the memory unit MU2, contact plugs BC4 to BC6 are formed, and connect the semiconductor layers 43-1 and 43-3 to the bit lines BL4 to BL6, respectively (see FIG. 55).

A contact plug SC is formed on the other end of the fin-shaped structure 44. The contact plug SC connects the semiconductor layers 43-1 and 43-3 to the source line SL.

In the configuration described above, the memory cell transistors included in the NAND strings SR1 to SR3 are different in size from each other. More specifically, as shown in FIG. 54, in each of the fin-shaped structures 44, the width of the semiconductor layers 43 along a third direction is greater in lower layers and smaller in higher layers. That is, the width of the semiconductor layer 43-1 is the greatest, the width of the semiconductor layer 43-3 is the smallest, and the width of the semiconductor layer 43-2 is the intermediate width. Stated differently, the memory cell transistors MT which are different in characteristics from one another due to manufacturing variation are included in one page.

6.2 Write Operation

Next, a data write operation according to the present embodiment is described with reference to FIG. 57. FIG. 57 is a flowchart of the write operation according to the present embodiment, and corresponds to FIG. 6 described in the first embodiment. Although the sense circuit described with reference to FIG. 41 is used in the case described below by way of example, this also holds true with the case in which the sense circuit described with reference to FIG. 32 is used.

As shown, the processing in steps S10 to S11 is performed as in the first embodiment. Further, for example, in response to an instruction from the sequencer 121, the charge pump 122 sets and generates the verify voltage Vpvfy and a voltage Vclamp_n (step S30). The voltage Vclamp_n is used as the signal BLC.

Further, the row decoder 112 applies the verify voltage Vpvfy to the selected word line WL, and the sequencer 121 applies the signal BLC (voltage Vclamp_n) to the transistor NMOS10, so that a verify operation is performed (step S31). n of the voltage Vclamp_n is a natural number equal to or more than 1, and corresponds to the layer in which the corresponding NAND string SR is provided. That is, in this example, the voltage Vclamp_1 is applied to a signal BLCLAMP for the bit line BL corresponding to the NAND string SR1 located in the lowermost layer. The voltage Vclamp_3 is applied to a signal BLCLAMP for the bit line BL corresponding to the NAND string SR3 located in the uppermost layer. The voltage Vclamp_2 is applied to a signal BLCLAMP for the bit line BL corresponding to the NAND string SR2 located in the middle layer.

If all the bits in the selected page pass the verification (step S14, YES), the write operation for this page is finished. Otherwise (step S14, NO), the sequencer 121 returns to step S11, and again performs the program. In this instance, for example, the charge pump 122 shifts the verify voltage Vpvfy in accordance with the page addresses and the writing order under the instruction from the sequencer 121. Further, the sequencer 121 shifts the potential Vclamp_n of the signal BLC in accordance with the page addresses and the writing order (step S32). That is, the clamp voltage Vclamp_n is updated to (Vclamp_n+ΔVx2_n).

Figure 59:
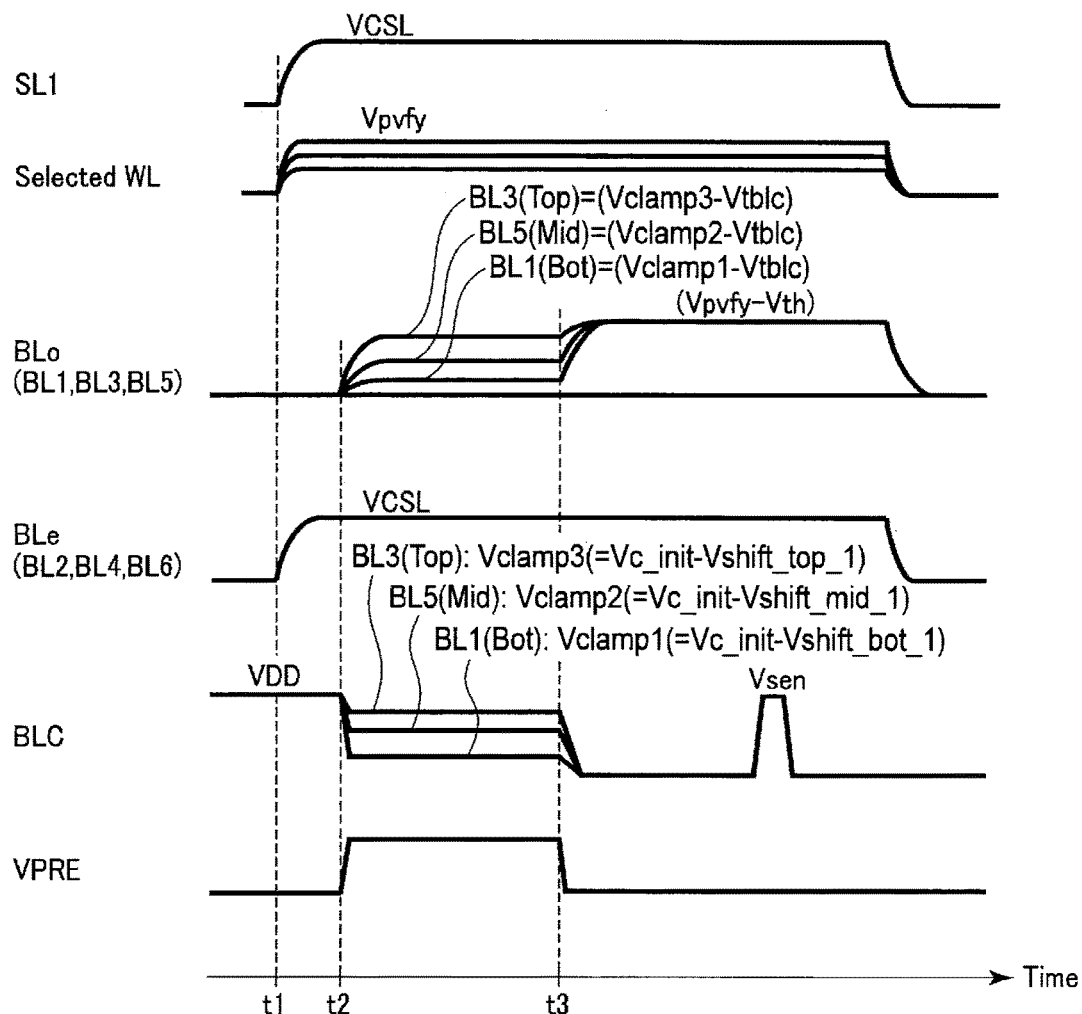
FIG. 59 is a timing chart of various signals in verification according to the sixth embodiment.

FIG. 58 is a circuit diagram of the block BLK including two memory units MU1 and MU2, and shows the voltage of various signal lines in verification. FIG. 59 is a timing chart showing the voltage changes of various signal lines, and shows the case in which the odd bit line BLo is selected. In the case shown in FIG. 58, for simplification of explanation, the block includes the two memory units MU1 and MU2, and the control signal lines SSL1 and SSL5 are selected so that the string group GR1-1 in the memory unit MU1 and the string group GR1-2 in the memory unit MU2 are selected. Therefore, among six memory cell transistors MT connected to the same word line WL in the string groups GR1-1 and GR1-2, three memory cell transistors MT connected to the odd bit line BLo form one page, and three memory cell transistors MT connected to the even bit line BLe form one page. Because of space limitations, the selected string groups GR1-1 and GR1-2 are only shown, and the column select gate CSG is not shown. The following explanation also holds true with the case in which other combinations of the string groups GR are selected.

As shown, a positive voltage VCSL is applied to the source line SL1 and the unselected bit lines BLe. The row decoder 112 applies the "H"-level to each of the selection gate lines GSL1 and GSL2 to turn on the selection transistors ST1 and ST2. Further, the row decoder 112 applies the verify voltage Vpvfy to the word line WL4, and applies the voltage VREAD to the unselected word lines WL1 to WL3.

The sequencer 121 then sets the voltage of the signal BLC. In this instance, the sequencer 121 sets the voltage of the signal BLC corresponding to the bit line BL1 connected to the NAND string SR1 located in the lowermost layer to Vclamp1 (=Vc_init−Vshift_bot_1). The sequencer 121 sets the voltage of the signal BLC corresponding to the bit line BL5 connected to the NAND string SR2 located in the middle layer to Vclamp2 (=Vc_init−Vshift_mid_1). Moreover, the sequencer 121 sets the voltage of the signal BLC corresponding to the bit line BL3 connected to the NAND string SR3 located in the uppermost layer to Vclamp3 (=Vc_init−Vshift_top_1). There is a relation Vshift_top_1<Vshift_mid_1<Vshift_bot_1. As a result, the odd bit lines BL1, BL5, and BL3 are precharged to (Vclamp1−Vtblc), (Vclamp2−Vtblc), and (Vclamp3−Vtblc), respectively. It is to be noted that Vtblc is the threshold of the transistor NMOS10. Vc_init is a certain reference value of the clamp voltage.

The voltage of the signal BLC is then set to 0 V. Thus, if the memory cell transistor MT in the selected page is on, an current flows to the bit line BL from the source line SL, and the potential of the bit line BL will be (Vpvfy−Vth). Vth is the threshold of the memory cell transistor MT.

6.3 Regarding Page Selection Order and Verify Voltage

Next, the page selection order and the verify voltage according to the present embodiment are described.

6.3.1 First Example

FIG. 60 is a plan view of the memory unit MU1 according to the present embodiment, and shows a first example of the page selection order. Boldfaced type numbers in the drawing indicate the page selection order.

As shown, in this example, the word line WL1 is first selected. The string groups GR1-1 to GR4-1 are then sequentially selected. Further, the word line WL2 is selected. The string groups GR1-1 to GR4-1 are then sequentially selected. After that, selections are made in a similar manner up to the word line WL4.

The offset table in this case is equivalent to an offset table in which the string units SU0 to SU3 are respectively replaced with the string groups GR1 to GR4 in FIG. 9 described in the first embodiment and in which voltage shift amounts Vshift_top, Vshift_mid, and Vshiftbot regarding each bit line BL are recorded for each word line WL.

6.3.2 Second Example

FIG. 61 is a plan view of the memory unit MU1 according to the present embodiment, and shows a second example of the page selection order.

As shown, in this example, the word line WL4 is first selected. The string groups GR1-1 to GR4-1 are then sequentially selected. Further, the word line WL3 is selected. The string groups GR1-1 to GR4-1 are then sequentially selected. After that, selections are made in a similar manner up to the word line WL1.

The offset table in this case is equivalent to an offset table in which the string units SU0 to SU3 are respectively replaced with the string groups GR1 to GR4 in FIG. 9 and in which the selection order of the word lines WL is reversed and in which the voltage shift amounts Vshift_top, Vshift_mid, and Vshift_bot regarding each bit line BL are recorded for each word line WL.

6.3.3 Third Example

Figure 62:
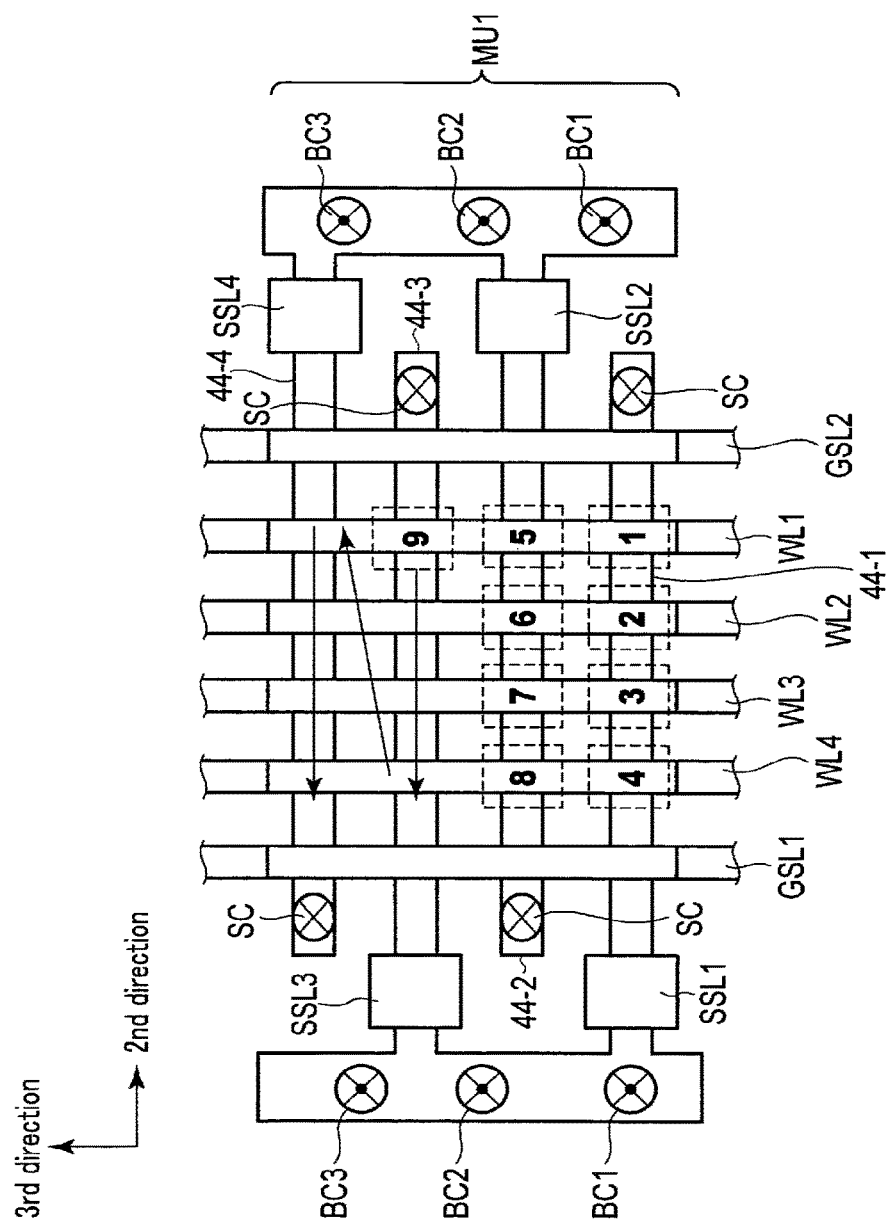

FIG. 62 is a plan view of the memory unit MU1 according to the present embodiment, and shows a third example of the page selection order.

As shown, in this example, one of the string groups GR is selected, and the word lines WL0 to WL4 are sequentially selected in the selected string group. That is, the string group GR1-1 is first selected. Further, the word lines WL1 to WL4 are sequentially selected while the group GR1-1 is selected. The string group GR2-1 is then selected, and the word lines WL0 to WL4 are sequentially selected. After that, selections are made in a similar manner up to the string group GR4-1.

The offset table in this case is equivalent to an offset table in which the string units SU0 to SU3 are respectively replaced with the string groups GR1 to GR4 in FIG. 14 and in which the voltage shift amounts Vshift_top, Vshift_mid, and Vshift_bot regarding each bit line BL are recorded for each word line WL.

6.3.4 Fourth Example

Figure 63:
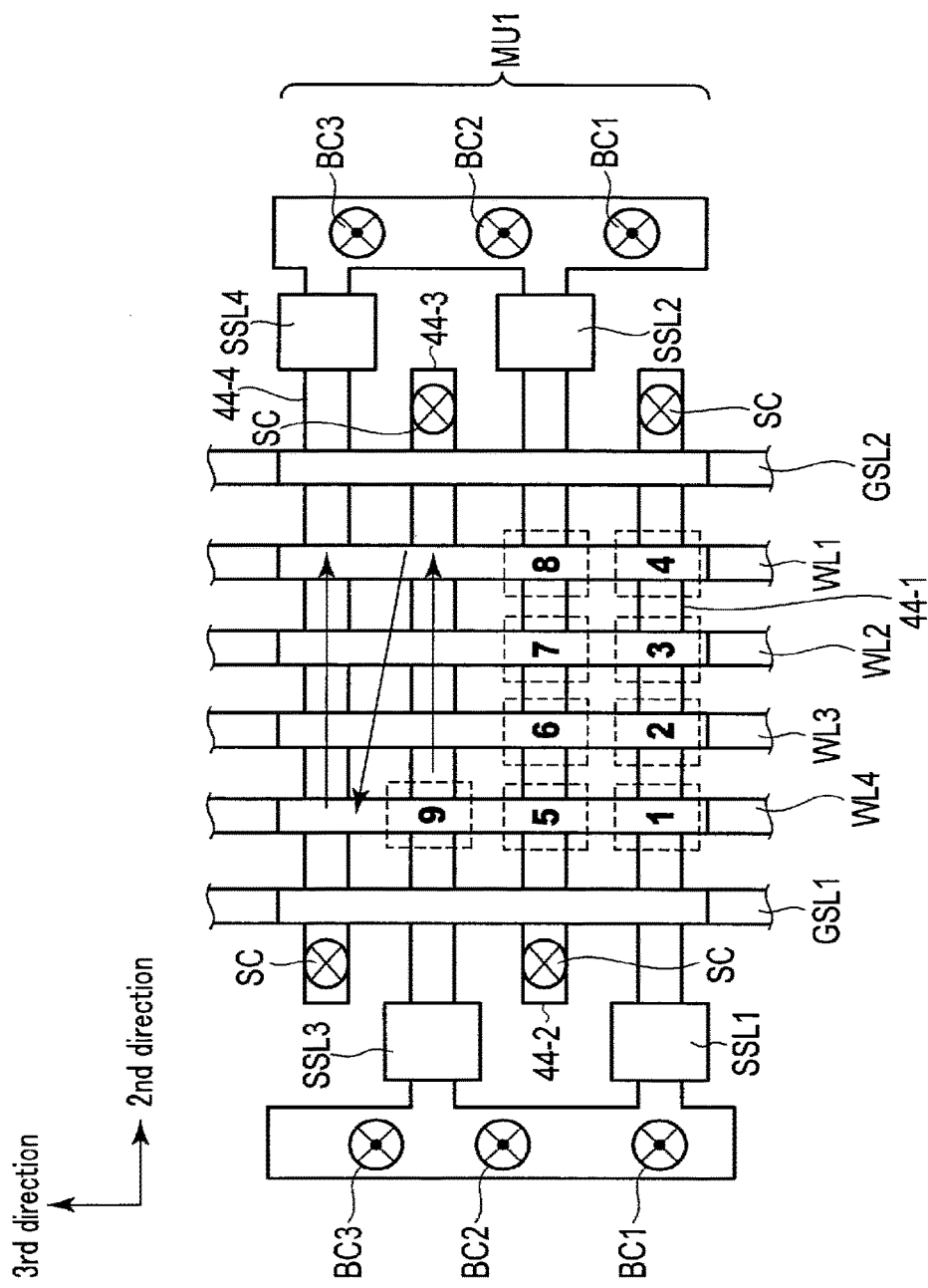

FIG. 63 is a plan view of the memory unit MU1 according to the present embodiment, and shows a fourth example of the page selection order.

In this example, the selection order of the word lines WL in the above third example is reversed. That is, the string group GR1-1 is first selected, and the word lines WL4 to WL7 are sequentially selected while the string group GR1-1 is being selected. The string group GR2-1 is then selected, and the word lines WL4 to WL1 are sequentially selected. After this, selections are made in a similar manner up to the string group GR4-1.

The offset table in this case is equivalent to an offset table in which the string units SU0 to SU3 are respectively read as the string groups GR1 to GR4 in FIG. 14 and in which the selection order of the word lines WL is reversed and in which the voltage shift amounts Vshift_top, Vshift_mid, and Vshift_bot regarding each bit line BL are recorded for each word line WL.

6.4 Advantageous Effects According to the Present Embodiment

According to the present embodiment as well, the verify level is changed in accordance with the page addresses in consideration of the influence of the program disturbance. It is thus possible to obtain advantageous effects similar to those in the first embodiment.

In the configuration according to the present embodiment, the memory cell transistors formed in different layers are included in one page. The degree of disturbance to which the memory cell transistors formed in different layers are subjected varies from layer to layer. More specifically, the memory cell transistors located in lower layers are more subjected to the disturbance. However, these memory cell transistors are connected to the same word line WL, so that it is difficult to compensate for the difference of disturbance between layers by the word line voltage.

Thus, according to the present embodiment, the potential of the bit line BL is controlled for each layer to compensate for the variation of the thresholds. That is, as shown in FIG. 59, lower precharge potentials are set for the bit lines of the NAND strings SR located in lower layers, and higher precharge potentials are set for the bit lines of the NAND strings SR located in higher layers. The memory cell transistors located in lower layers more vary in threshold due to disturbance, and their threshold voltages tend to move to the positive side. In contrast, the memory cell transistors located in higher layers less vary in threshold. Therefore, the difference of the threshold variation amount is compensated for by the precharge potential. As a result, it is possible to reduce the variation of bit line voltages (Vpvfy−Vth) between bit lines after reading of data.

As described above, the sense voltage Vsen is used to judge data. That is, data is judged by the comparison between the voltage VBL and (Vsen−Vtblc). Therefore, not only the precharge potential but also the voltage Vsen may have layer dependence. Alternatively, the precharge potentials (the above Vclamp1 to Vclamp3) may have no layer dependence, and the voltage Vsen may have layer dependence.

Furthermore, according to the present embodiment, the values of the voltages Vclamp1 to Vclamp3 are also shifted in accordance with the writing order in a manner similar to that of the voltage Vpvfy. More specifically, the precharge potential (i.e. the clamp voltage Vclamp) is lower for the memory cell transistors which are more subjected to disturbance by the voltages VPGM and VPASS. Consequently, it is possible to further improve the operational reliability. In this instance, the values of the clamp voltages Vclamp1 to Vclamp3 (Vshift_bot, Vshift_mid, and Vshift_top) may be recorded in the offset table together with the offset amount of the voltage Vpvfy.

According to the present embodiment, zone-by-zone management is also possible as in the third embodiment. That is, when the number of layers of the NAND string SR is greater, a plurality of bit lines BL may be managed in units of zones, and the voltage shift amount may be controlled zone by zone.

7. Seventh Embodiment

Next, a semiconductor memory device according to the seventh embodiment is described. In the present embodiment, the NAND strings SR1 to SR3 are selected by the source line SL, in contrast to the sixth embodiment described above.

7.1 Configuration of Memory Cell Array

Figure 64:
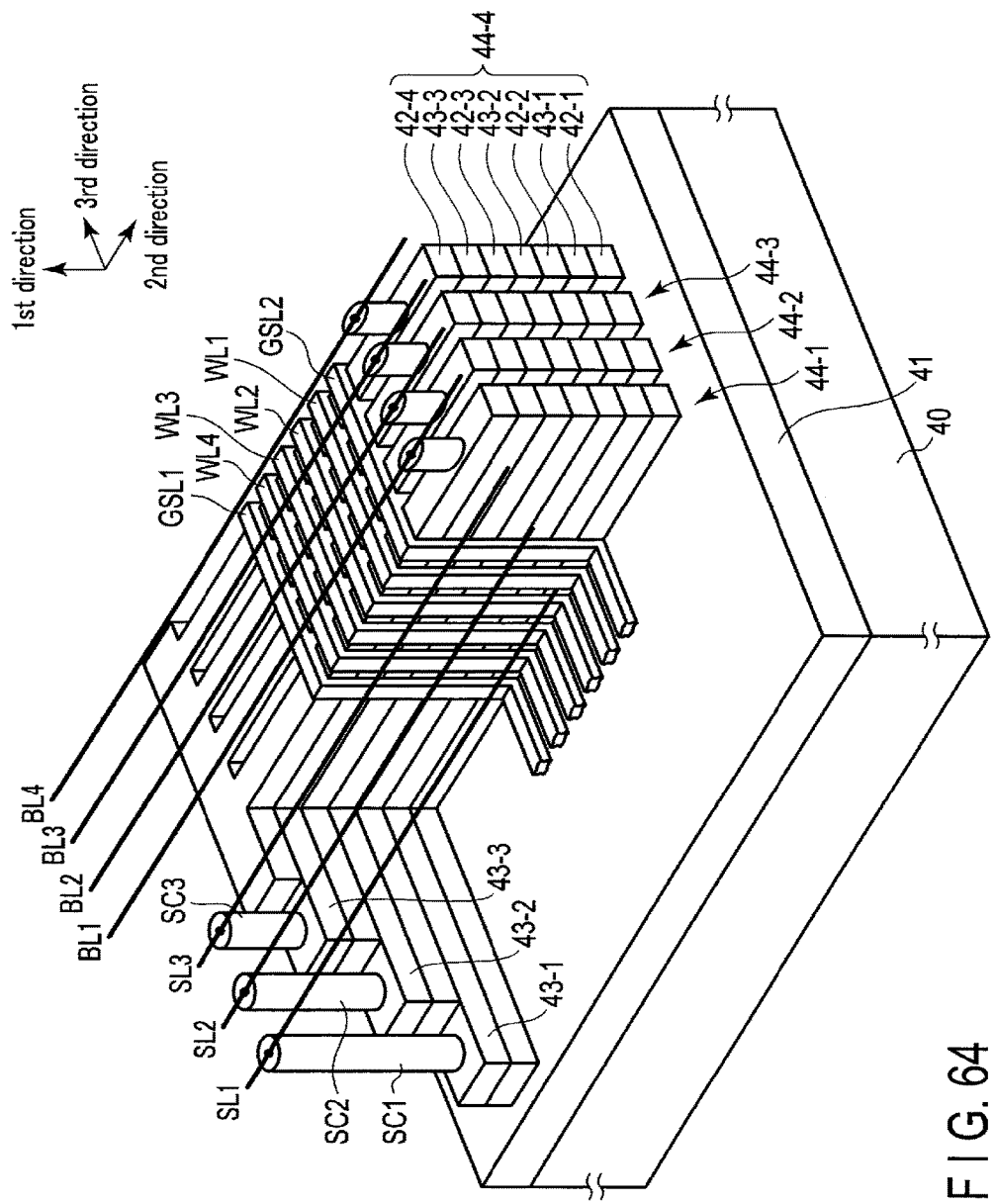

FIG. 64 is a perspective view of the block BLK according to the present embodiment, and shows one of the memory units MU. FIG. 65 is a plan view of the memory unit MU. FIG. 66 is a sectional view taken along the line 66-66 in FIG. 65. FIG. 67 is a sectional view taken along the line 67-67 in FIG. 65.

As shown, the configuration according to the present embodiment is formed so that, in the configuration described in the sixth embodiment, one end of each of the fin-shaped structures 44 is drawn to the end of the block BLK and connected to the bit line BL in the drawn region, and the other end thereof is connected in common and thus connected to the source line SL. The bit line BL is connected in common to the semiconductor layers 43-1 to 43-3 in the corresponding fin-shaped structure 44 (see FIG. 67). In contrast, the source line SL is independently provided for each of the semiconductor layers 43-1 to 43-3 in the fin-shaped structure 44 that are connected in common (see FIG. 66). In this example, the control signal lines SSL in the sixth embodiment are eliminated.

7.2 Program Verify Operation

The program verify operation according to the present embodiment is basically the same as that according to the sixth embodiment. However, in this example, the bit line BL is connected in common in the NAND strings SR included in one string group GR. Therefore, one of the NAND strings SR is selected from each of the string groups GR by controlling the potential of the source line SL.

For example, when the NAND string SR1 in the lowermost layer is selected, the corresponding source line SL1 is selected, and, for example, 1 V is applied to the source line SL1. A voltage (e.g. 1.5 V) higher than that of the source line SL1 is applied to the other unselected source lines SL2 and SL3.

As has been described in the sixth embodiment, the verify voltage Vpvfy is controlled in accordance with the page addresses and their selection order.

7.3 Advantageous Effects According to the Present Embodiment

As described above, it is possible to obtain advantageous effects similar to those in the first embodiment even with the memory cell array having the configuration according to the present embodiment. Naturally, the second to fourth embodiments can also be applied.

8. Modifications

As described above, the semiconductor memory device 100 according to the present embodiment includes a plurality of memory cells. The device includes: a first page associated with a first memory cell; a second page associated with a second memory cell; a third page associated with a third memory cell; and a row decoder 112 configured to apply voltages to gates of the first to third memory cells. In writing data, data is written into the first page before data is written into the second page. The data write operation includes a program operation and a program verify operation. The row decoder 112 is configured to apply a first verify voltage to the gate of the first memory cell in the program verify operation for the first page. The row decoder 112 is configured to apply a second verify voltage different from the first verify voltage to the gate of the second memory cell in the program verify operation for the second page. The row decoder 112 is configured to apply a third verify voltage different from the first and second verify voltages to the gate of the third memory cell in the program verify operation for the third page. The second verify voltage is a value which is shifted from the first verify voltage by at least a first coefficient ($\alpha$). The third verify voltage is a value which is shifted from the first verify voltage by at least a second coefficient ($\beta$) different from the first coefficient.

Alternatively, the semiconductor memory device includes a sense amplifier 113 configured to read data from the first page and the second page to perform a program verify operation in writing of data. The sense amplifier is configured to determine data based on a first sense period in the program verify operation for the first page. The sense amplifier 113 is configured to determine data based on a second sense period different from the first sense period in the program verify operation for the second page. The sense amplifier 113 is configured to determine data based on a third sense period different from the first and second sense periods in the program verify operation for the third page. The second sense period has a time length which is shifted from the first sense period by at least a first coefficient ($\alpha$). The third sense period has a time length which is shifted from the first sense period by at least a second coefficient ($\beta$) different from the first coefficient.

According to the present configuration, it is possible to perform the program verify operation corresponding to disturbance that varies page by page in accordance with the writing order, and improve the operational reliability of the NAND type flash memory.

However, the embodiments are not limited to the forms described above, and various modifications can be made. The page selection order is not limited to the first to fifth write methods, and various other write methods can be applied. In this case as well, an offset table suitable to the degree of disturbance resulting from the selection order may be created.

In the example described according to the above embodiments, the controller 200 holds the offset table. In this case, when issuing a data write instruction to transfer data to the NAND flash memory 100, the controller 200 may transfer, to the NAND flash memory 100, information regarding a shift amount of the verify voltage Vpvfy and a shift amount of the clamp voltage Vclamp together.

Alternatively, the NAND flash memory 100 may hold the offset table. That is, the offset table is stored in, for example, a ROM fuse region (one of the blocks BLK) of the NAND flash memory 100. The ROM fuse region is for holding, for example, bad block information indicating unusable blocks, column redundancy information to replace bad columns, and trimming information. When the NAND flash memory is powered-on, for example, the sequencer 121 voluntarily reads the offset table into, for example, the register 123 from the ROM fuse region without receiving a read instruction from the controller 200. Whenever a write instruction is received from the controller 200, the sequencer 121 generates a suitable verify voltage Vpvfy and a suitable clamp voltage Vclamp by reference to the offset table in the register 123. Alternatively, the NAND flash memory 100 may transfer, to the controller 200, the offset table that has been read in the register 123.

It is preferable that the sensitivity coefficients $\alpha$ and $\beta$ may not be simply determined by the page selection order or the layers. For example, it is preferable that how much the threshold voltage of the memory cell transistor MT shifts in a pre-shipment test is measured by, for example, a tester, and an offset table is created on the basis of the measurement result. $\Delta V1$ and $\Delta V2$ in the offset table are set to, for example, a minimum voltage step width of a circuit which generates the verify voltage, and its value is 0.001 V by way of example. This also holds true with the fourth embodiment, and $\Delta T1$ and $\Delta T2$ are set to, for example, a minimum step width of a sense period that can be controlled in the sense amplifier.

Furthermore, in the examples described according to the above embodiments, the allocation order of the page addresses corresponds to the page selection order. However, these orders do not always need to correspond to each other. That is, how the page addresses are allocated is not particularly important, and the verify voltage and the clamp voltage are determined in accordance with the selection order of the pages, i.e., the shift amount of a threshold voltage predicted by disturbance.

Furthermore, although offsets corresponding to the page selection order are applied to both the verify voltage and the signal BLC (i.e. bit line precharge voltage) in the example described above according to the sixth embodiment, the offset may be applied to one of the voltages.

In the third embodiment described above, the NAND string described in the first and second embodiments is not limited to a simple shape in which the memory hole MH is smaller in diameter in deeper parts. This also holds true with the fourth and fifth embodiments. The same also holds true with the sixth and seventh embodiments, and the semiconductor layer 43 (the current path of the memory cell) is not exclusively greater in width in lower layers as has been described with reference to FIG. 54.

Furthermore, the configuration of the memory cell array 111 is not limited to the configuration described in the above embodiments. That is, the embodiments described above are widely applicable to any memory device which has the problem of the threshold variation of the memory cell transistor MT caused by disturbance. Therefore, the embodiments described above are not only applicable to the NAND flash memory but also applicable to all other memory devices in general. Each of the embodiments may be independently implemented, but a combination of the embodiments that can be combined may be implemented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
 a memory device including a first string unit and a second string unit provided above a semiconductor substrate,
 a controller which controls the memory device,
 wherein the first string unit includes: a first transistor coupled to a bit line; a second transistor coupled to a source line; and a plurality of memory cells connected in series between the first transistor and the second transistor, and
 a second string unit includes: a third transistor coupled to the bit line; a fourth transistor coupled to the source line; and a plurality of memory cells connected in series between the third transistor and the fourth transistor,
 wherein a gate of the first transistor is coupled to a first selection line, a gate of the third transistor is coupled to a second selection line, and the first selection line and the second selection line is controlled independently,
 wherein the plurality of memory cells in the first string unit includes a first memory cell and a second memory cell, and the plurality of memory cells in the second string unit includes a third memory cell and a fourth memory cell,
 the first memory cell and the third memory cell are coupled to a first word line, and the second memory cell and the fourth memory cell are coupled to a second word line, and the first transistor is closer to the first memory cell than to the second memory cell, and
 wherein the controller writes data to the second memory cell after writing data to the first memory cell.

2. The system according to claim 1, wherein the first memory cell is connected between the first transistor and the second memory cell.

3. The system according to claim 1, wherein the first memory cell is closest to the first transistor among the plurality of the memory cells in the series connection.

4. The system according to claim 1, wherein a dummy cell is connected between the first transistor and the first memory cell.

5. The system according to claim 1, wherein the second memory cell is closer to the second transistor than to the first transistor in a current path of the series connection in the first string unit.

6. The system according to claim 1, wherein writing data to the second memory cell is executed subsequently to writing data to the first memory cell.

7. The system according to claim 1, wherein the first string unit includes:
 a first pillar including one end coupled to the bit line and other end, and functioning as a current path of the series connection;
 a second pillar including one end coupled to the source line and other end, and functioning as the current path of the series connection;
 a first conductive layer connected between the other end of the first pillar and the other end of the second pillar;
 a second conductive layer formed around the first pillar and functioning as the first selection line;
 a third conductive layer formed around the second pillar and functioning as a third selection line, the third selection line being coupled to a gate of the second transistor;
 a fourth conductive layer formed around the first pillar and functioning as the first word line; and
 a fifth conductive layer formed around the second pillar and functioning as the second word line,
 wherein the fourth conductive layer is formed above the fifth conductive layer, and
 the second and third conductive layers are formed above the fourth conductive layer.

8. The system according to claim 7, wherein a first verify voltage is applied to the first word line in a program verify operation for the first memory cell,
 a second verify voltage is applied to the second word line in a program verify operation for the second memory cell, and
 the second verify voltage is different from the first verify voltage.

9. The system according to claim 8, wherein the second verify voltage is higher than the first verify voltage.

10. A method for writing data into a memory device controlled by a controller, the method comprising:
 writing data, by the controller, to a first memory cell; and
 writing data, by the controller, to a second memory cell after writing the data to the first memory cell,
 wherein the memory device includes a first string unit and a second string unit provided above a semiconductor substrate,
 the first string unit includes: a first transistor coupled to a bit line; a second transistor coupled to a source line; and a plurality of memory cells connected in series between the first transistor and the second transistor, the second string unit includes: a third transistor coupled to the bit line; a fourth transistor coupled to the source line; and a plurality of memory cells connected in series between the third transistor and the fourth transistor, a gate of the first transistor is coupled to a first selection line, a gate of the third transistor is coupled to a second selection line, and the first selection line and the second selection line are controlled independently, the first memory cell and the second memory cell are included in the plurality of the memory cells in the first string unit, the plurality of memory cells in the second string unit includes a third memory cell and a fourth memory cell, the first memory cell and the third memory cell are coupled to a first word line, and the second memory cell and the fourth memory cell are coupled to a second word line, and the first transistor is closer to the first memory cell than to the second memory cell.

11. The method according to claim 10, wherein the first memory cell is connected between the first transistor and the second memory cell.

12. The method according to claim 10, wherein the first memory cell is closest to the first transistor among the plurality of the memory cells in the series connection.

13. The method according to claim 10, wherein a dummy cell is connected between the first transistor and the first memory cell.

14. The method according to claim 10, wherein the second memory cell is closer to the second transistor than to the first transistor in a current path of the series connection in the first string unit.

15. The method according to claim 10, wherein writing data to the second memory cell is executed subsequently to writing data to the first memory cell.

16. The method according to claim 10, wherein the first string unit includes:

a first pillar including one end coupled to the bit line and other end, and functioning as a current path of the series connection;

a second pillar including one end coupled to the source line and other end, and functioning as the current path of the series connection;

a first conductive layer connects between the other end of the first pillar and the other end of the second pillar;

a second conductive layer formed around the first pillar and functioning as the first selection line;

a third conductive layer formed around the second pillar and functioning as a third selection line, the third selection line being coupled to a gate of the second transistor;

a fourth conductive layer formed around the first pillar and functioning as the first word line; and a fifth conductive layer formed around the second pillar and functioning as the second word line, wherein the fourth conductive layer is formed above the fifth conductive layer, and the second and third conductive layers are formed above the fourth conductive layer.

17. The method according to claim 16, wherein the writing data to the first memory cell includes:

programming data to the first memory cell; and verifying the data written to the first memory cell using a first verify voltage, and wherein the writing to the second memory cell includes:

programming data to the second memory cell; and verifying the data written to the second memory cell using a second verify voltage different from the first verify voltage.

18. The method according to claim 17, wherein the second verify voltage is higher than the first verify voltage.

* * * * *